US011131927B2

(12) United States Patent
Kawaue et al.

(10) Patent No.: US 11,131,927 B2
(45) Date of Patent: Sep. 28, 2021

(54) CHEMICALLY AMPLIFIED POSITIVE-TYPE PHOTOSENSITIVE RESIN COMPOSITION, PHOTOSENSITIVE DRY FILM, METHOD OF MANUFACTURING PHOTOSENSITIVE DRY FILM, METHOD OF MANUFACTURING PATTERNED RESIST FILM, METHOD OF MANUFACTURING SUBSTRATE WITH TEMPLATE AND METHOD OF MANUFACTURING PLATED ARTICLE

(71) Applicant: TOKYO OHKA KOGYO CO., LTD., Kawasaki (JP)

(72) Inventors: Akiya Kawaue, Kawasaki (JP); Shota Katayama, Kawasaki (JP); Kazuaki Ebisawa, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 86 days.

(21) Appl. No.: 16/394,721

(22) Filed: Apr. 25, 2019

(65) Prior Publication Data
US 2019/0346765 A1 Nov. 14, 2019

(30) Foreign Application Priority Data

May 9, 2018 (JP) .............................. JP2018-090866

(51) Int. Cl.
*G03F 7/039* (2006.01)
*C08L 33/10* (2006.01)
*G03F 7/20* (2006.01)
*C08K 5/55* (2006.01)
*C08K 5/375* (2006.01)
*C08L 33/08* (2006.01)
*G03F 7/004* (2006.01)
*C08L 33/14* (2006.01)
*G03F 7/11* (2006.01)

(52) U.S. Cl.
CPC ............ *G03F 7/0392* (2013.01); *C08L 33/08* (2013.01); *C08L 33/10* (2013.01); *C08L 33/14* (2013.01); *G03F 7/0045* (2013.01); *C08K 5/375* (2013.01); *C08K 5/55* (2013.01); *G03F 7/11* (2013.01); *G03F 7/2004* (2013.01)

(58) Field of Classification Search
CPC ...... G03F 7/0392; G03F 7/039; G03F 7/0397; G03F 7/0045; G03F 7/0395
See application file for complete search history.

(56) References Cited

U.S. PATENT DOCUMENTS

| | | | | |
|---|---|---|---|---|
| 2007/0275320 A1* | 11/2007 | Washio | ................. | G03F 7/0382 430/270.1 |
| 2008/0026321 A1* | 1/2008 | Misumi | ................. | C08F 220/18 430/270.1 |
| 2012/0264057 A1* | 10/2012 | Wang | ................... | G03F 7/0045 430/281.1 |
| 2014/0329926 A1* | 11/2014 | Kirino | ................... | C08G 59/66 522/14 |
| 2016/0291467 A1* | 10/2016 | Sugihara | ............... | C08F 216/14 |

FOREIGN PATENT DOCUMENTS

| | | |
|---|---|---|
| JP | H09-176112 | 7/1997 |
| JP | H11-052562 | 2/1999 |
| JP | 2004309776 A * | 11/2004 |

OTHER PUBLICATIONS

English Machine Translation of Okui JP-2004309776-A (Nov. 2004) (Year: 2004).*

* cited by examiner

*Primary Examiner* — John A McPherson
*Assistant Examiner* — Nicholas E Brown
(74) *Attorney, Agent, or Firm* — Knobbe Martens Olson & Bear LLP

(57) ABSTRACT

A chemically amplified positive-type photosensitive resin composition which is highly sensitive and in which it is easy to form a resist pattern whose cross-sectional shape is rectangular, a photosensitive dry film which includes a photosensitive resin layer formed from the composition, a method of manufacturing the photosensitive dry film, a method of manufacturing a patterned resist film using the composition, a method of manufacturing a substrate with a template using the composition and a method of manufacturing a plated article using the substrate with the template. A Lewis acid compound is included in the composition that also includes an acid generator which generates an acid by application of an active ray or radiation, and a resin whose solubility in alkali is increased by action of an acid.

10 Claims, No Drawings

CHEMICALLY AMPLIFIED POSITIVE-TYPE PHOTOSENSITIVE RESIN COMPOSITION, PHOTOSENSITIVE DRY FILM, METHOD OF MANUFACTURING PHOTOSENSITIVE DRY FILM, METHOD OF MANUFACTURING PATTERNED RESIST FILM, METHOD OF MANUFACTURING SUBSTRATE WITH TEMPLATE AND METHOD OF MANUFACTURING PLATED ARTICLE

This application claims priority to Japanese Patent Application No. 2018-090866, filed May 9, 2018, the entire content of which is incorporated herein by reference.

BACKGROUND OF THE INVENTION

Field of the Invention

The present invention relates to a chemically amplified positive-type photosensitive resin composition, a photosensitive dry film which includes a photosensitive resin layer formed of the chemically amplified positive-type photosensitive resin composition, a method of manufacturing the photosensitive dry film, a method of manufacturing a patterned resist film using the chemically amplified positive-type photosensitive resin composition, a method of manufacturing a substrate with a template using the chemically amplified positive-type photosensitive resin composition and a method of manufacturing a plated article using the substrate with the template.

Related Art

Photofabrication is presently the mainstream of a microfabrication technique. Photofabrication is a generic term for a technology used for manufacturing a wide variety of precision components such as a semiconductor package by applying a photoresist composition to the surface of an article to be processed so as to form a photoresist layer, patterning the photoresist layer by a photolithographic technique and then performing, for example, electroforming based mainly on chemical etching, electrolytic etching or electroplating using the patterned photoresist layer (photoresist pattern) as a mask.

In recent years, as electronic devices have been downsized, high density packaging technologies on semiconductor packages have progressed, and thus packaging density has been developed based on multi-pin thin film packaging in packages, reduction of package sizes, two-dimensional packaging technologies in flip chip systems and three-dimensional packaging technologies. In these types of high density packaging techniques, as connection terminals, for example, protruding electrodes (mounting terminals) such as bumps which protrude on a package, metal posts which connect rewiring extended from a peripheral terminal on a wafer and the mounting terminals and the like are highly accurately arranged on the surface of a substrate.

In the photofabrication described above, a photoresist composition is used, and as the photoresist composition, a chemically amplified photoresist composition which includes an acid generator is known (see Patent Documents 1 and 2 and the like). In the chemically amplified photoresist composition, acid is generated from the acid generator by application of radiation (exposure), the diffusion of the acid is facilitated by heating processing, an acid catalytic reaction occurs on a base resin and the like in the composition and the alkaline solubility thereof is changed.

The chemically amplified positive-type photoresist composition described above is used for a patterned insulating film, the formation of an etching mask, the formation of plated articles such as a bump, a metal post and Cu rewiring produced in a plating step and the like. Specifically, a photoresist pattern used as a template is formed in which the chemically amplified photoresist composition is used to form a photoresist layer having a desired film thickness on a support member such as a metal substrate, in which exposure is performed through a predetermined mask pattern, in which development is performed and in which parts where the plated articles are formed are selectively removed (separated). Then, a conductor such as copper is embedded by plating in the removed parts (non-resist parts), thereafter the photoresist pattern therearound is removed and thus it is possible to form the bump, the metal post and the Cu rewiring.

Patent Document 1: Japanese Unexamined Patent Application, Publication No. H09-176112
Patent Document 2: Japanese Unexamined Patent Application, Publication No. H11-52562

SUMMARY OF THE INVENTION

In general, when a resist pattern is formed, its cross-sectional shape is often preferably rectangular. In particular, in the formation of the connection terminals such as the bump and the metal post produced in the plating step and the formation of the Cu rewiring described above, the cross-sectional shape of the non-resist parts of the resist pattern serving as a template is highly preferably rectangular. In the formation process of the plated articles, the cross-sectional shape of the non-resist parts of the resist pattern serving as a template is rectangular, and thus it is possible to sufficiently acquire a contact area of the bottom surfaces of the connection terminals such as the bump and the metal post and the Cu rewiring with the support member. In this way, it is easy to form the connection terminals and the Cu rewiring which have satisfactory adherence to the support member.

However, when a resist pattern is formed using the conventionally known chemically amplified positive-type photoresist composition as disclosed in Patent Documents 1 and 2 and the like, it is often difficult to form the resist pattern whose cross-sectional shape is rectangular. In particular, when a resist pattern serving as a template for the formation of the connection terminals such as the bump and the metal post and the Cu rewiring is formed on a metal substrate, on the contact surface of the front surface of the substrate and the resist pattern, a resist part overhangs on the side of the non-resist part, and thus "fitting" in which the width of the top of the non-resist part is narrower than the width of the bottom thereof easily occurs.

As described above, when the conventionally known chemically amplified positive-type photoresist composition as disclosed in Patent Documents 1 and 2 and the like is used, it is difficult to form a resist pattern in which it is easy to form the bump, the metal post, the Cu rewiring and the like having satisfactory adherence to the substrate and which has a preferable cross-sectional shape.

In general, a photosensitive resin composition which is used for the formation of a pattern is preferably highly sensitive. When a highly sensitive photosensitive resin composition is used, it is easy to form a resist pattern whose cross-sectional shape is rectangular.

The present invention is made in view of the foregoing problems, and an object thereof is to provide a chemically amplified positive-type photosensitive resin composition which is highly sensitive and in which it is easy to form a resist pattern whose cross-sectional shape is rectangular, a photosensitive dry film which includes a photosensitive resin layer formed of the chemically amplified positive-type photosensitive resin composition, a method of manufacturing the photosensitive dry film, a method of manufacturing a patterned resist film using the chemically amplified positive-type photosensitive resin composition, a method of manufacturing a substrate with a template using the chemically amplified positive-type photosensitive resin composition and a method of manufacturing a plated article using the substrate with the template.

After conducting extensive studies in order to achieve the above object, the present inventors have found that the above problem can be solved by including a Lewis acid compound (C) in a chemically amplified positive-type photosensitive resin composition that includes: an acid generator (A) which generates an acid by application of an active ray or radiation; and a resin (B) whose solubility in alkali is increased by action of an acid, with the result that the inventors have completed the present invention. Specifically, the present invention provides followings.

A first aspect of the present invention is a chemically amplified positive-type photosensitive resin composition including: an acid generator (A) which generates an acid by application of an active ray or radiation; a resin (B) of which solubility in alkali is increased by action of an acid and a Lewis acid compound (C).

A second aspect of the present invention is a photosensitive dry film which includes: a base material film; and a photosensitive resin layer that is formed on a surface of the base material film, and in which the photosensitive resin layer is formed of the chemically amplified positive-type photosensitive resin composition according to the first aspect.

A third aspect of the present invention is a method of manufacturing a photosensitive dry film, including: applying, on a base material film, the chemically amplified positive-type photosensitive resin composition according to the first aspect so as to form a photosensitive resin layer.

A fourth aspect of the present invention is a method of manufacturing a patterned resist film, including:
a stacking step of stacking, on a substrate, a photosensitive resin layer formed of the chemically amplified positive-type photosensitive resin composition according to the first aspect;
an exposure step of applying an active ray or radiation to the photosensitive resin layer selectively in terms of position; and
a development step of developing the photosensitive resin layer after being exposed.

A fifth aspect of the present invention is a method of manufacturing a substrate with a template, including: a stacking step of stacking, on a substrate having a metal surface, a photosensitive resin layer formed of the chemically amplified positive-type photosensitive resin composition according to the first aspect;
an exposure step of applying an active ray or radiation to the photosensitive resin layer selectively in terms of position; and
a development step of developing the photosensitive resin layer after being exposed so as to produce a template for forming a plated article.

A sixth aspect of the present invention is a method of manufacturing a plated article, including: a step of plating the substrate with the template manufactured by the method according to the fifth aspect so as to form the plated article within the template.

According to the present invention, it is possible to provide a chemically amplified positive-type photosensitive resin composition which is highly sensitive and in which it is easy to form a resist pattern whose cross-sectional shape is rectangular, a photosensitive dry film which includes a photosensitive resin layer formed of the chemically amplified positive-type photosensitive resin composition, a method of manufacturing the photosensitive dry film, a method of manufacturing a patterned resist film using the chemically amplified positive-type photosensitive resin composition, a method of manufacturing a substrate with a template using the chemically amplified positive-type photosensitive resin composition and a method of manufacturing a plated article using the substrate with the template.

DETAILED DESCRIPTION OF THE INVENTION

<<Chemically Amplified Positive-Type Photosensitive Resin Composition>>

A chemically amplified positive-type photosensitive resin composition (hereinafter also referred to as a "photosensitive resin composition") includes: an acid generator (A) (hereinafter also referred to as an "acid generator (A)") which generates an acid by application of an active ray or radiation; a resin (B) (hereinafter also referred to as a "resin (B)") whose solubility in alkali is increased by action of an acid and a Lewis acid compound (C). The photosensitive resin composition may include components such as an alkali soluble resin (D), a sulfur-containing compound (E), an acid diffusion inhibitor (F) and an organic solvent (S) as necessary.

The film thickness of a resist pattern formed by use of the photosensitive resin composition is not particularly limited. The photosensitive resin composition is preferably used for the formation of a resist pattern whose film is thick. Specifically, the film thickness of the resist pattern formed by use of the photosensitive resin composition is preferably 0.5 μm or more, is more preferably 0.5 μm or more and 300 μm or less, is further preferably 0.5 μm or more and 150 μm or less and is particularly preferably 0.5 μm or more and 200 μm or less. The upper limit value of the film thickness may be, for example, 100 μm or less. The lower limit value of the film thickness may be, for example, 1 μm or more or may be 3 μm or more.

Essential or arbitrary components included in the photosensitive resin composition and a method of manufacturing the photosensitive resin composition will be described below.

<Acid Generator (A)>

The acid generator (A) is a compound which generates an acid by application of an active ray or radiation, and is not particularly limited as long as it is a compound which directly or indirectly generates an acid by light. As the acid generator (A), any one of the acid generators of first to fifth aspects which will be described below is preferable. Suitable acid generators among the acid generators (A) suitably used in the photosensitive resin composition will be described below as the first to fifth aspects.

The first aspect of the acid generator (A) may be a compound represented by the following formula (a1).

[Chem. 1]

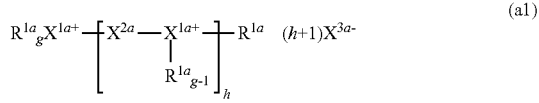
(a1)

In the above formula (a1), $X^{1a}$ represents a sulfur atom or iodine atom respectively having a valence of g, and g represents 1 or 2.

h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms or an alkynyl group having 2 or more and 30 or less carbon atoms; and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be the same as or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms or a phenylene group, and may form a ring structure including $X^{1a}$. $R^{2a}$ represents an alkyl group having 1 or more and 5 or less carbon atoms or an aryl group having 6 or more and 10 or less carbon atoms.

$X^{2a}$ represents a structure represented by the following formula (a2).

[Chem. 2]

(a2)

In the above formula (a2), $X^{4a}$ represents an alkylene group having 1 or more and 8 or less carbon atoms, an arylene group having 6 or more and 20 or less carbon atoms or a divalent group of a heterocyclic compound having 8 or more and 20 or less carbon atoms; and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 or more and 3 or less carbon atoms or a phenylene group. h represents the number of repeating units of the structure in parentheses. Examples of h include an integer of 0 or more. (h+1) $X^{4a}$s and (h) $X^{5a}$s may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

[Chem. 3]

(a17)

In the above formula (a17), $R^{3a}$ represents an alkyl group having 80% or more of the hydrogen atoms substituted by fluorine atoms. j represents the number thereof and is an integer of 1 or more and 5 or less. (j) $R^{3a}$s may be identical to or different from each other.

[Chem. 4]

(a18)

In the above formula (a18), $R^{4a}$ to $R^{7a}$ each independently represent a fluorine atom and a phenyl group, and part or all of the hydrogen atoms of the phenyl group may be substituted by at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfo-nium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, and the like.

Among the onium ions in the compound represented by the above formula (a1), a preferred onium ion may be a sulfonium ion represented by the following formula (a19).

[Chem. 5]

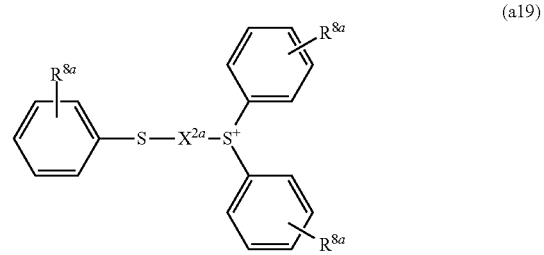
(a19)

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1).

Specific examples of the sulfonium ion represented by the above formula (a19) include 4-(phenylthio)phenyldiphenylsulfonium, 4-(4-benzoyl-2-chlorophenylthio)phenylbis (4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, diphenyl[4-(p-terphenylthio)phenyl] diphenylsulfonium, and the like.

In regard to the fluorinated alkylfluorophosphoric acid anion represented by the above formula (a17), $R^{3a}$ represents an alkyl group substituted with a fluorine atom, a preferred number of carbon atoms is 1 or more and 8 or less and a more preferred number of carbon atoms is 1 or more and 4 or less. Specific examples of the alkyl group include: linear alkyl groups such as methyl, ethyl, propyl, butyl, pentyl and octyl; branched alkyl groups such as isopropyl, isobutyl, sec-butyl and tert-butyl; and furthermore, cycloalkyl groups such as cyclopropyl, cyclobutyl, cyclopentyl and cyclohexyl, and the proportion of hydrogen atoms substituted by fluorine atoms in the alkyl groups is normally 80% or more, is preferably 90% or more and is more preferably 100%. When the substitution rate of fluorine atoms is 80% or less, the acid strength of the onium fluorinated alkylfluorophosphate represented by the above formula (a1) is lowered.

A particularly preferred example of $R^{3a}$ is a linear or branched perfluoroalkyl group having 1 or more and 4 or less carbon atoms and a substitution ratio of fluorine atoms of 100%, and specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2 (CF_3) CF$, and $(CF_3)_3C$. j which is the number of $R^{3a}$s represents an integer of 1 or more and 5 or less, preferably represents an integer of 2 or more and 4 or less and particularly represents 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$ and $[(CF_3CF_2CF_2)_3PF_3]^-$, and among them, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferable.

Preferred specific examples of the borate anion represented by the above formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis (pentafluorophenyl)borate ($[(C_6F_5)_2BF_2]^-$), trifluoro (pentafluorophenyl)borate ($[(C_6F_5)BF_3]^-$), and tetrakis (difluorophenyl)borate ($[B (C_6H_3F_2)_4]^-$). Among these, tetrakis(pentafluorophenyl)borate ($[B(C_6F_5)_4]^-$) is particularly preferable.

The second aspect of the acid generator (A) includes: halogen-containing triazine compounds such as 2,4-bis (trichloromethyl)-6-piperonyl-1,3,5-triazine, 2,4-bis (trichloromethyl)-6-[2-(2-furyl)ethenyl]-s-triazine, 2,4-bis (trichloromethyl)-6-[2-(5-methyl-2-furyl)ethenyl]-s-triazine, 2,4-bis(trichloromethyl)-6-[2-(5-ethyl-2-furyl) ethenyl]-s-triazine, 2,4-bis(trichloromethyl)-6-[2-(5-propyl-2-furyl)ethenyl]-s-triazine, 2,4-bis(trichloromethyl)-6-[2-(3, 5-dimethoxyphenyl)ethenyl]-s-triazine, 2,4-bis (trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis (trichloromethyl)-6-[2-(3-methoxy-5-propoxyphenyl) ethenyl]-s-triazine, 2,4-bis(trichloromethyl)-6-[2-(3,4-methylenedioxyphenyl)ethenyl]-s-triazine, 2,4-bis (trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy) phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl) ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis (trichloromethyl)-1,3,5-triazine, tris(1,3-dibromopropyl)-1, 3,5-triazine, and tris(2,3-dibromopropyl)-1,3,5-triazine; and halogen-containing triazine compounds represented by the following formula (a3) such as tris(2,3-dibromopropyl)isocyanurate.

[Chem. 6]

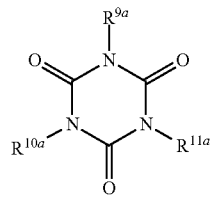

(a3)

In the above formula (a3), $R^{9a}$, $R^{10a}$ and $R^{11a}$ each independently represent a halogenated alkyl group.

The third aspect of the acid generator (A) includes α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, and α-(ethylsulfonyloxyimino)-1-cyclopentenylacetonitrile and compounds represented by the following formula (a4) containing an oximesulfonate group.

[Chem. 7]

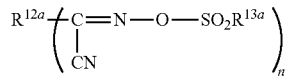

(a4)

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the above formula (a4), the aromatic compound group indicates a group of compounds having physical and chemical properties characteristic of aromatic compounds, and examples thereof include aryl groups such as a phenyl group and a naphthyl group and heteroaryl groups such as a furyl group and a thienyl group. These groups may have one or more appropriate substituents such as a halogen atom, an alkyl group, an alkoxy group and a nitro group on the rings. Furthermore, $R^{13a}$ is particularly preferably an alkyl group having 1 or more and 6 or less carbon atoms, and examples thereof include a methyl group, an ethyl group, a propyl group and a butyl group. In particular, compounds in which $R^{12a}$ is an aromatic compound group and in which and $R^{13a}$ is an alkyl group having 1 or more and 4 or less carbon atoms are preferable.

Examples of the acid generator represented by the above formula (a4) include compounds in which $R^{12a}$ is any one of a phenyl group, a methylphenyl group and a methoxyphenyl group, and in which $R^{13a}$ is a methyl group when n=1, and specific examples thereof include α-(methylsulfonyloxy-imino)-1-phenylacetonitrile, α-(methylsulfonyloxyimino)-1-(p-methylphenyl)acetonitrile, α-(methylsulfonyloxy-imino)-1-(p-methoxyphenyl)acetonitrile, [2-(propylsulfonyloxyimino)-2,3-dihydroxythiophene-3-ylidene] (o-tolyl) acetonitrile, and the like. Specifically, when n=2, the acid generator represented by the above formula (a4) is an acid generator represented by the following formulae.

[Chem. 8]

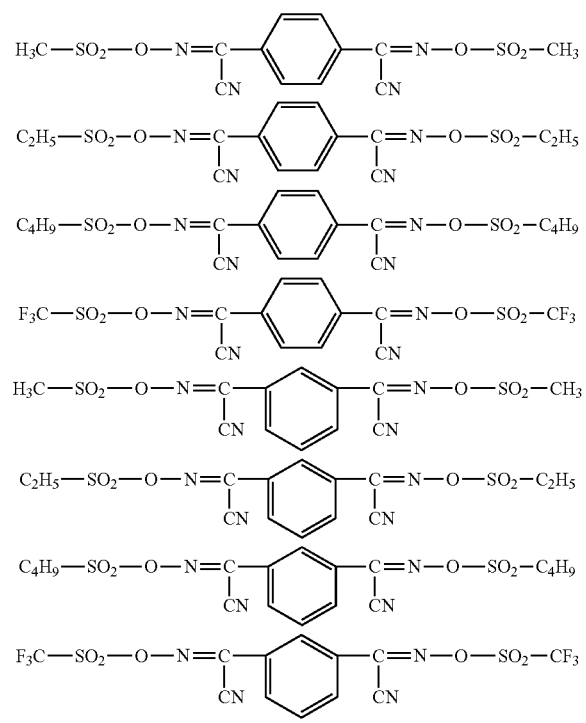

In addition, the fourth aspect of the acid generator (A) includes onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, and a linear or branched alkoxy group having 1 or more and 6 or less carbon atoms or the like. The structure derived from the naphthalene ring, which may be of a monovalent group (one free valence) or of a bivalent group (two free valences), is desirably of a monovalent group (in this regard, the number of free valences is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

[Chem. 9]

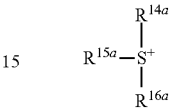

(a5)

In the above formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

[Chem. 10]

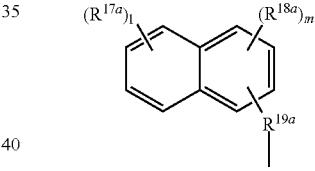

(a6)

In the above formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent.

l and m each independently represent an integer of 0 or more and 2 or less, and l+m is 3 or less. In this regard, when there exists a plurality of $R^{17a}$, they may be the same as or different from each other. Furthermore, when there exists a plurality of $R^{18a}$, they may be the same as or different from each other.

Preferably, among $R^{14a}$, $R^{15a}$ and $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form 3 or more and 9 or less membered rings including sulfur atom(s). Preferably, the number of atoms to form the ring (including sulfur atom) is 5 or more and 6 or less.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 or more and 6 or less carbon atoms, linear or branched alkyl groups having 1 or more and 6 or less carbon atoms, or the like.

Examples of suitable cation moiety include those represented by the following formulae (a7) and (a8), and in particular, the structure represented by the following formula (a8) is preferable.

[Chem. 11]

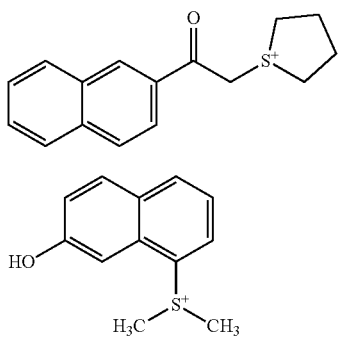

The cation moieties, which may be of an iodonium salt or a sulfonium salt, are desirably of a sulfonium salt in view of acid-producing efficiency.

Therefore, as a preferable example of the anion moiety of the onium salt having a naphthalene ring at the cation moiety, an anion capable of forming a sulfonium salt is preferable.

The anion moiety of the acid generator as described above is a fluoroalkylsulfonic acid ion or an aryl sulfonic acid ion in which part or all of hydrogen atoms are fluorinated.

The alkyl group of the fluoroalkylsulfonic acid ion may be a linear, branched or cyclic group having 1 or more and 20 or less carbon atoms, and preferably, the number of carbon atoms is 1 or more and 10 or less in view of bulkiness and diffusion distance of the produced acid. In particular, branched and cyclic groups are preferable due to shorter diffusion length. Also, methyl, ethyl, propyl, butyl, octyl groups and the like are preferable due to being inexpensively synthesizable.

The aryl group of the aryl sulfonic acid ion may be an aryl group having 6 or more and 20 or less carbon atoms, and is exemplified by a phenyl group or a naphthyl group that may not be substituted with an alkyl group or a halogen atom. In particular, aryl groups having 6 or more and 10 or less carbon atoms are preferred since they can be synthesized inexpensively. Specific examples thereof include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% or more and 100% or less, and more preferably 50% or more and 100% or less. It is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

[Chem. 12]

 (a9)

In the above formula (a9), $R^{20a}$ is a group represented by the following formulae (a10), (a11), or (a12).

[Chem. 13]

 (a10)

 (a11)

 (a12)

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Among these, trifluoromethane sulfonate and perfluorobutane sulfonate are preferable in view of safety.

In addition, a nitrogen-containing moiety represented by the following formulae (a13) or (a14) may be also be used for the anion moiety.

[Chem. 14]

 (a13)

 (a14)

In the above formulae (a13) and (a14), $X^a$ represents a linear or branched alkylene group in which at least one hydrogen atom is substituted with a fluorine atom, the number of carbon atoms of the alkylene group is 2 or more and 6 or less, is preferably 3 or more and 5 or less and is most preferably 3. In addition, $Y^a$ and $Z^a$ each independently represent a linear or branched alkyl group in which at least one hydrogen atom is substituted with a fluorine atom, the number of carbon atoms of the alkyl group is 1 or more and 10 or less, is preferably 1 or more and 7 or less and is more preferably 1 or more and 3 or less.

A smaller number of carbon atoms in the alkylene group of $X^a$ or in the alkyl group of $Y^a$ or $Z^a$ is preferred since the solubility into an organic solvent is also favorable.

In addition, a larger number of hydrogen atoms each substituted by a fluorine atom in the alkylene group of $X^a$ or in the alkyl group of $Y^a$ or $Z^a$ is preferred since the acid strength becomes greater. The percentage of fluorine atoms in the alkylene group or alkyl group, that is, the fluorination rate, is preferably 70% or more and 100% or less and is more preferably 90% or more and 100% or less, and a perfluoroalkylene group or a perfluoroalkyl group is most preferable in which all of the hydrogen atoms are substituted with fluorine atoms.

Preferable onium salts having a naphthalene ring at their cation moieties are exemplified by compounds represented by the following formulae (a15) or (a16).

[Chem. 15]

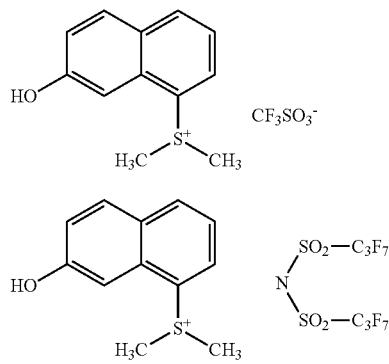

The fifth aspect of the acid generator (A) include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-(methylsulfonyloxy) succinimide, N-(trichloromethylsulfonyloxy)succinimide, N-(phenylsulfonyloxy)maleimide, and N-(methylsulfonyloxy)phthalimide; trifluoromethane sulfonates such as N-(trifluoromethylsulfonyloxy)phthalimide, N-(trifluoromethylsulfonyloxy)-1,8-naphthalimide, N-(trifluoromethylsulfonyloxy)-4-butyl-1,8-naphthalimide N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates; and the like.

These acid generators (A) may be used alone or two or more types may be combined and used. The content of the acid generator (A) with respect to the total solid content of the photosensitive resin composition is preferably 0.1% by mass or more and 10% by mass or less, is more preferably 0.2% by mass or more and 6% by mass or less and is most preferably 0.5% by mass or more and 3% by mass or less. The amount of acid generator (A) used is set within the range described above, and thus it is easy to prepare the photosensitive resin composition which is satisfactorily sensitive, which is a uniform solution and whose storage stability is excellent.

<Resin (B)>

The resin (B) whose alkali solubility is increased by action of an acid is not particularly limited, and an arbitrary resin whose alkali solubility is increased by action of an acid may be used. Among these, at least one type of resin selected from the group consisting of novolak resin (B1), polyhydroxystyrene resins (B2) and acrylic resin (B3) is preferably contained.

[Novolak Resin (B1)]

As the novolak resin (B1), a resin including the structural unit represented by the following formula (b1) may be used.

[Chem. 16]

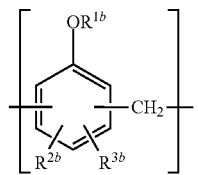

In the above formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formulae (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

[Chem. 17]

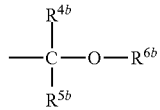

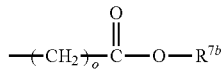

In the formulae (b2) and (b3), $R^{4b}$ and $R^{5b}$ each independently represent a hydrogen atom or a linear or branched alkyl group having 1 or more and 6 or less carbon atoms, $R^{6b}$ represents a linear, branched, or cyclic alkyl group having 1 or more and 10 or less carbon atoms, $R^{7b}$ represents a linear, branched, or cyclic alkyl group having 1 or more and 6 or less carbon atoms, and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociable dissolution-inhibiting group represented by the above formula (b2) include a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, a 1-ethoxy-1-methylethyl group, and the like. Furthermore, specific examples of the acid-dissociable dissolution-inhibiting group represented by the above formula (b3) include a tert-butoxycarbonyl group, tert-butoxycarbonylmethyl group, and the like. Examples of the trialkylsilyl group include a trimethylsilyl group and a tri-tert-butyldimethylsilyl group in which each alkyl group has 1 or more and 6 or less carbon atoms.

[Polyhydroxystyrene Resin (B2)]

As the polyhydroxystyrene resin (B2), a resin including the structural unit represented by the following formula (b4) may be used.

[Chem. 18]

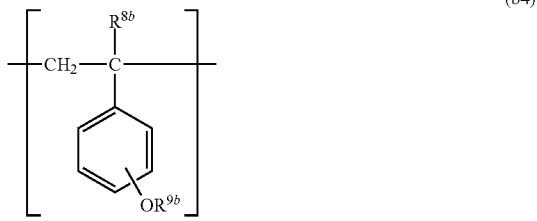

(b4)

In the formula (b4), $R^{8b}$ represents a hydrogen atom or an alkyl group having 1 or more and 6 or less carbon atoms, and $R^{9b}$ represents an acid-dissociable dissolution-inhibiting group.

The alkyl group having 1 or more and 6 or less carbon atoms may include, for example, linear, branched or cyclic alkyl groups having 1 or more and 6 or less carbon atoms. Examples of the linear or branched alkyl group include a methyl group, an ethyl group, a propyl group, an isopropyl group, an n-butyl group, isobutyl group, a tert-butyl group, a pentyl group, an isopentyl group, and a neopentyl group, and examples of the cyclic alkyl group include a cyclopentyl group and a cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl (meth)acrylate, ethyl (meth)acrylate, and butyl (meth)acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide; and the like.

[Acrylic Resin (B3)]

The acrylic resin (B3) is not particularly limited as long as an acrylic resin is provided whose solubility in alkali is increased by action of an acid and which is conventionally mixed with various photosensitive resin compositions. The acrylic resin (B3) preferably contains, for example, a structural unit (b-3) derived from an acrylic ester which includes a —$SO_2$—containing cyclic group or a lactone-containing cyclic group. In such a case, when a resist pattern is formed, it is easy to form a resist pattern whose cross-sectional shape is preferable.

(—$SO_2$— Containing Cyclic Group)

Here, the "—$SO_2$— containing cyclic group" refers to a cyclic group which contains a ring including —$SO_2$— in its ring skeleton, and is specifically a cyclic group in which a sulfur atom (s) in —$SO_2$— forms part of the ring skeleton in the cyclic group. When the ring including —$SO_2$— in its ring skeleton is counted as the first ring, and only this ring is provided, the "—$SO_2$— containing cyclic group" is referred to as a monocyclic group whereas when another ring structure is further provided, it is referred to as a polycyclic group regardless of its structure. The —$SO_2$— containing cyclic group may be either monocyclic or polycyclic.

In particular, the —$SO_2$— containing cyclic group is preferably a cyclic group that includes —O—$SO_2$— in its ring skeleton, that is, a cyclic group that contains a sultone ring in which —O—S— in —O—$SO_2$— forms part of the ring skeleton.

The number of carbon atoms of the —$SO_2$— containing cyclic group is preferably 3 or more and 30 or less, is more preferably 4 or more and 20 or less, is further preferably 4 or more and 15 or less and is particularly preferably 4 or more and 12 or less. It is assumed that the number of carbon atoms described above is the number of carbon atoms which form the ring skeleton and does not include the number of carbon atoms in a substituent.

The —$SO_2$— containing cyclic group may be either a —$SO_2$— containing aliphatic cyclic group or a —$SO_2$— containing aromatic cyclic group. The —$SO_2$— containing cyclic group is preferably a —$SO_2$— containing aliphatic cyclic group.

Examples of the —$SO_2$— containing aliphatic cyclic group include a group that is obtained by removing at least one hydrogen atom from an aliphatic hydrocarbon ring in which part of carbon atoms forming its ring skeleton is substituted with —$SO_2$— or —O—$SO_2$—. More specifically, examples thereof include a group that is obtained by removing at least one hydrogen atom from an aliphatic hydrocarbon ring in which —$CH_2$— forming its ring skeleton is substituted with —$SO_2$—, a group that is obtained by removing at least one hydrogen atom from an aliphatic hydrocarbon ring in which —CH$_2$—CH$_2$— forming its ring is substituted with —O—SO$_2$— and the like.

The number of carbon atoms of the aliphatic hydrocarbon ring is preferably 3 or more and 20 or less and is more preferably 3 or more and 12 or less. The aliphatic hydrocarbon ring may be either polycyclic or monocyclic. As the monocyclic aliphatic hydrocarbon group, a group is preferable that is obtained by removing two hydrogen atoms from a monocycloalkane in which the number of carbon atoms is 3 or more and 6 or less. Examples of the monocycloalkane can include cyclopentane, cyclohexane and the like. As the polycyclic aliphatic hydrocarbon ring, a group is preferable that is obtained by removing two hydrogen atoms from a polycycloalkane in which the number of carbon atoms is 7 or more and 12 or less, and specific examples of the polycycloalkane include adamantane, norbornane, isobornane, tricyclodecane, tetracyclododecane and the like.

The —SO$_2$— containing cyclic group may include a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group, a cyano group and the like.

As the alkyl group serving as the substituent, an alkyl group is preferable in which the number of carbon atoms is 1 or more and 6 or less. The alkyl group described above is preferably linear or branched. Specific examples thereof include a methyl group, an ethyl group, an n-propyl group, an isopropyl group, an n-butyl group, an isobutyl group, a tert-butyl group, an n-pentyl group, an isopentyl group, a neopentyl group, an n-hexyl group and the like. Among them, a methyl group and an ethyl group are preferable, and a methyl group is particularly preferable.

As the alkoxy group serving as the substituent described above, an alkoxy group is preferable in which the number of carbon atoms is 1 or more and 6 or less. The alkoxy group described above is preferably linear or branched. Specific examples thereof include a group in which the alkyl group serving as the substituent described above is bonded to an oxygen atom (—O—).

Examples of the halogen atom serving as the substituent described above include a fluorine atom, a chlorine atom, a bromine atom, an iodine atom and the like, and a fluorine atom is preferable.

Examples of the halogenated alkyl group serving as the substituent include a group in which part or all of hydrogen atoms in the alkyl group described above are substituted with the halogen atom described above.

Examples of the halogenated alkyl group serving as the substituent described above include a group in which part or all of hydrogen atoms in the alkyl group serving as the substituent described above are substituted with the halogen atom described above. As the halogenated alkyl group described above, a fluorinated alkyl group is preferable, and a perfluoroalkyl group is particularly preferable.

R" in each of —COOR" and —OC(=O)R" described above is a linear, branched or cyclic alkyl group in which the number of hydrogen atoms or carbon atoms is 1 or more and 15 or less.

When R" is a linear or branched alkyl group, the number of carbon atoms in the chained alkyl group is preferably 1 or more and 10 or less, is more preferably 1 or more and 5 or less and is particularly preferably 1 or 2.

When R" is a cyclic alkyl group, the number of carbon atoms in the cyclic alkyl group is preferably 3 or more and 15 or less, is more preferably 4 or more and 12 or less and is particularly preferably 5 or more and 10 or less. Specific examples thereof can include a group that is obtained by removing one or more hydrogen atoms from a monocycloalkane which may or may not be substituted with a fluorine atom or a fluorinated alkyl group or a polycycloalkane such as bicycloalkane, tricycloalkane or tetracycloalkane and the like. More specific examples thereof include a group that is obtained by removing one or more hydrogen atoms from a monocycloalkane such as cyclopentane or cyclohexane or a polycycloalkane such as adamantane, norbornane, isobornane, tricyclodecane or tetracyclododecane.

As the hydroxyalkyl group serving as the substituent described above, a hydroxyalkyl group is preferable in which the number of carbon atoms is 1 or more and 6 or less. Specific examples thereof include a group in which at least one of hydrogen atoms in the alkyl group serving as the substituent described above is substituted with a hydroxyl group.

More specific examples of the —SO$_2$— containing cyclic group include groups represented by formulae (3-1) to (3-4) below.

[Chem. 19]

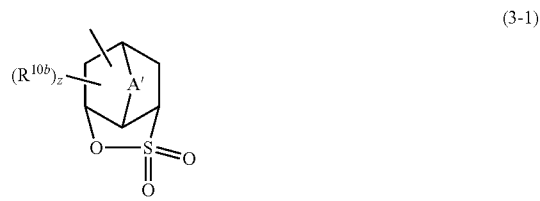

(3-1)

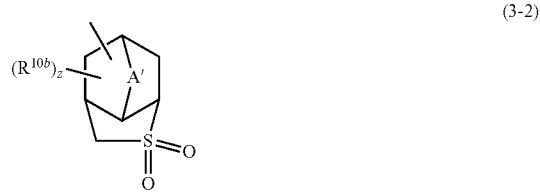

(3-2)

(3-3)

(3-4)

(where A' represents an alkylene group which may include an oxygen atom or a sulfur atom and in which the number of carbon atoms is 1 or more and 5 or less, an oxygen atom or a sulfur atom, z represents an integer of 0 or more and 2 or less, R$^{10b}$ represents an alkyl group, an alkoxy group, a halogenated alkyl group, a hydroxyl group, —COOR", —OC(=O)R", a hydroxyalkyl group or a cyano group and R" represents a hydrogen atom or an alkyl group.)

In the above formulae (3-1) to (3-4), A' represents an alkylene group which may include an oxygen atom (—O—) or a sulfur atom (—S—) and in which the number of carbon atoms is 1 or more and 5 or less, an oxygen atom or a sulfur atom. As the alkylene group in A' in which the number of carbon atoms is 1 or more and 5 or less, a linear or branched alkylene group is preferable, and examples thereof include a methylene group, an ethylene group, an n-propylene group, an isopropylene group and the like.

When the alkylene group described above includes an oxygen atom or a sulfur atom, specific examples thereof include a group in which —O— or —S— is interposed in the terminal of the alkylene group described above or between carbon atoms, and examples thereof include —O—CH$_2$—, —CH$_2$—O—CH$_2$—, —S—CH$_2$—, —CH$_2$—S—CH$_2$— and the like. As A', an alkylene group in which the number of carbon atoms is 1 or more and 5 or less or —O— is preferable, an alkylene group in which the number of carbon atoms is 1 or more and 5 or less is more preferable and a methylene group is most preferable.

Z may be either of 0.1 and 2, and 0 is most preferable. When z is 2, a plurality of R$^{10b}$s may be the same as or different from each other.

As the alkyl group, the alkoxy group, the halogenated alkyl group, —COOR", —OC(=O)R" and the hydroxyalkyl group in R$^{10b}$, the same ones as the alkyl group, the alkoxy group, the halogenated alkyl group, —COOR", —OC(=O)R" and the hydroxyalkyl group mentioned as the substituents that may be included in the —SO$_2$— containing cyclic group are respectively mentioned.

Specific cyclic groups represented by formulae (3-1) to (3-4) described above will be illustrated below.

"Ac" in the formulae represents an acetyl group.

[Chem. 20]

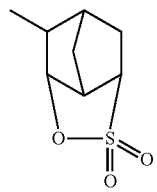
(3-1-1)

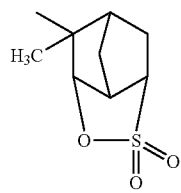
(3-1-2)

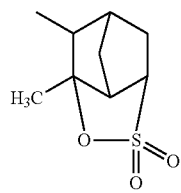
(3-1-3)

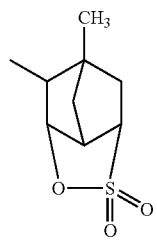
(3-1-4)

-continued

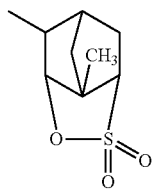
(3-1-5)

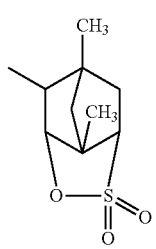
(3-1-6)

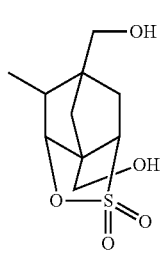
(3-1-7)

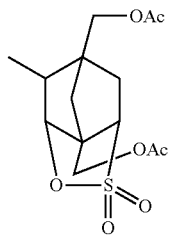
(3-1-8)

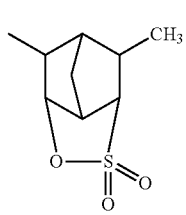
(3-1-9)

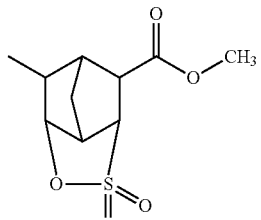
(3-1-10)

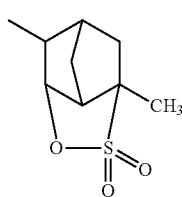
(3-1-11)

-continued
(3-1-12)
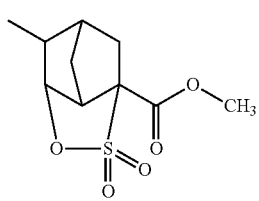
(3-1-13)
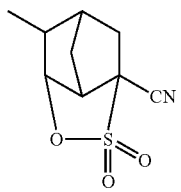
(3-1-14)
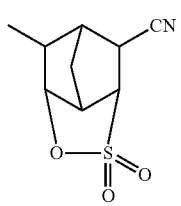
(3-1-15)
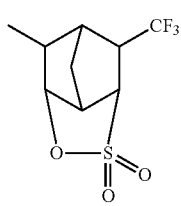
(3-1-16)
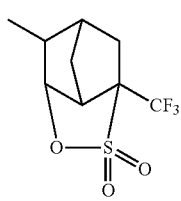
(3-1-17)
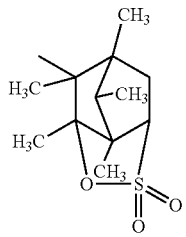
(3-1-18)
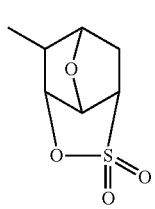
(3-1-19)
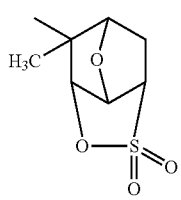
-continued
(3-1-20)
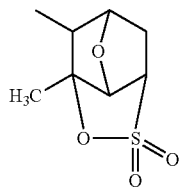
(3-1-21)
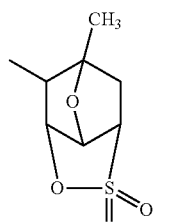
(3-1-22)
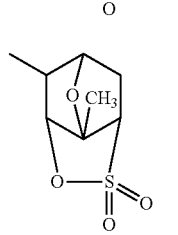
(3-1-23)
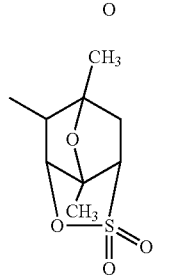
(3-1-24)
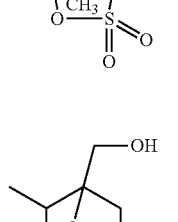
(3-1-25)
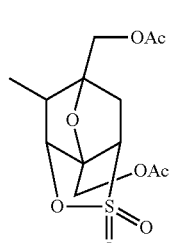
(3-1-26)
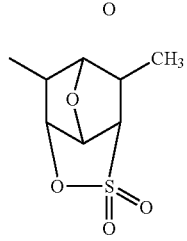

-continued (3-1-27) 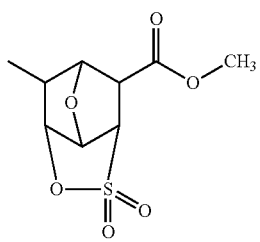

(3-1-28) 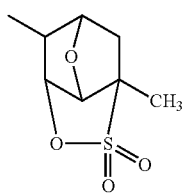

(3-1-29) 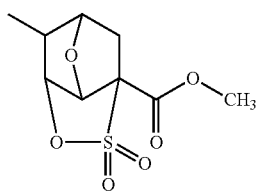

(3-1-30) 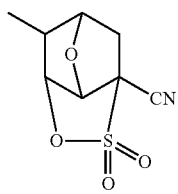

(3-1-31) 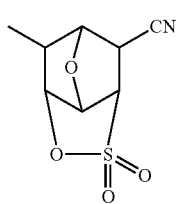

(3-1-32) 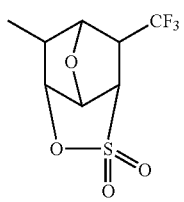

(3-1-33) 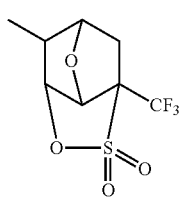

-continued

[Chem. 21]

(3-2-1) 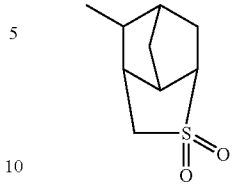

(3-2-2) 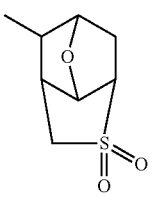

(3-3-1) 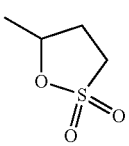

(3-4-1) 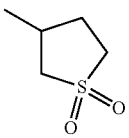

Among the —$SO_2$— containing cyclic groups described above, the group represented by formula (3-1) described above is preferable, at least one type selected from the group consisting of the groups represented by chemical formulae (3-1-1), (3-1-18), (3-3-1) and (3-4-1) described above is more preferable and the group represented by chemical formula (3-1-1) described above is most preferable.

(Lactone-Containing Cyclic Group)

The "lactone-containing cyclic group" refers to a cyclic group which contains a ring (lactone) including —O—C(=O)— in its ring skeleton. When the lactone ring is counted as the first ring, and only this ring is provided, the lactone-containing cyclic group is referred to as a monocyclic group whereas when another ring structure is further provided, it is referred to as a polycyclic group regardless of its structure. The lactone-containing cyclic group may be either monocyclic or polycyclic.

The lactone cyclic group in the structural unit (b-3) is not particularly limited, and an arbitrary lactone cyclic group can be used. Specific examples of the lactone-containing monocyclic group include groups which are obtained by removing one hydrogen atom from 4 to 6 membered ring lactones, for example, a group which is obtained by removing one hydrogen atom from β-propionolactone, a group which is obtained by removing one hydrogen atom from γ-butyrolactone and a group which is obtained by removing one hydrogen atom from δ-valero lactone. Specific examples of the lactone-containing polycyclic group include groups which are obtained by removing one hydrogen atom from bicycloalkane, tricycloalkane and tetracycloalkane including lactone rings.

Although in the structural unit (b-3), the structure of the other parts is not particularly limited as long as the —$SO_2$— containing cyclic group or the lactone-containing cyclic group is included, at least one type of structural unit is preferable that is selected from the group consisting of a structural unit (b-3-S) which is derived from an acrylic ester where a hydrogen atom bonded to the α-position carbon atom may be substituted with a substituent and which includes the —SO$_2$-containing cyclic group and a structural unit (b-3-L) which is derived from an acrylic ester where a hydrogen atom bonded to the α-position carbon atom may be substituted with a substituent and which includes the lactone-containing cyclic group.

[Structural Unit (b-3-S)]

More specific examples of the structural unit (b-3-S) include a structural unit represented by formula (b-S1) below.

[Chem. 22]

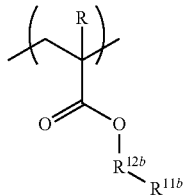

(b-S1)

(where R represents a hydrogen atom, an alkyl group in which the number of carbon atoms is 1 or more and 5 or less or a halogenated alkyl group in which the number of carbon atoms is 1 or more and 5 or less, $R^{11b}$ represents a —SO$_2$— containing cyclic group and $R^{12b}$ represents a single bond or a divalent linking group.)

In formula (b-S1), R is the same as described above. $R^{11b}$ is the same as the —SO$_2$— containing cyclic group described above. $R^{12b}$ may be either a single bond or a divalent linking group. $R^{12b}$ is preferably a divalent linking group such that the effects of the present invention are excellent.

Although the divalent linking group in $R^{12b}$ is not particularly limited, preferred examples thereof include a divalent hydrocarbon group which may include a substituent, a divalent linking group which includes a hetero atom and the like.

Divalent Hydrocarbon Group which May Include a Substituent

The hydrocarbon group serving as the divalent linking group may be either an aliphatic hydrocarbon group or an aromatic hydrocarbon group. The aliphatic hydrocarbon group means a hydrocarbon group which does not have aromaticity. The aliphatic hydrocarbon group may be either saturated or unsaturated. In general, an unsaturated hydrocarbon group is preferable. More specific examples of the aliphatic hydrocarbon group include linear and branched aliphatic hydrocarbon groups, an aliphatic hydrocarbon group which includes a ring in its structure and the like.

The number of carbon atoms of the linear or branched aliphatic hydrocarbon group is preferably 1 or more and 10 or less, is more preferably 1 or more and 8 or less and is further preferably 1 or more and 5 or less.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—] and the like.

As the branched aliphatic hydrocarbon group, a branched alkylene group is preferable. Specific examples thereof include alkyl alkylene groups such as: alkyl methylene groups such as —CH(CH$_3$)—, —CH(CH$_2$CH$_3$)—, —C(CH$_3$)$_2$—, —C(CH$_3$) (CH$_2$CH$_3$)—, —C(CH$_3$) (CH$_2$CH$_2$CH$_3$)— and —C(CH$_2$CH$_3$)$_2$—; alkyl ethylene groups such as —CH(CH$_3$) CH$_2$—, —CH(CH$_3$)CH(CH$_3$)—, —C(CH$_3$)$_2$CH$_2$—, —CH(CH$_2$CH$_3$) CH$_2$— and —C(CH$_2$CH$_3$)$_2$—CH$_2$—; alkyl trimethylene groups such as —CH(CH$_3$) CH$_2$CH$_2$— and —CH$_2$CH(CH$_3$) CH$_2$—; and alkyl tetramethylene groups such as —CH(CH$_3$) CH$_2$CH$_2$CH$_2$— and —CH$_2$CH(CH$_3$) CH$_2$CH$_2$— and the like. As the alkyl group in the alkyl alkylene group, a linear alkyl group is preferable in which the number of carbon atoms is 1 or more and 5 or less.

The linear or branched aliphatic hydrocarbon group described above may include or may not include a substituent (group or atom other than a hydrogen atom) which substitutes a hydrogen atom. Examples of the substituent include a fluorine atom, a fluorinated alkyl group which is substituted with a fluorine atom and in which the number of carbon atoms is 1 or more and 5 or less, an oxo group (=O) and the like.

Examples of the aliphatic hydrocarbon group which includes a ring in its structure described above include: a cyclic aliphatic hydrocarbon group which may include a substituent that includes a hetero atom in a ring structure (group obtained by removing two hydrogen atoms from an aliphatic hydrocarbon ring); a group in which the cyclic aliphatic hydrocarbon group is bonded to the terminal of a linear or branched aliphatic hydrocarbon group; a group in which the cyclic aliphatic hydrocarbon group is interposed partway in a linear or branched aliphatic hydrocarbon group; and the like. Examples of the linear or branched aliphatic hydrocarbon group described above include the same ones as described above.

The number of carbon atoms of the cyclic aliphatic hydrocarbon group is preferably 3 or more and 20 or less and is more preferably 3 or more and 12 or less.

The cyclic aliphatic hydrocarbon group may be either polycyclic or monocyclic. As the monocyclic aliphatic hydrocarbon group, a group is preferable which is obtained by removing two hydrogen atoms from a monocycloalkane. The number of carbon atoms of the monocycloalkane is preferably 3 or more and 6 or less. Specific examples thereof include cyclopentane, cyclohexane and the like. As the polycyclic aliphatic hydrocarbon group, a group is preferable which is obtained by removing two hydrogen atoms from a polycycloalkane. The number of carbon atoms of the polycycloalkane is 7 or more and 12 or less. Specific examples thereof include adamantane, norbornane, isobornane, tricyclodecane, tetracyclododecane and the like.

The cyclic aliphatic hydrocarbon group may include or may not include a substituent (group or atom other than a hydrogen atom) which substitutes a hydrogen atom. Examples of the substituent include an alkyl group, an alkoxy group, a halogen atom, a halogenated alkyl group, a hydroxyl group, an oxo group (=O) and the like.

As the alkyl group serving as the substituent, an alkyl group is preferable in which the number of carbon atoms is 1 or more and 5 or less, and a methyl group, an ethyl group, a propyl group, an n-butyl group, an isobutyl group and a tert-butyl group are more preferable.

As the alkoxy group serving as the substituent described above, an alkoxy group is preferable in which the number of carbon atoms is 1 or more and 5 or less, a methoxy group, an ethoxy group, an n-propoxy group, an iso-propoxy group, an n-butoxy group and a tert-butoxy group are more preferable and a methoxy group and an ethoxy group are particularly preferable.

Examples of the halogen atom serving as the substituent described above include a fluorine atom, a chlorine atom, a bromine atom, an iodine atom and the like, and a fluorine atom is preferable.

Examples of the halogenated alkyl group serving as the substituent described above include a group in which part or all of hydrogen atoms in the alkyl group described above are substituted with the halogen atom described above.

In the cyclic aliphatic hydrocarbon group, part of carbon atoms forming its ring structure may be substituted with —O— or —S—. As the substituent which includes the hetero atom described above, —O—, —C(=O)—O—, —S—, —S(O=)$_2$— or —S(O=)$_2$—O— are preferable.

The aromatic hydrocarbon group serving as the divalent hydrocarbon group is a divalent hydrocarbon group which includes at least one aromatic ring, and may include a substituent. The aromatic ring is not particularly limited as long as it is a cyclic conjugated system which includes (4n+2) π electrons, and the aromatic ring may be either monocyclic or polycyclic. The number of carbon atoms of the aromatic ring is preferably 5 or more and 30 or less, is more preferably 5 or more and 20 or less, is further preferably 6 or more and 15 or less and is particularly preferably 6 or more and 12 or less. However, the number of carbon atoms thereof does not include the number of carbon atoms of the substituent.

Specific examples of the aromatic ring include: aromatic hydrocarbon rings such as benzene, naphthalene, anthracene and phenanthrene; an aromatic heterocycle in which part of hydrogen atoms forming the aromatic hydrocarbon ring is substituted with a hetero atom; and the like. Examples of the hetero atom in the aromatic heterocycle include an oxygen atom, a sulfur atom, a nitrogen atom and the like. Specific examples of the aromatic heterocycle include a pyridine ring, a thiophene ring and the like.

Specific examples of the aromatic hydrocarbon group serving as the divalent hydrocarbon group include: a group which is obtained by removing two hydrogen atoms from the aromatic hydrocarbon ring or the aromatic heterocycle described above (arylene group or heteroarylene group); a group which is obtained by removing two hydrogen atoms from an aromatic compound (for example, biphenyl or fluorene) including two or more aromatic rings; a group in which one of hydrogen atoms in the group that is obtained by removing two hydrogen atoms from the aromatic hydrocarbon ring or the aromatic heterocycle described above (aryl group or heteroaryl group) is substituted with an alkylene group (for example, a group which is obtained by further removing one hydrogen atom from an aryl group in an arylalkyl group such as a benzyl group, a phenethyl group, 1-naphthylmethyl group, 2-naphthylmethyl group, 1-naphthylethyl group or 2-naphthylethyl group); and the like.

The number of carbon atoms of the alkylene group bonded to the aryl group or heteroaryl group described above is preferably 1 or more and 4 or less, is more preferably 1 or more and 2 or less and is particularly preferably 1.

In the aromatic hydrocarbon group described above, the hydrogen atom included in the aromatic hydrocarbon group described above may be substituted with a substituent. For example, the hydrogen atom bonded to the aromatic ring in the aromatic hydrocarbon group described above may be substituted with a substituent. Examples of the substituent described above include an alkyl group, an alkoxy group, a halogen atom, a halogenated alkyl group, a hydroxyl group, an oxo group (=O) and the like.

As the alkyl group serving as the substituent described above, an alkyl group is preferable in which the number of carbon atoms is 1 or more and 5 or less, and a methyl group, an ethyl group, an n-propyl group, an n-butyl group and a tert-butyl group are more preferable.

As the alkoxy group serving as the substituent described above, an alkoxy group is preferable in which the number of carbon atoms is 1 or more and 5 or less, a methoxy group, an ethoxy group, an n-propoxy group, an iso-propoxy group, an n-butoxy group and a tert-butoxy group are preferable and a methoxy group and an ethoxy group are more preferable.

Examples of the halogen atom serving as the substituent described above include a fluorine atom, a chlorine atom, a bromine atom, an iodine atom and the like, and a fluorine atom is preferable.

Examples of the halogenated alkyl group serving as the substituent described above include a group in which part or all of hydrogen atoms in the alkyl group described above are substituted with the halogen atom described above.

Divalent Linking Group Including Hetero Atom

The hetero atom in the divalent linking group including the hetero atom is an atom other than a carbon atom and a hydrogen atom, and examples thereof include an oxygen atom, a nitrogen atom, a sulfur atom, a halogen atom and the like.

Specific examples of the divalent linking group including the hetero atom include: non-hydrocarbon based linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)— and =N—; combinations of at least one type of these non-hydrocarbon based linking groups and the divalent hydrocarbon group; and the like. Examples of the divalent hydrocarbon group described above include the same as the divalent hydrocarbon group which may include the substituent described above, and a linear or branched aliphatic hydrocarbon group is preferable.

Among those described above, —NH— in —C(=O)—NH—, —NH— and Hs in —NH—C(=NH)— may be individually substituted with a substituent such as an alkyl group or an acyl group. The number of carbon atoms of the substituent described above is preferably 1 or more and 10 or less, is more preferably 1 or more and 8 or less and is particularly preferably 1 or more and 5 or less.

As the divalent linking group in $R^{12b}$, a linear or branched alkylene group, a cyclic aliphatic hydrocarbon group or a divalent linking group including a hetero atom is particularly preferable.

When the divalent linking group in $R^{12b}$ is a linear or branched alkylene group, the number of carbon atoms of the alkylene group is preferably 1 or more and 10 or less, is more preferably 1 or more and 6 or less, is particularly preferably 1 or more and 4 or less and is most preferably 1 or more and 3 or less. Specific examples thereof include the same ones as the linear alkylene group and the branched alkylene group mentioned as the linear or branched aliphatic hydrocarbon group in the description of the "divalent hydrocarbon group which may include a substituent" serving as the divalent linking group described above.

When the divalent linking group in $R^{12b}$ is a cyclic aliphatic hydrocarbon group, examples of the cyclic aliphatic hydrocarbon group include the same as the cyclic aliphatic hydrocarbon group mentioned as the "aliphatic hydrocarbon group which includes a ring in its structure" in the description of the "divalent hydrocarbon group which may include a substituent" serving as the divalent linking group described above.

As the cyclic aliphatic hydrocarbon group described above, a group which is obtained by removing two or more hydrogen atoms from cyclopentane, cyclohexane, norbornane, isobornane, adamantane, tricyclodecane or tetracyclododecane is particularly preferable.

When the divalent linking group in $R^{12b}$ is a divalent linking group including a hetero atom, examples of the preferable linking group described above include —O—, —C(=O)—O—, —C(=O)—, —O—C(=O)—O—, —C(=O)—NH—, —NH— (H may be substituted with a substituent such as an alkyl group or an acyl group), —S—, —S(=O)$_2$—, —S(=O)$_2$—O—, groups which are represented by general formulae of —$Y^1$—O—$Y^2$—, —[$Y^1$—C(=O)—O]$_{m'}$—$Y^2$— and —$Y^1$—O—C(=O)—$Y^2$— [where $Y^1$ and $Y^2$ each represent a divalent hydrocarbon group which may independently include a substituent, O represents an oxygen atom and m' represents an integer of 0 or more and 3 or less] and the like.

When the divalent linking group in $R^{12b}$ is —NH—, a hydrogen atom in —NH— may be substituted with a substituent such as an alkyl group or an acyl group. The number of carbon atoms of the substituent (such as an alkyl group or an acyl group) is preferably 1 or more and 10 or less, is more preferably 1 or more and 8 or less and is particularly preferably 1 or more and 5 or less.

In the formulae of —$Y^1$—O—$Y^2$—, —[$Y^1$—C(=O)—O]$_{m'}$—$Y^2$— and —$Y^1$—O—C(=O)—$Y^2$—, $Y^1$ and $Y^2$ each represent a divalent hydrocarbon group which may independently include a substituent. Examples of the divalent hydrocarbon group described above include the same as the "divalent hydrocarbon group which may include a substituent" mentioned in the description of the divalent linking group described above.

As $Y^1$, a linear aliphatic hydrocarbon group is preferable, a linear alkylene group is more preferable, a linear alkylene group in which the number of carbon atoms is 1 or more and 5 or less is more preferable and a methylene group and an ethylene group are particularly preferable.

As $Y^2$, a linear or branched aliphatic hydrocarbon group is preferable, and a methylene group, an ethylene group and an alkyl methylene group are more preferable. As the alkyl group in the alkyl methylene group, a linear alkyl group in which the number of carbon atoms is 1 or more and 5 or less is preferable, a linear alkyl group in which the number of carbon atoms is 1 or more and 3 or less is more preferable and a methyl group is particularly preferable.

In the group represented by the formula of —[$Y^1$—C(=O)—O]$_{m'}$—$Y^2$—, m' is an integer of 0 or more and 3 or less, is preferably an integer of 0 or more and 2 or less, is more preferably 0 or 1 and is particularly preferably 1. In other words, as the group represented by the formula of —[$Y^1$—C(=O)—O]$_{m'}$—$Y^2$—, a group represented by the formula of —$Y^1$—C(=O)—O—$Y^2$— is particularly preferable. Among them, a group represented by the formula of —(CH$_2$)$_{a'}$—C(=O)—O—(CH$_2$)$_{b'}$— is preferable. In the formula described above, a' is an integer of 1 or more and 10 or less, is preferably an integer of 1 or more and 8 or less, is more preferably an integer of 1 or more and 5 or less, is further preferably 1 or 2 and is most preferably 1.

b' is an integer of 1 or more and 10 or less, is preferably an integer of 1 or more and 8 or less, is more preferably an integer of 1 or more and 5 or less, is further preferably 1 or 2 and is most preferably 1.

With respect to the divalent linking group in $R^{12b}$, as the divalent linking group including the hetero atom, organic groups formed by combinations of at least one type of non-hydrocarbon group and a divalent hydrocarbon group are preferable. Among them, a linear group which includes an oxygen atom as a hetero atom, for example, a group which includes an ether bond or an ester bond is preferable, a group represented by the formula of —$Y^1$—O—$Y^2$—, —[$Y^1$—C(=O)—O]$_m$—$Y^2$— or —$Y^1$—O—C(=O)—$Y^2$— is more preferable and a group represented by the formula of —[$Y^1$—C(=O)—O]$_m$—$Y^2$— or —$Y^1$—O—C(=O)—$Y^2$— is particularly preferable.

As the divalent linking group in $R^{12b}$, an alkylene group or a divalent linking group including an ester bond (—C(=O)—O—) is preferable.

As the alkylene group described above, a linear or branched alkylene group is preferable. Preferred examples of the linear aliphatic hydrocarbon group described above include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—] and the like. Preferred examples of the branched alkylene group described above include alkyl alkylene groups such as: alkyl methylene groups such as —CH(CH$_3$)—, —CH(CH$_2$CH$_3$)—, —C(CH$_3$)$_2$—, —C(CH$_3$) (CH$_2$CH$_3$)—, —C(CH$_3$) (CH$_2$CH$_2$CH$_3$)— and —C(CH$_2$CH$_3$)$_2$—; alkyl ethylene groups such as —CH(CH$_3$) CH$_2$—, —CH(CH$_3$) CH(CH$_3$)—, —C(CH$_3$)$_2$CH$_2$—, —CH(CH$_2$CH$_3$) CH$_2$— and —C(CH$_2$CH$_3$)$_2$—CH$_2$—; alkyl trimethylene groups such as —CH(CH$_3$) CH$_2$CH$_2$— and —CH$_2$CH(CH$_3$) CH$_2$—; and alkyl tetramethylene groups such as —CH(CH$_3$) CH$_2$CH$_2$CH$_2$— and —CH$_2$CH(CH$_3$) CH$_2$CH$_2$— and the like.

As the divalent linking group including the ester bond, a group represented by the formula of —$R^{13b}$—C(=O)—O— [where —$R^{13b}$ represents a divalent linking group] is particularly preferable. In other words, the structural unit (b-3-S) is preferably a structural unit which is represented by formula (b-S1-1) below.

[Chem. 23]

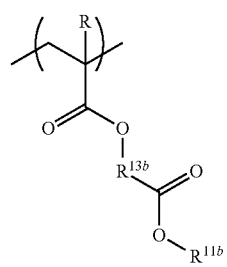

(b-S1-1)

(where R and $R^{11b}$ each are the same as described above, and $R^{13b}$ represents a divalent linking group.)

$R^{13b}$ is not particularly limited, and examples thereof include the same as the divalent linking group in $R^{12b}$ described above. As the divalent linking group in $R^{13b}$, a linear or branched alkylene group, an aliphatic hydrocarbon group including a ring in its structure or a divalent linking group including a hetero atom is preferable, and a linear or branched alkylene group or a divalent linking group including an oxygen atom as a hetero atom is preferable.

As the linear alkylene group, a methylene group or an ethylene group is preferable, and a methylene group is particularly preferable. As the branched alkylene group, an alkyl methylene group or an alkyl ethylene group is preferable, and —CH(CH$_3$)—, —CH(CH$_3$)$_2$— or C(CH$_3$)$_2$—CH$_2$— is particularly preferable.

As the divalent linking group including an oxygen atom, a divalent linking group including an ether bond or an ester bond is preferable, and —Y$^1$—O—Y$^2$—, —[Y$^1$—C(=O)—O]$_{m'}$, —Y$^2$— or —Y$^1$—O—C(=O)—Y$^2$— described above is more preferable. Y$^1$ and Y$^2$ each represent a divalent hydrocarbon group which may independently include a substituent, and m' represents an integer of 0 or more and 3 or less. Among them, —Y$^1$—O—C(=O)—Y$^2$— is preferable, and a group represented by —(CH$_2$)$_c$—O—C(=O)—(CH$_2$)$_d$— is particularly preferable.

c represents an integer of 1 or more and 5 or less, and preferably represents 1 or 2.

d represents an integer of 1 or more and 5 or less, and preferably represents 1 or 2.

As the structural unit (b-3-S), a structural unit represented by formula (b-S1-11) or (b-S1-12) below is particularly preferable, and a structural unit represented by formula (b-S1-12) is more preferable.

[Chem. 24]

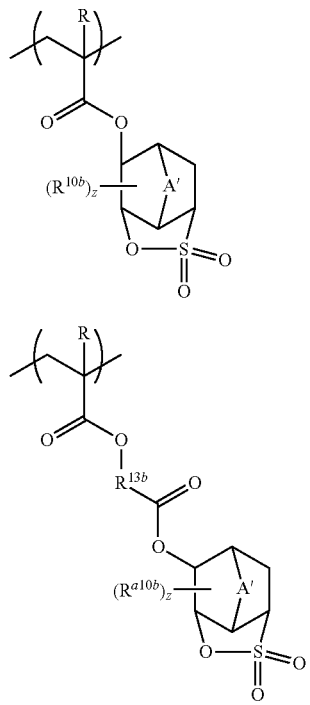

(b-S1-11)

(b-S1-12)

(where R, A', R$^{10b}$, z and R$^{13b}$ each represent the same ones as described above.)

In formula (b-S1-11), A' is preferably a methylene group, an oxygen atom (—O—) or a sulfur atom (—S—).

As R$^{13b}$, a linear or branched alkylene group or a divalent linking group including an oxygen atom is preferable. As the linear or branched alkylene group and the divalent linking group including an oxygen atom in R$^{13b}$, the same ones as the linear or branched alkylene group and the divalent linking group including an oxygen atom described above are respectively mentioned.

As the structural unit represented by formula (b-S1-12), a structural unit represented by formula (b-S1-12a) or (b-S1-12b) below is particularly preferable.

[Chem. 25]

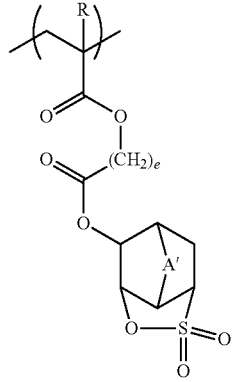

(b-S1-12a)

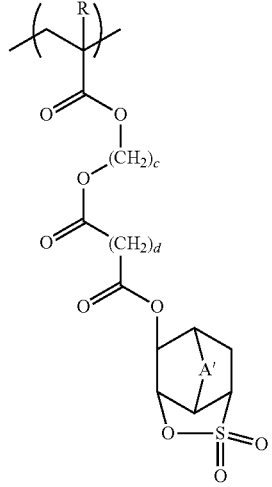

(b-S1-12b)

(where R and A' each represent the same ones as described above, and c to e each independently represent an integer of 1 or more and 3 or less.)

[Structural Unit (b-3-L)]

Examples of the structural unit (b-3-L) include a structural unit in which R$^{11b}$ in formula (b-S1) described above is substituted with a lactone-containing cyclic group, and specific examples thereof include structural units represented by formulae (b-L1) to (b-L5) below.

[Chem. 26]

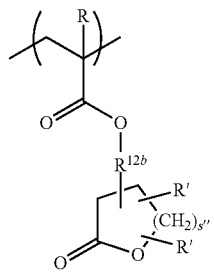

(b-L1)

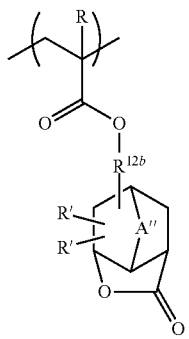 (b-L2)

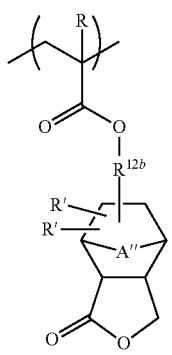 (b-L3)

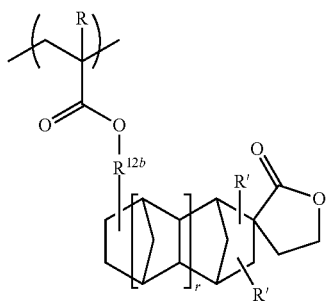 (b-L4)

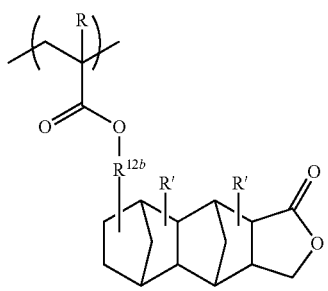 (b-L5)

(where R represents a hydrogen atom, an alkyl group in which the number of carbon atoms is 1 or more and 5 or less or a halogenated alkyl group in which the number of carbon atoms is 1 or more and 5 or less; R's each independently represent a hydrogen atom, an alkyl group, an alkoxy group, a halogenated alkyl group, a hydroxyl group, —COOR", —OC(=O)R", a hydroxyalkyl group or a cyano group, and R" represents a hydrogen atom or an alkyl group; $R^{12b}$ represents a single bond or a divalent linking group and s" represents an integer of 0 or more and 2 or less; A" represents an alkylene group which may include an oxygen atom or a sulfur atom and in which the number of carbon atoms is 1 or more and 5 or less, an oxygen atom or a sulfur atom; and r represents 0 or 1.)

R in formulae (b-L1) to (b-L5) is the same as described above. As the alkyl group, the alkoxy group, the halogenated alkyl group, —COOR", —OC(=O)R" and the hydroxyalkyl group in R', the same ones as the alkyl group, the alkoxy group, the halogenated alkyl group, —COOR", —OC(=O) R" and the hydroxyalkyl group mentioned as the substituents that may be included in the —SO$_2$— containing cyclic group are respectively mentioned.

With consideration given to ease of availability in industry, R' is preferably a hydrogen atom. The alkyl group in R" may be linear, branched or cyclic. When R" is a linear or branched alkyl group, the number of carbon atoms is preferably 1 or more and 10 or less, and is further preferably 1 or more and 5 or less. When R" is a cyclic alkyl group, the number of carbon atoms is preferably 3 or more and 15 or less, is further preferably 4 or more and 12 or less and is most preferably 5 or more and 10 or less. Specific examples thereof can include a group that is obtained by removing one or more hydrogen atoms from a monocycloalkane which may or may not be substituted with a fluorine atom or a fluorinated alkyl group or a polycycloalkane such as bicycloalkane, tricycloalkane or tetracycloalkane and the like. Specific examples thereof include a group that is obtained by removing one or more hydrogen atoms from a monocycloalkane such as cyclopentane or cyclohexane or a polycycloalkane such as adamantane, norbornane, isobornane, tricyclodecane or tetracyclododecane and the like. Examples of A" include the same as A' in formula (3-1) described above. A" is preferably an alkylene group in which the number of carbon atoms is 1 or more and 5 or less, an oxygen atom (—O—) or a sulfur atom (—S—), and is more preferably an alkylene group in which the number of carbon atoms is 1 or more and 5 or less or —O—. As the alkylene group in which the number of carbon atoms is 1 or more and 5 or less, a methylene group or a dimethylmethylene group is more preferable, and a methylene group is most preferable.

$R^{12b}$ is the same as $R^{12b}$ in formula (b-S1) described above. In formula (b-L1), s" is preferably 1 or 2. Specific examples of the structural units represented in formulae (b-L1) to (b-L3) described above will be described below. In each of the formulae below, $R^\alpha$ represents a hydrogen atom, a methyl group or a trifluoromethyl group.

[Chem. 27]

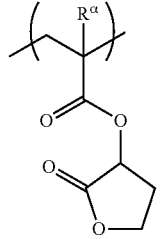 (b-L1-1)

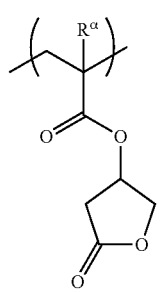 (b-L1-2)

(b-L1-3)
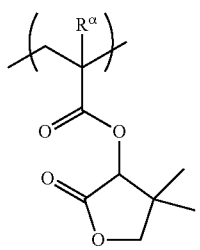
(b-L1-4)
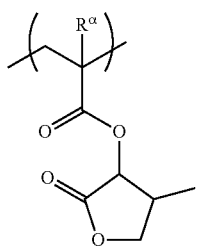
(b-L1-5)
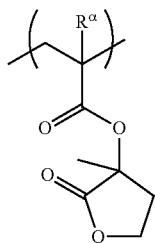
(b-L1-6)
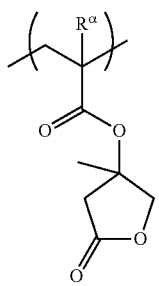
(b-L1-7)
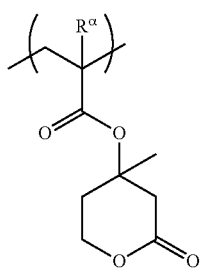
(b-L1-8)
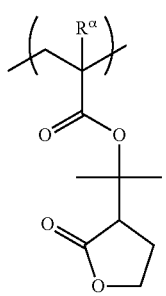
(b-L1-9)
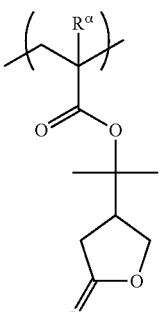
(b-L1-10)
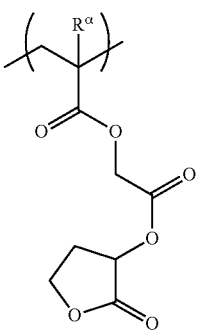
(b-L1-11)
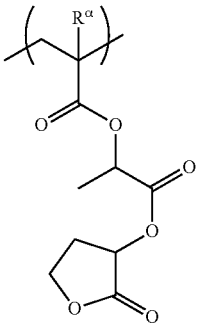
(b-L1-12)
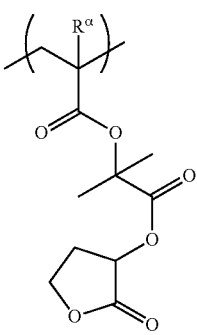

(b-L1-13)
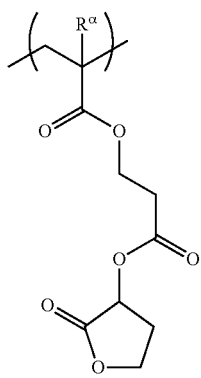
[Chem. 28]
(b-L2-1)
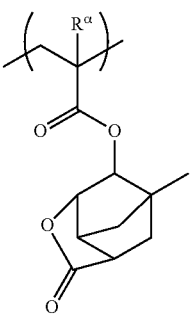
(b-L2-2)
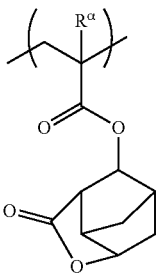
(b-L2-3)
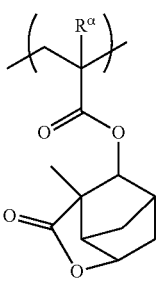
(b-L2-4)
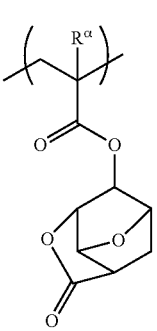
(b-L2-5)
(b-L2-6)
(b-L2-7)
(b-L2-8)
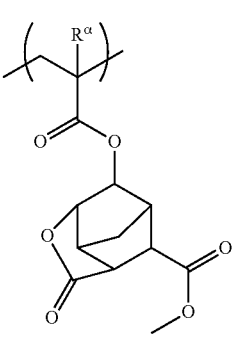

(b-L2-9)
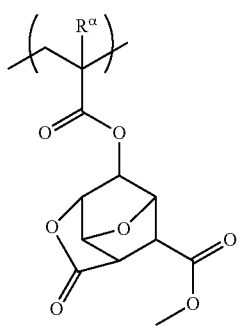
(b-L2-10)
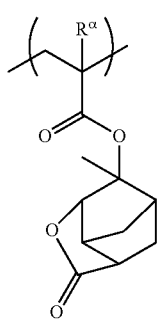
(b-L2-11)
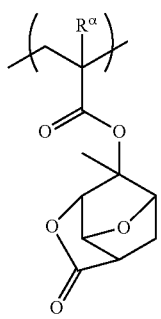
(b-L2-12)
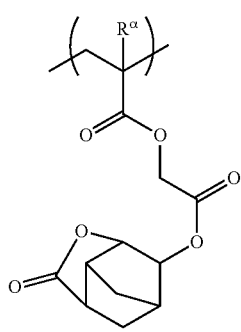
(b-L2-13)
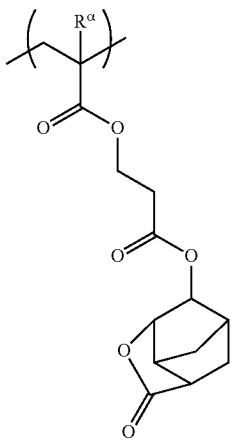
(b-L2-14)
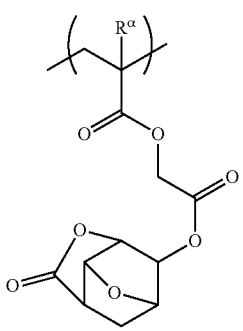
(b-L2-15)
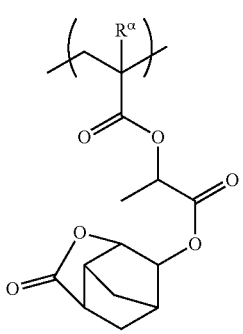
(b-L2-16)
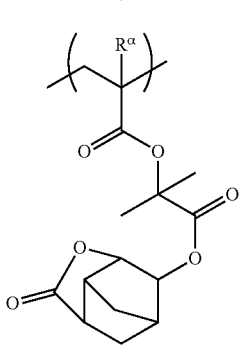

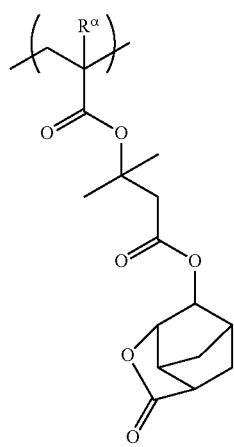
(b-L2-17)

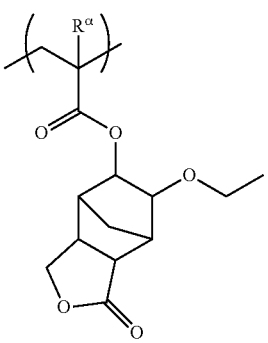
(b-L3-4)

[Chem. 29]

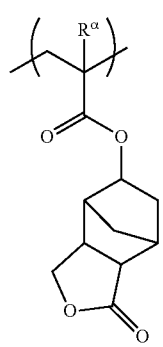
(b-L3-1)

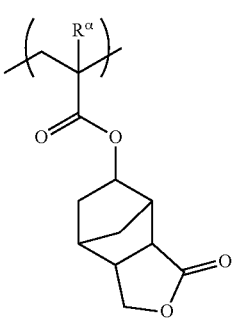
(b-L3-5)

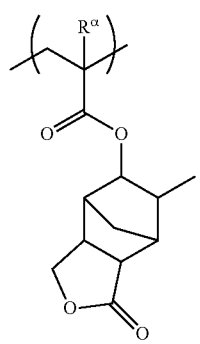
(b-L3-2)

As the structural unit (b-3-L), at least one type selected from the group consisting of the structural units represented by formulae (b-L1) to (b-L5) described above is preferable, at least one type selected from the group consisting of the structural units represented by formulae (b-L1) to (b-L3) described above is more preferable and at least one type selected from the group consisting of the structural units represented by formula (b-L1) or (b-L3) described above is particularly preferable. Among them, at least one type selected from the group consisting of the structural units represented by formulae (b-L1-1), (b-L1-2), (b-L2-1), (b-L2-7), (b-L2-12), (b-L2-14), (b-L3-1) and (b-L3-5) is preferable.

As the structural unit (b-3-L), structural units represented by formulae (b-L6) and (b-L7) below are also preferable.

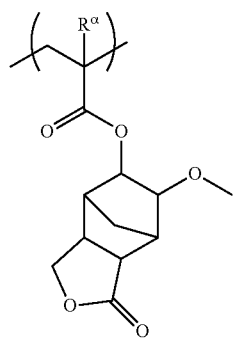
(b-L3-3)

[Chem. 30]

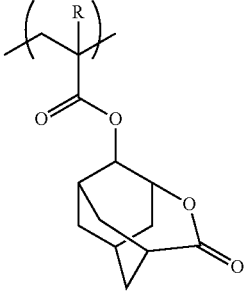
(b-L6)

-continued

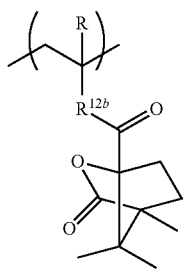
(b-L7)

In formulae (b-L6) and (b-L7), R and $R^{12b}$ represent the same ones as described above.

The acrylic resin (B3) includes, as a structural unit for enhancing the solubility of the acrylic resin (B3) in alkali by action of an acid, structural units represented by formulae (b5) to (b7) below which include an acid dissociation group.

[Chem. 31]

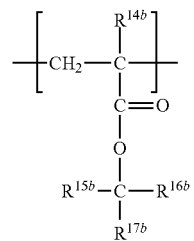
(b5)

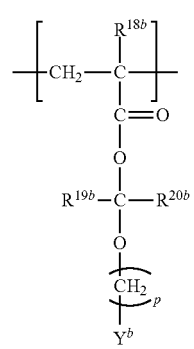
(b6)

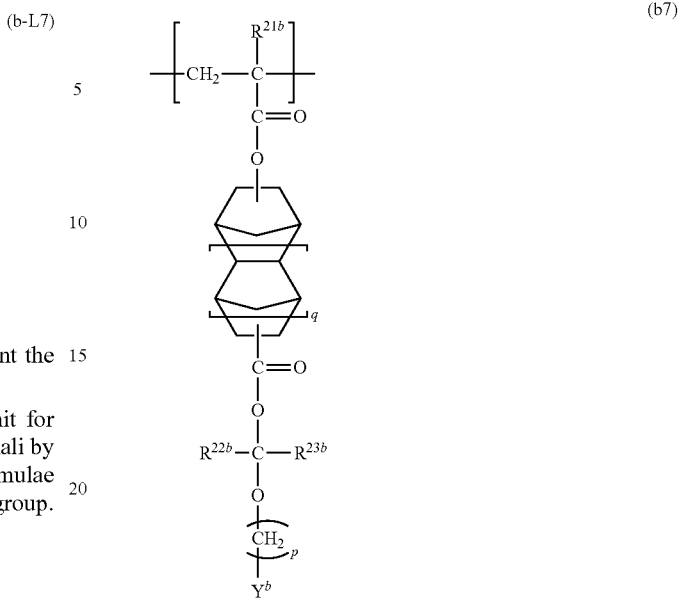
(b7)

$R^{14b}$, and $R^{18b}$ to $R^{23b}$ in the above formulae (b5) to (b7) each are independently a hydrogen atom, a linear or branched alkyl group having 1 or more and 6 or less carbon atoms, a fluorine atom or a linear or branched fluorinated alkyl group having 1 or more and 6 or less carbon atoms, $R^{15b}$ to $R^{17b}$ each are independently a linear or branched alkyl group having 1 or more and 6 or less carbon atoms, a linear or branched fluorinated alkyl group having 1 or more and 6 or less carbon atoms or an aliphatic cyclic group having 5 or more and 20 or less carbon atoms, $R^{16b}$ and $R^{17b}$ may be bonded to each other to form a hydrocarbon ring having 5 or more and 20 or less carbon atoms together with a carbon atom to which both are bonded, $Y^b$ represents an aliphatic cyclic group or an alkyl group which may include a substituent, p represents an integer of 0 or more and 4 or less and q represents 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms. Specific examples of the aliphatic cyclic group include a group in which one or more hydrogen atoms are removed from monocycloalkanes and polycycloalkanes such as bicycloalkanes, tricycloalkanes, and tetracycloalkanes. Specific examples thereof include a group in which one hydrogen atom is removed from monocycloalkanes such as cyclopentane, cyclohexane, cycloheptane, and cyclooctane, and polycycloalkanes such as adamantane, norbornane, isobornane, tricyclodecane, and tetracyclododecane. In particular, cyclohexane and adamantane from which one hydrogen atom is removed (optionally further having a substituent) are preferable.

In a case where $R^{16b}$ and $R^{17b}$ do not form a hydrocarbon ring by being bonded to each other, a linear or branched alkyl group having 2 or more and 4 or less carbon atoms is preferable as $R^{15b}$, $R^{16b}$, and $R^{17b}$ in view of high contrast, satisfactory resolution, satisfactory focal depth-width and the like. As $R^{19b}$, $R^{20b}$, $R^{22b}$ and $R^{23b}$, a hydrogen atom or a methyl group is preferable.

$R^{16b}$ and $R^{17b}$ may form an aliphatic cyclic group having 5 or more and 20 or less carbon atoms together with a carbon atom to which both are bonded. Specific examples of such an aliphatic cyclic group include a group in which one or more hydrogen atoms are removed from monocycloalkane and polycycloalkane such as bicycloalkane, tricycloalkane, and tetracycloalkane. Specifically, they include a group in which one or more hydrogen atoms are removed from monocycloalkane such as cyclopentane, cyclohexane, and cycloheptane; and polycycloalkane such as adamantane, norbornane, isobornane, tricyclodecane and tetracyclododecane; and the like. In particular, cyclohexane and adamantane from which one or more hydrogen atoms are removed (a substituent may be further included) are preferable.

Furthermore, in a case where an aliphatic cyclic group formed with $R^{16b}$ and $R^{17b}$ has a substituent on the ring skeleton thereof, examples of the substituent described above include a polar group such as a hydroxyl group, a carboxyl group, a cyano group and an oxygen atom (=O), and a linear or branched alkyl group having 1 or more and 4 or less carbon atoms. As the polar group, an oxygen atom (=O) is particularly preferable.

$Y^b$ described above is an alicyclic group or an alkyl group; and examples thereof are monocycloalkanes and polycycloalkanes such as bicycloalkanes, tricycloalkanes, and tetracycloalkanes from which at least one hydrogen atom is removed. Specific examples thereof are monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferable is adamantane from which at least one hydrogen atom is removed (that may further include a substituent).

In addition, when the alicyclic group of $Y^b$ described above has a substituent on the ring skeleton, the substituent described above is exemplified by polar groups such as a hydroxide group, a carboxyl group, a cyano group, and an oxygen atom (=O) and linear or branched lower alkyl groups having 1 or more and 4 or less carbon atoms. The polar group is preferably an oxygen atom (=O) in particular.

Furthermore, when $Y^b$ is an alkyl group, it is preferably a linear or branched alkyl group having 1 or more and 20 or less carbon atoms, and more preferably 6 or more and 15 or less carbon atoms. Preferably, the alkyl group is an alkoxyalkyl group in particular, and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

[Chem. 32]

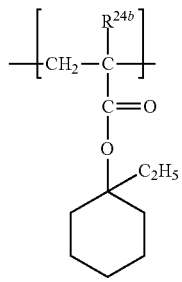

(b5-1)

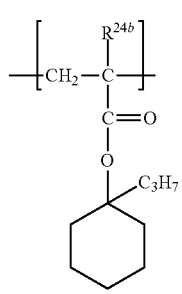

(b5-2)

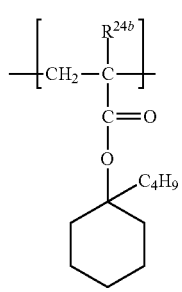

(b5-3)

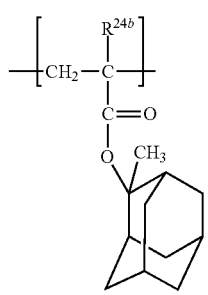

(b5-4)

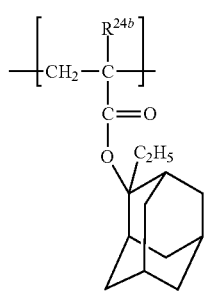

(b5-5)

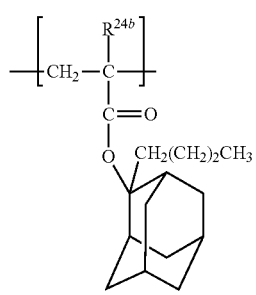
(b5-6)
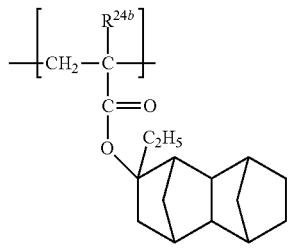
(b5-12)
(b5-7)
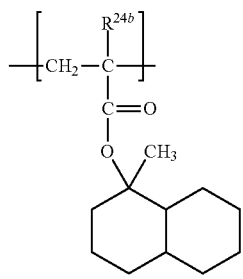
(b5-13)
(b5-8)
(b5-9)
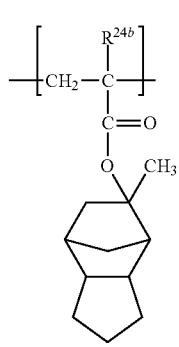
(b5-14)
(b5-10)
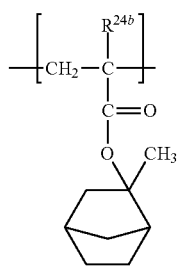
(b5-15)
(b5-11)
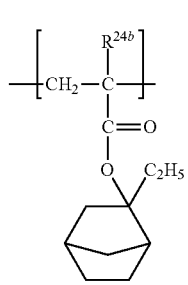
(b5-16)

(b5-17) 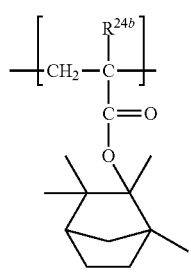
(b5-18) 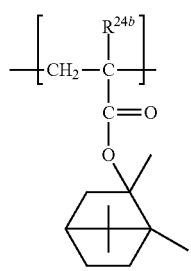
(b5-19) 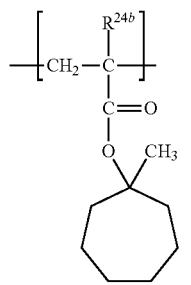
(b5-20) 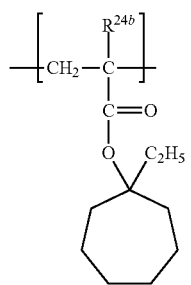
(b5-21) 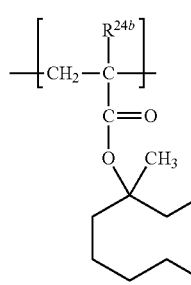
(b5-22) 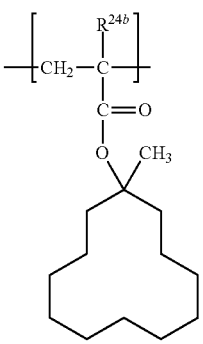
(b5-23) 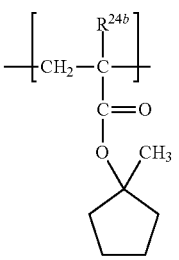
(b5-24) 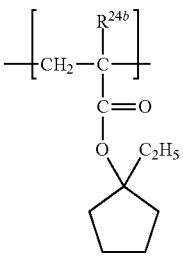
(b5-25) 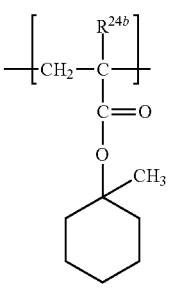
(b5-26) 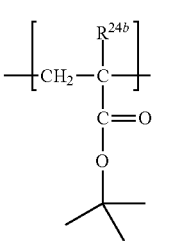

(b5-27) 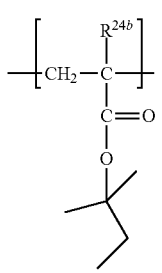
(b5-28) 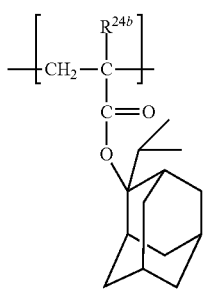
(b5-29) 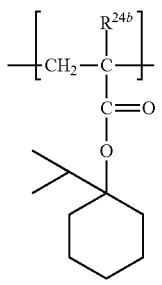
(b5-30) 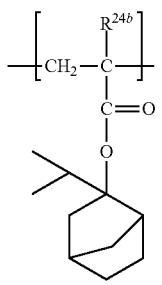
(b5-31) 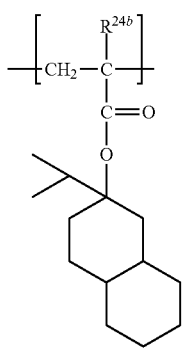
(b5-32) 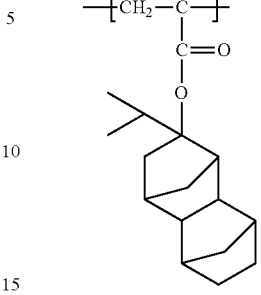
(b5-33) 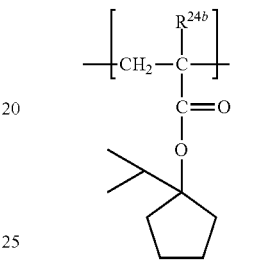
In the above formulae (b5-1) to (b5-33), $R^{24b}$ represents a hydrogen atom or a methyl group.
Preferable specific examples of the structural unit represented by the above formula (b6) include those represented by the following formulae (b6-1) to (b6-26).
[Chem. 33]
(b6-1) 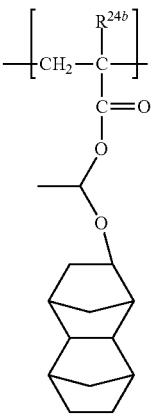
(b6-2) 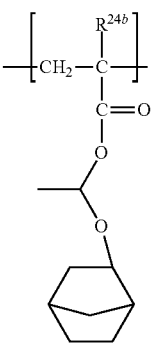

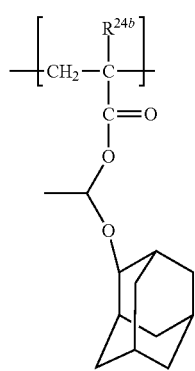
(b6-3)
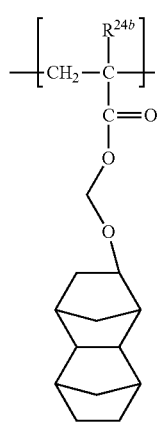
(b6-4)
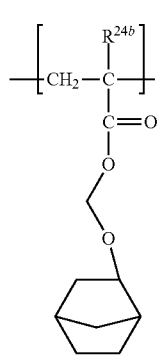
(b6-5)
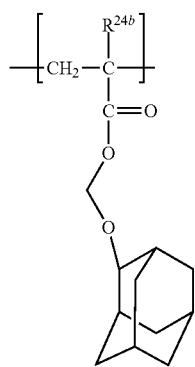
(b6-6)
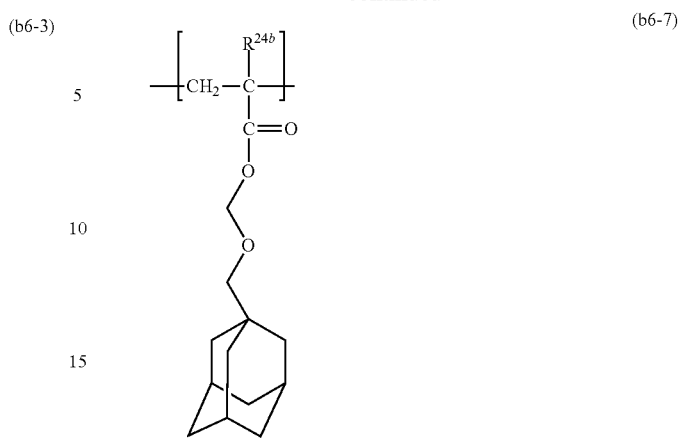
(b6-7)
(b6-8)
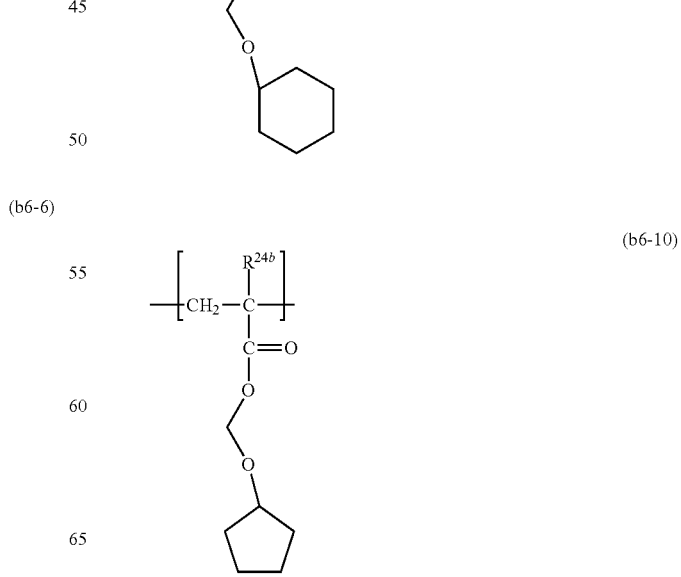
(b6-9)
(b6-10)

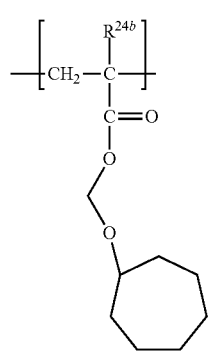
(b6-11)
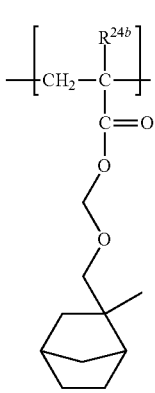
(b6-15)
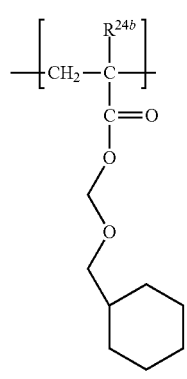
(b6-12)
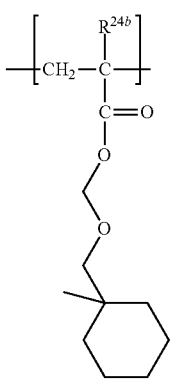
(b6-16)
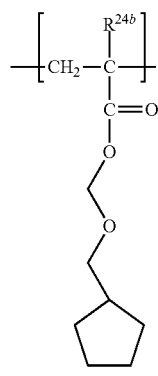
(b6-13)
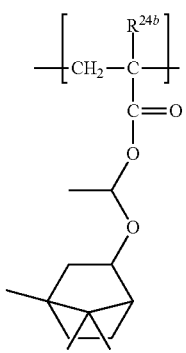
(b6-17)
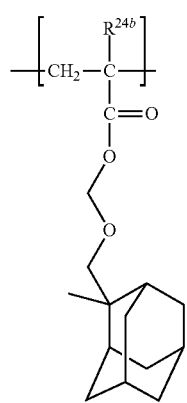
(b6-14)
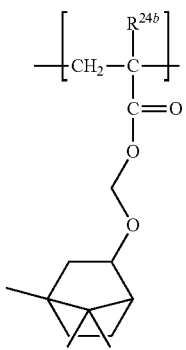
(b6-18)

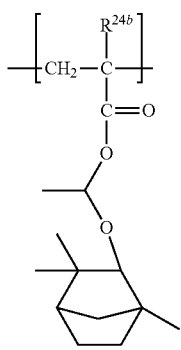
(b6-19)
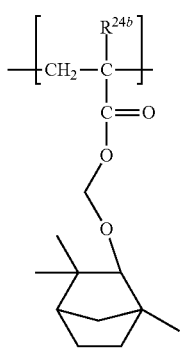
(b6-20)
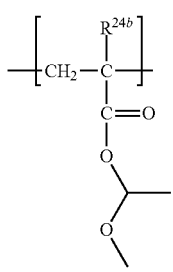
(b6-21)
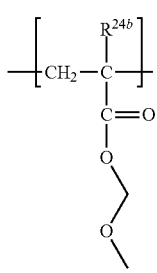
(b6-22)
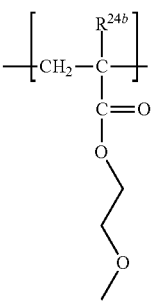
(b6-23)
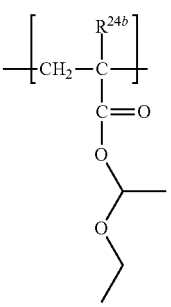
(b6-24)
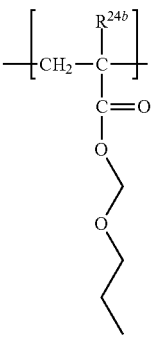
(b6-25)
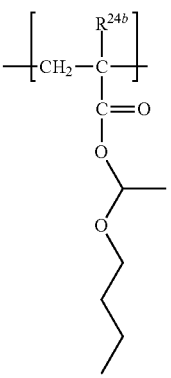
(b6-26)
In the above formulae (b6-1) to (b6-26), $R^{24b}$, presents a hydrogen atom or a methyl group.
Preferable specific examples of the structural unit represented by the above formula (b7) include those represented by the following formulae (b7-1) to (b7-15).

[Chem. 34]
(b7-1) 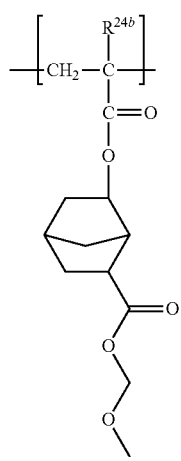
(b7-2)
(b7-3) 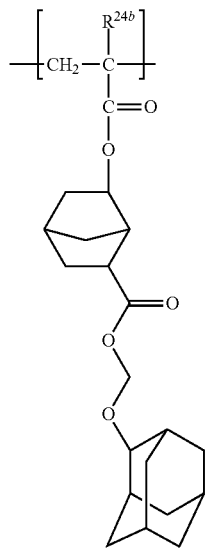
(b7-4) 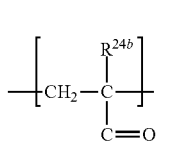 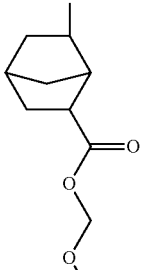
(b7-5) 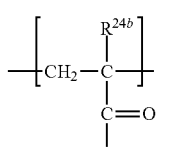 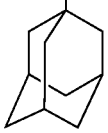

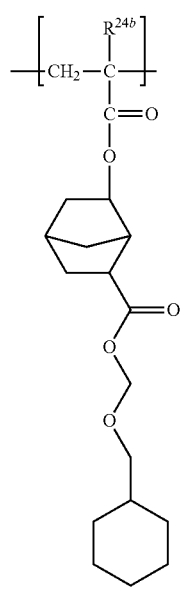 (b7-6)
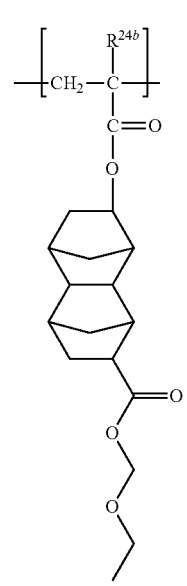 (b7-8)
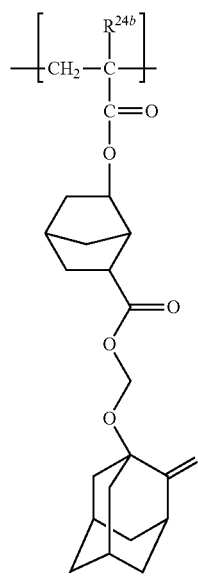 (b7-7)
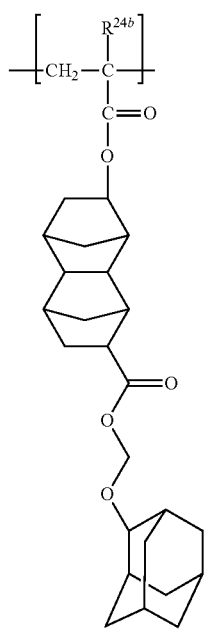 (b7-9)

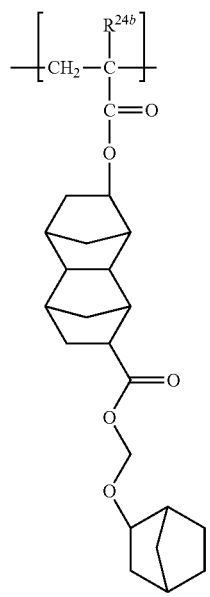
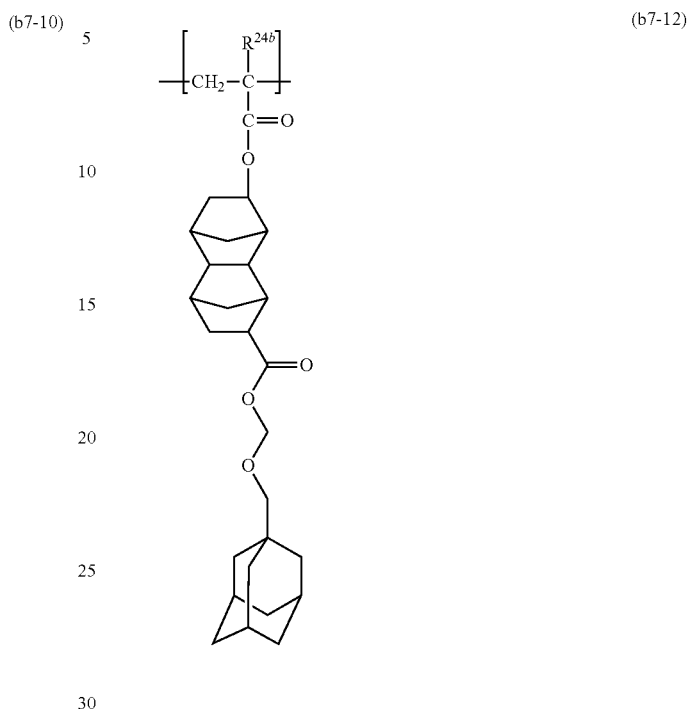
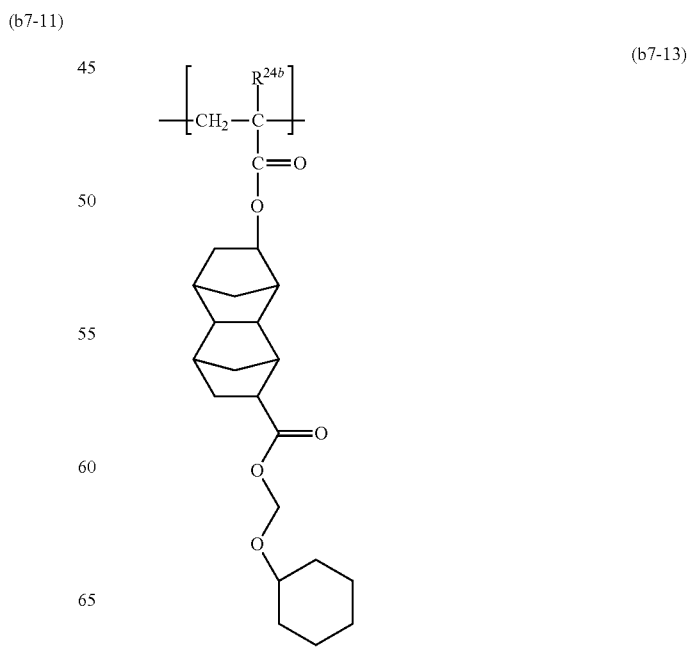

-continued

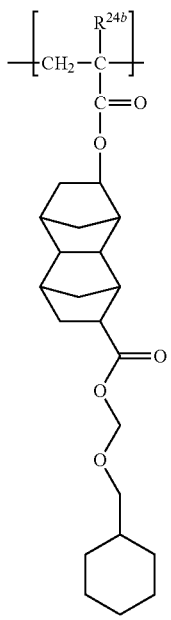
(b7-14)

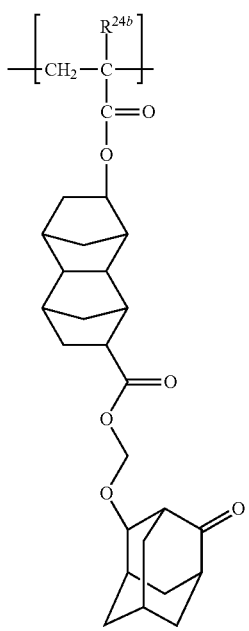
(b7-15)

In the above formula (b7-1) to (b7-15), $R^{24b}$, resents a hydrogen atom or a methyl group.

Since synthesis is easily performed and high sensitivity is relatively easily achieved, among the structural units represented by formulae (b5) to (b7) described above, the structural unit represented by formula (b6) is preferable. In the structural unit represented by formula (b6), $Y^b$ is preferably an alkyl group, and one or both of $R^{19b}$ and $R^{20b}$ are preferably an alkyl group. The above structural units having the acid dissociation group may be used singly or two or more types may be combined and used. The content ratio (the total content ratio when a plurality of types are contained) of the above structural units having the acid dissociation group in the acrylic resin (B3) is preferably 5% by mass or more and 60% by mass or less, is more preferably 10% by mass or more and 55% by mass or less and is particularly preferably 15% by mass or more and 50% by mass or less.

It is also preferable that the acrylic resin (B3) is formed of a copolymer including the structural units represented by formulae (b5) to (b7) described above and a structural unit derived from a polymerizable compound having an ether bond.

Illustrative examples of the polymerizable compound having an ether linkage include radical polymerizable compounds such as (meth)acrylic acid derivatives having an ether linkage and an ester linkage. Specific examples thereof include 2-methoxyethyl (meth)acrylate, 2-ethoxyethyl (meth)acrylate, methoxytriethylene glycol (meth) acrylate, 3-methoxybutyl (meth) acrylate, ethylcarbitol (meth) acrylate, phenoxypolyethylene glycol (meth) acrylate, methoxypolyethylene glycol (meth)acrylate, methoxypolypropylene glycol (meth)acrylate, tetrahydrofurfuryl (meth)acrylate, and the like. Also, the polymerizable compound having an ether linkage is preferably 2-methoxyethyl (meth)acrylate, 2-ethoxyethyl (meth)acrylate, or methoxytriethylene glycol (meth)acrylate. These polymerizable compounds may be used alone or in combinations of two or more thereof.

Furthermore, the acrylic resin (B3) may include another polymerizable compound as a structural unit in order to moderately control physical and chemical properties. The polymerizable compound is exemplified by conventional radical polymerizable compounds and anion polymerizable compounds.

Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth) acrylic acid alkyl esters such as methyl(meth)acrylate, ethyl (meth)acrylate, butyl(meth)acrylate, and cyclohexyl(meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As described above, the acrylic resin (B3) may include the structural unit derived from the polymerizable compound having a carboxyl group such as the monocarboxylic acids or dicarboxylic acids described above. However, since a resist pattern including the non-resist part whose cross-sectional shape is satisfactorily rectangular is easily formed, it is preferable for the acrylic resin (B3) to substantially exclude the structural unit derived from the polymerizable compound having a carboxyl group. Specifically, the ratio of the structural unit derived from the polymerizable compound having a carboxyl group in the acrylic resin (B3) is preferably 20% by mass or less, is more preferably 15% by mass or less and is particularly preferably 5% by mass or less. In the acrylic resin (B3), an acrylic resin which includes a relatively large amount of structural unit derived from the polymerizable compound having a carboxyl group preferably includes a small amount of structural unit derived from the polymerizable compound having a carboxyl group or an acrylic resin which does not include the structural unit is preferably used together.

Furthermore, examples of the polymerizable compound include (meth)acrylic acid esters having a non-acid-dissociable aliphatic polycyclic group and vinyl group-containing aromatic compounds. As the non-acid-dissociable aliphatic polycyclic group, in particular, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 or more and 5 or less carbon atoms as a substituent.

Specific examples of the (meth)acrylic acid esters having a non-acid-dissociable aliphatic polycyclic group include compounds having structures represented by the following formulae (b8-1) to (b8-5).

[Chem. 35]

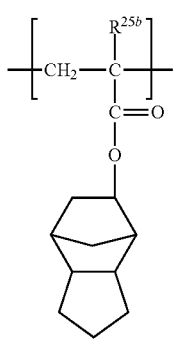
(b8-1)

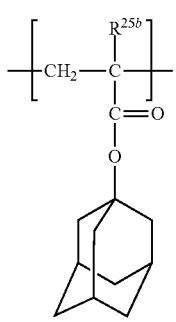
(b8-2)

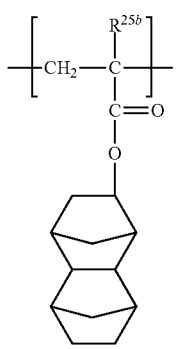
(b8-3)

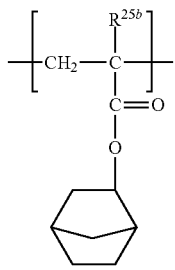
(b8-4)

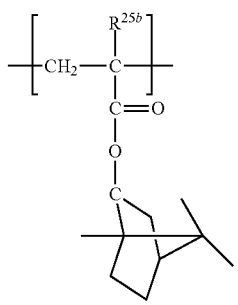
(b8-5)

In formulae (b8-1) to (b8-5), $R^{25b}$ represents a hydrogen atom or a methyl group.

When the acrylic resin (B3) includes the structural unit (b-3) which includes the —$SO_2$— containing cyclic group or the lactone-containing cyclic group, the content of the structural unit (b-3) in the acrylic resin (B3) is preferably 5% by mass or more, is more preferably 10% by mass or more, is particularly preferably 10% by mass or more and 50% by mass or less and is most preferably 10% by mass or more and 30% by mass or less. When the photosensitive resin composition includes the amount of structural unit (b-3) within the above range, both satisfactory developability and a satisfactory pattern shape are easily achieved.

The acrylic resin (B3) preferably includes 5% of the structural units represented by formulae (b5) to (b7) described above by mass or more, more preferably includes 10% thereof by mass or more and particularly preferably includes 10% thereof by mass or more and 50% thereof by mass or less.

The acrylic resin (B3) preferably includes the structural unit derived from the polymerizable compound having an ether bond described above. The content of the structural unit derived from the polymerizable compound having an ether bond in the acrylic resin (B3) is preferably 0% by mass or more and 50% by mass or less, and is more preferably 5% by mass or more and 30% by mass or less.

The acrylic resin (B3) preferably includes the structural unit derived from the (meth)acrylic acid esters having the non-acid-dissociable aliphatic polycyclic group described above. The content of the structural unit derived from the (meth)acrylic acid esters having the non-acid-dissociable aliphatic polycyclic group in the acrylic resin (B3) is preferably 0% by mass or more and 50% by mass or less, and is more preferably 5% by mass or more and 30% by mass or less.

As long as the photosensitive resin composition contains a predetermined amount of acrylic resin (B3), the acrylic resins other than the acrylic resin (B3) described above can also be used as the resin (B). The acrylic resins other than the acrylic resin (B3) as described above are not particularly limited as long as they include the structural units represented by formulae (b5) to (b7) described above.

The polystyrene equivalent mass average molecular weight of the resin (B) described above is preferably 10,000 or more and 600,000 or less, is more preferably 20,000 or more and 400,000 or less and is further preferably 30,000 or more and 300,000 or less. By the setting of the mass average molecular weight described above, it is possible to hold sufficient strength of the photosensitive resin layer without lowering separation from a substrate and to further prevent the swelling of a profile at the time of plating and the occurrence of a crack.

The dispersivity of the resin (B) is preferably 1.05 or more. Here, the dispersivity refers to a value which is obtained by dividing a mass average molecular weight by a number average molecular weight. The dispersivity in the range described above is set, and thus it is possible to achieve desired stress resistance on plating and to avoid a problem in which a metal layer resulting from plating processing easily swells.

The content of the resin (B) with respect to the total solid content of the photosensitive resin composition is preferably 5% by mass or more and 98% by mass or less, is more preferably 10% by mass or more and 97% by mass or less, is more preferably 20% by mass or more and 96% by mass or less and is particularly preferably 25% by mass or more and 60% by mass or less.

<Lewis Acid Compound (C)>

The photosensitive resin composition contains the Lewis acid compound (C). The photosensitive resin composition includes the Lewis acid compound (C), and thus it is possible to easily obtain a highly sensitive photosensitive resin composition and to use the photosensitive resin composition so as to easily form a resist pattern whose cross-sectional shape is rectangular. In a case where the photosensitive resin composition is used to form a pattern, when a required time in each step at the time of the formation of the pattern and a required time between the individual steps are long, adverse effects may occur in which it is difficult to form a pattern having a desired shape and dimensions and in which developability is degraded. However, the Lewis acid compound (C) is mixed with the photosensitive resin composition, and thus it is possible to reduce the adverse effects on the shape of the pattern and the developability as described above, with the result that a process margin can be widened.

Here, the Lewis acid compound (C) means a "compound which has an empty orbit capable of receiving at least one electron pair and which achieves the action of an electron pair receptor". The Lewis acid compound (C) is not particularly limited as long as the compound applies to the definition described above and is recognized as a Lewis acid compound by a person skilled in the art. As the Lewis acid compound (C), a compound which does not apply to a Bronsted acid (protonic acid) is preferably used. Specific examples of the Lewis acid compound (C) include boron fluoride, ether complexes of the boron fluorides (for example, $BF_3.Et_2O$, $BF_3.Me_2O$ and $BF_3.THF$ where Et represents an ethyl group, Me represents a methyl group and THF represents tetrahydrofuran), organic boron compounds (for example, tri n-octyl borate, tri n-butyl borate, triphenyl borate and triphenyl boron), titanium chloride, aluminum chloride, aluminum bromide, gallium chloride, gallium bromide, indium chloride, thallium trifluoroacetate, tin chloride, zinc chloride, zinc bromide, zinc iodide, zinc trifluoromethane sulfonate, zinc acetate, zinc nitrate, zinc tetrafluoroborate, manganese chloride, manganese bromide, nickel chloride, nickel bromide, nickel cyanide, nickel acetylacetonate, cadmium chloride, cadmium bromide, stannous chloride, stannous bromide, stannous sulfate, stannous tartrate and the like. Other specific examples of the Lewis acid compound (C) include chlorides, bromides, sulfates, nitrates, carboxylates and trifluoromethanesulfonates of rare earth metal elements, cobalt chloride, ferrous chloride, yttrium chloride and the like. Here, examples of the rare earth metal element include lanthanum, cerium, praseodymium, neodymium, samarium, europium, gadolinium, terbium, dysprosium, holmium, erbium, thulium, ytterbium, lutetium and the like.

The Lewis acid compound (C) preferably includes a Lewis acid compound which includes a group 13 element in the periodic table because it is easily available and an effect caused by the addition thereof is satisfactory. Here, examples of the group 13 element in the periodic table include boron, aluminum, gallium, indium and thallium. Among the group 13 elements in the periodic table described above, boron is preferable because the Lewis acid compound (C) is easily available and an effect caused by the addition thereof is particularly excellent. In other words, the Lewis acid compound (C) preferably includes a Lewis acid compound which includes boron.

Examples of the Lewis acid compound including boron include: boron halides such as boron fluoride, ether complex of boron fluoride, boron chloride and boron bromide; and various organic boron compounds. As the Lewis acid compound including boron, the organic boron compound is preferable because the content ratio of halogen atoms in the Lewis acid compound is low and the photosensitive resin composition is also easily applied to applications in which a low halogen content is required.

Preferred examples of the organic boron compound include a boron compound represented by formula (c1) below:

(in formula (c1), $R^{C1}$ and $R^{C2}$ each independently represent a hydrocarbon group having 1 or more and 20 or less carbon atoms, the hydrocarbon group may include 1 or more substituents, n1 represents an integer of 0 or more and 3 or less, when a plurality of $R^{C1}$s are present, two of the $R^{C1}$s may be bonded to each other to form a ring and when a plurality of $OR^{C2}$s are present, two of the $OR^{C2}$s may be bonded to each other to form a ring.) The photosensitive resin composition preferably includes, as the Lewis acid compound (C), one or more types of boron compound represented by formula (c1) described above.

When in formula (c1), $R^{C1}$ and $R^{C2}$ are hydrocarbon groups, the number of carbon atoms in each of the hydrocarbon groups is 1 or more and 20 or less. The hydrocarbon group in which the number of carbon atoms is 1 or more and 20 or less may be an aliphatic hydrocarbon group, an aromatic hydrocarbon group or a hydrocarbon group formed by combination of an aliphatic group and an aromatic group. As the hydrocarbon group in which the number of carbon atoms is 1 or more and 20 or less, a saturated aliphatic hydrocarbon group or an aromatic hydrocarbon group is preferable. The number of carbon atoms in each of the hydrocarbon groups serving as $R^{C1}$ and $R^{C2}$ is preferably 1 or more and 10 or less. When the hydrocarbon group is an aliphatic hydrocarbon group, the number of carbon atoms therein is preferably 1 or more and 6 or less and is particularly preferably 1 or more and 4 or less. The hydrocarbon groups serving as $R^{C1}$ and $R^{C2}$ may be saturated hydrocarbon groups or unsaturated hydrocarbon groups, and are preferably saturated hydrocarbon groups. When the hydrocarbon groups serving as $R^{C1}$ and $R^{C2}$ are aliphatic hydrocarbon groups, the aliphatic hydrocarbon groups may be linear, branched, cyclic or a combination of structures thereof.

Preferred examples of the aromatic hydrocarbon group include a phenyl group, a naphthalene-1-yl group, a naphthalene-2-yl group, a 4-phenylphenyl group, a 3-phenylphenyl group and a 2-phenylphenyl group. Among them, a phenyl group is preferable.

As the saturated aliphatic hydrocarbon group, an alkyl group is preferable. Preferred specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group and an n-decyl group.

The hydrocarbon groups serving as $R^{C1}$ and $R^{C2}$ each may include one or more substituent. Examples of the substituent include a halogen atom, a hydroxyl group, an alkyl group, an aralkyl group, an alkoxy group, a cycloalkyloxy group, an aryloxy group, an aralkyloxy group, an alkylthio group, a cycloalkylthio group, an arylthio group, an aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N, N-disubstituted amino group, a carbamoyl group (—CO—NH$_2$), an N-monosubstituted carbamoyl group, an N, N-disubstituted carbamoyl group, a nitro group, a cyano group and the like. Although the number of carbon atoms in the substituent is not particularly limited as long as the object of the present invention is not disturbed, the number of carbon atoms is preferably 1 or more and 10 or less and is more preferably 1 or more and 6 or less.

Preferred specific examples of the organic boron compound represented by formula (c1) described above include compounds below. In the following formulae, Pen represents a pentyl group, Hex represents a hexyl group, Hep represents a heptyl group, Oct represents an octyl group, Non represents a nonyl group and Dec represents a decyl group.

[Chem. 36]

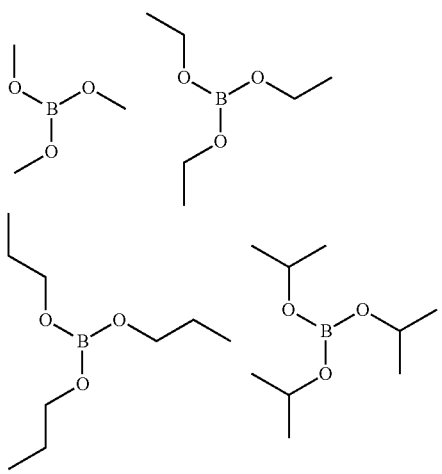
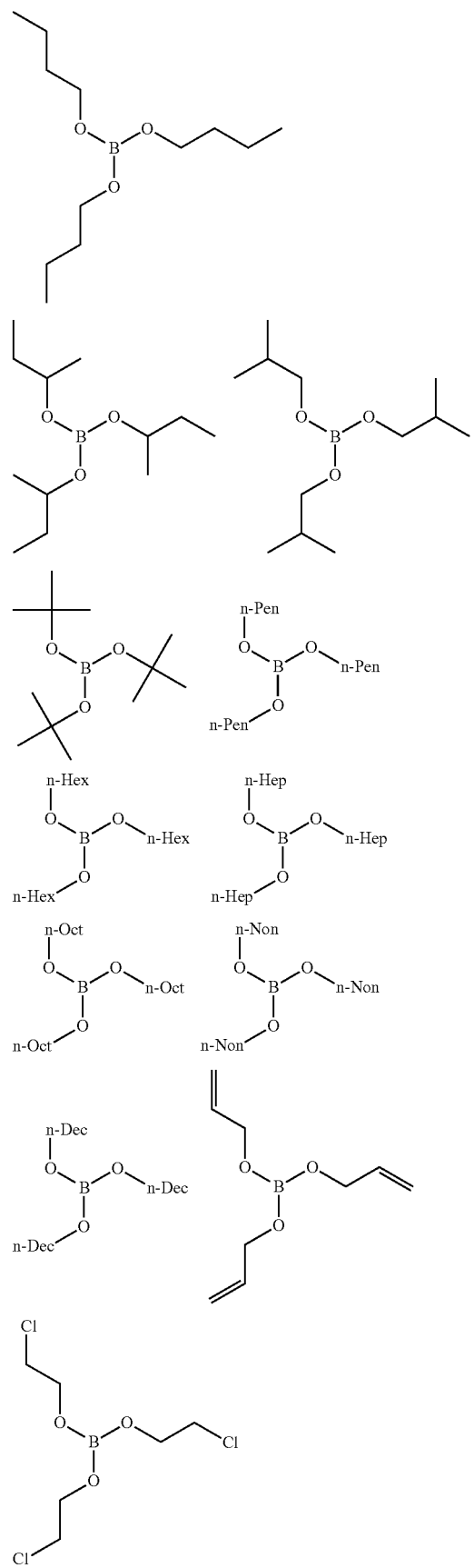

73
-continued
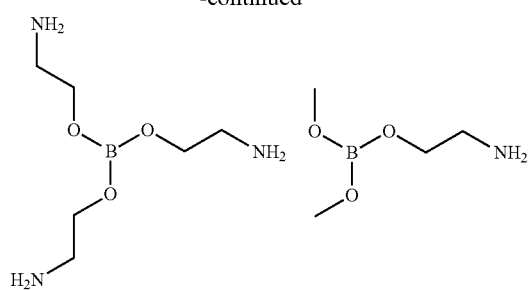
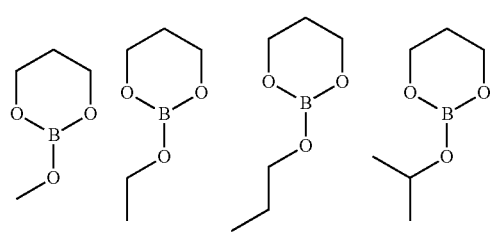
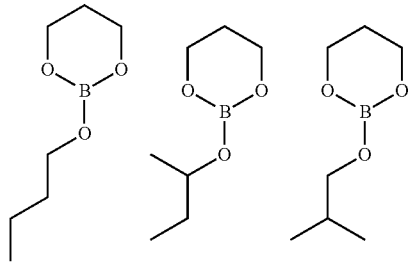
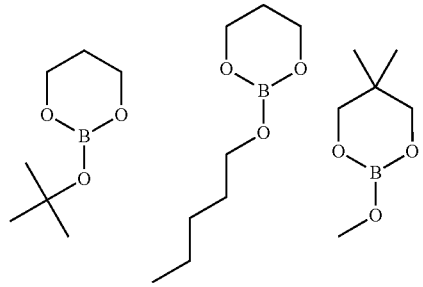
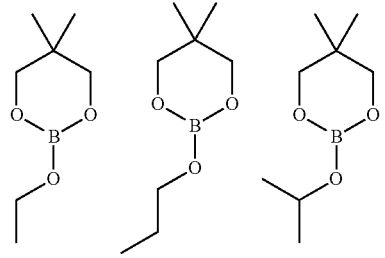
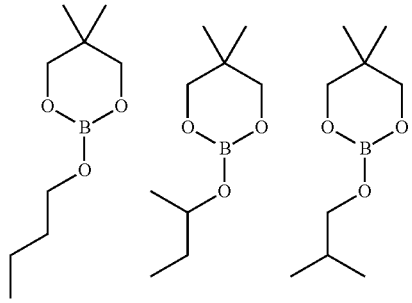
74
-continued
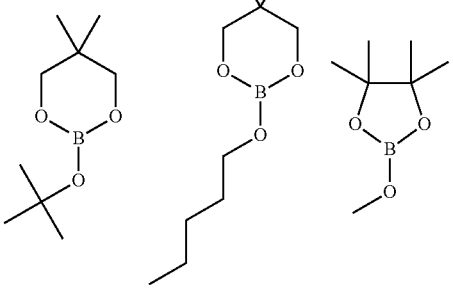
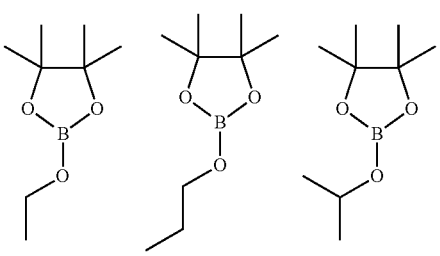
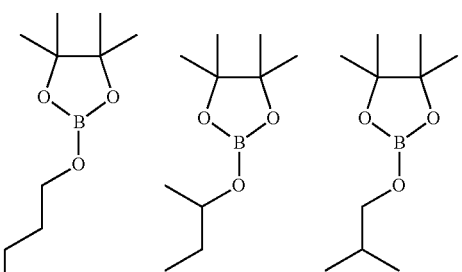
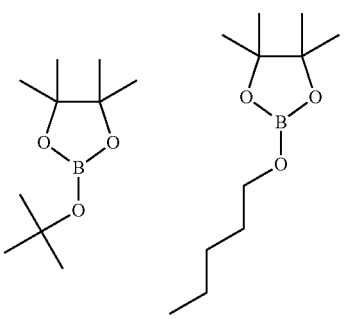
[Chem. 37]
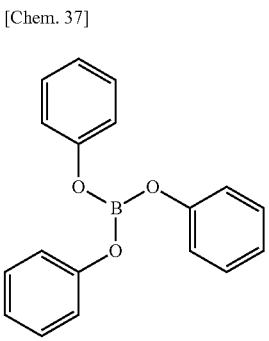

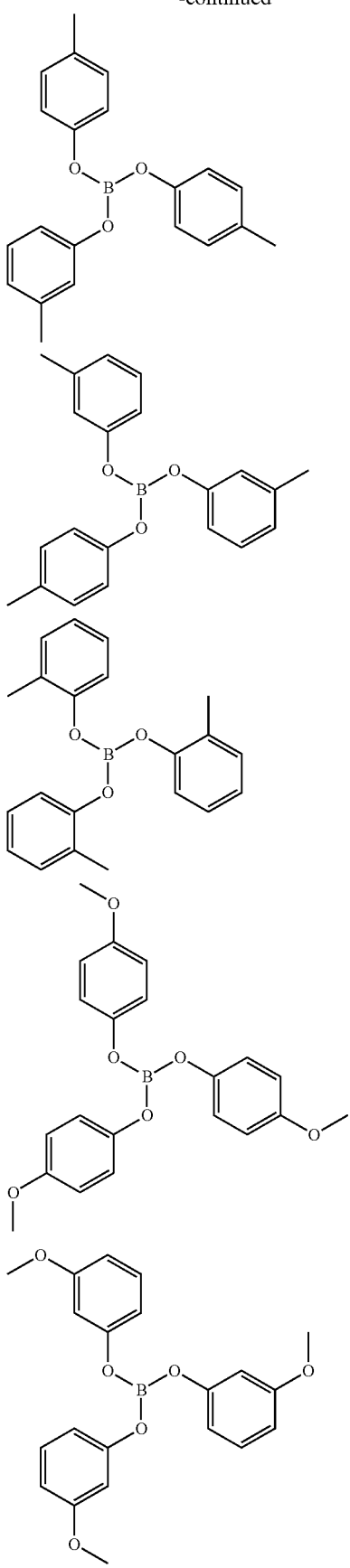
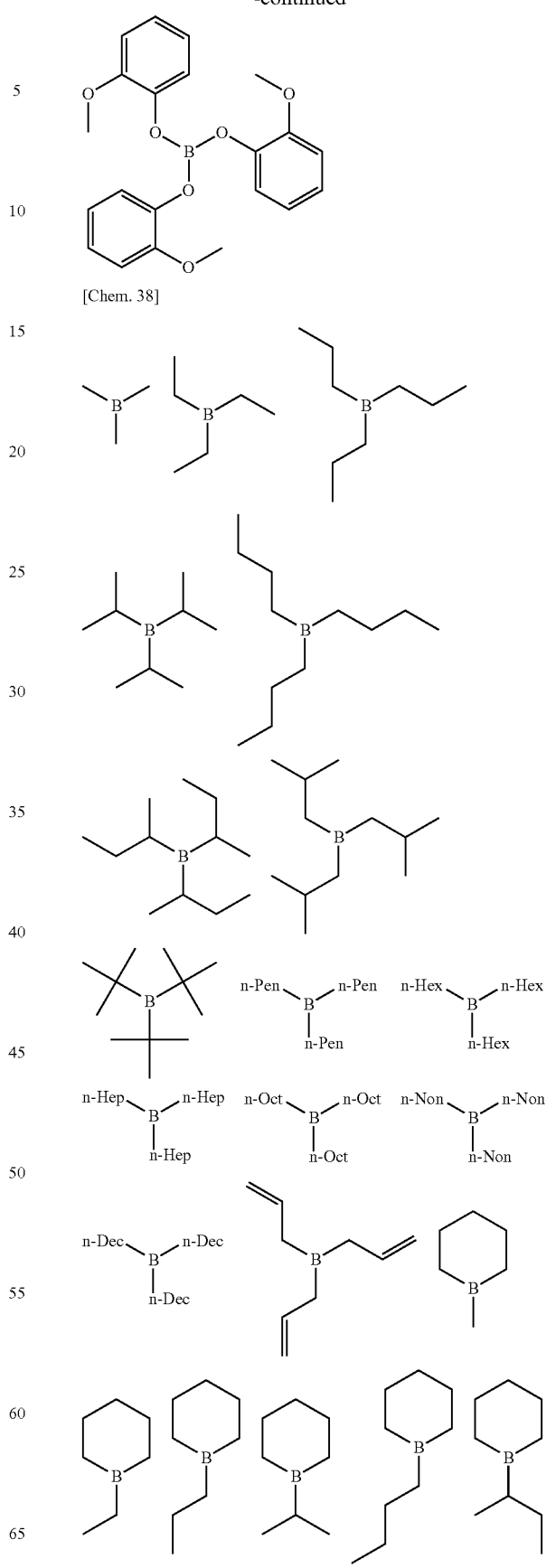
[Chem. 38]

77
-continued
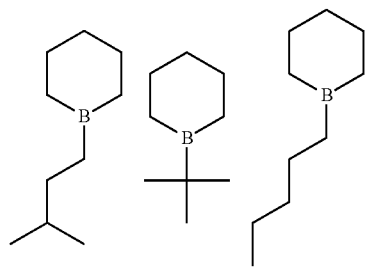
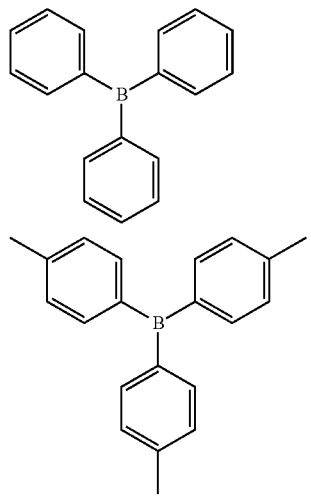
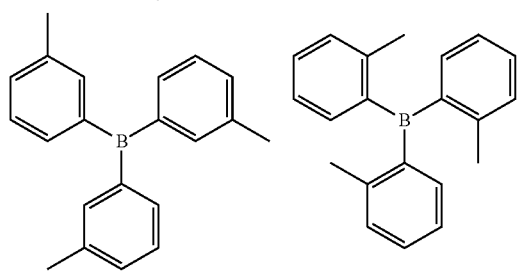
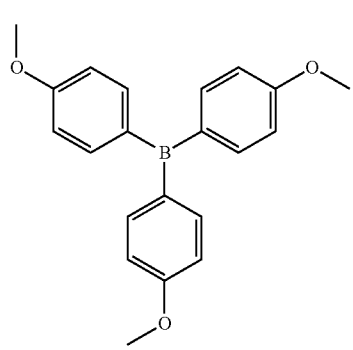
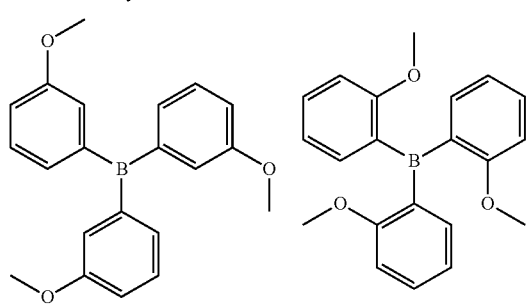
78
-continued
[Chem. 39]
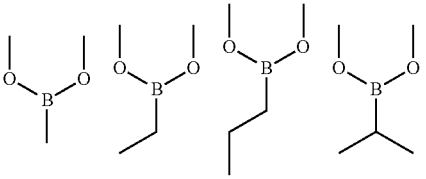
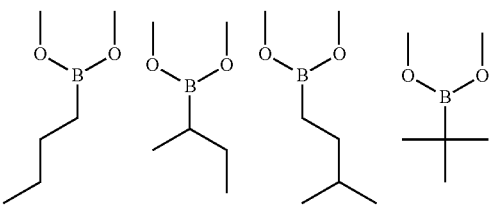
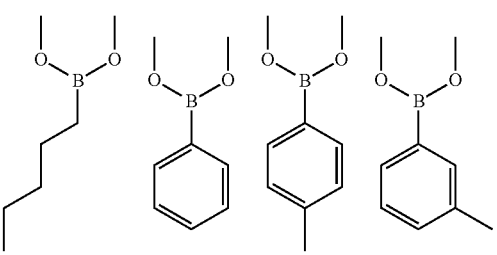
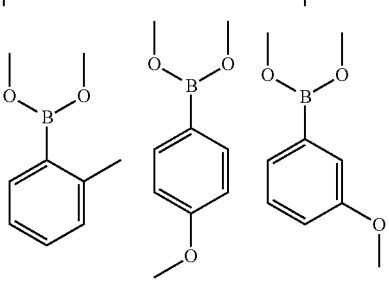
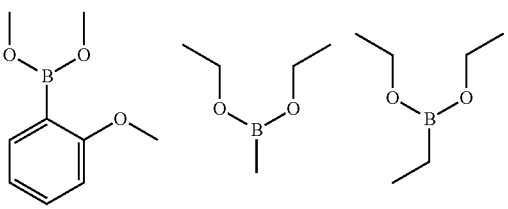

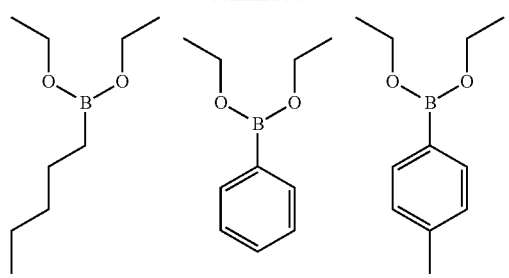
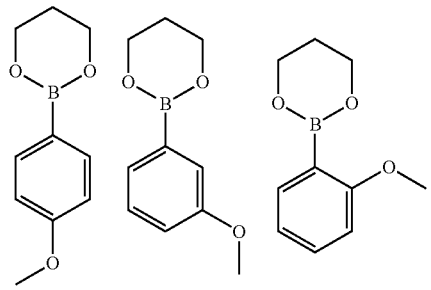
[Chem. 40]
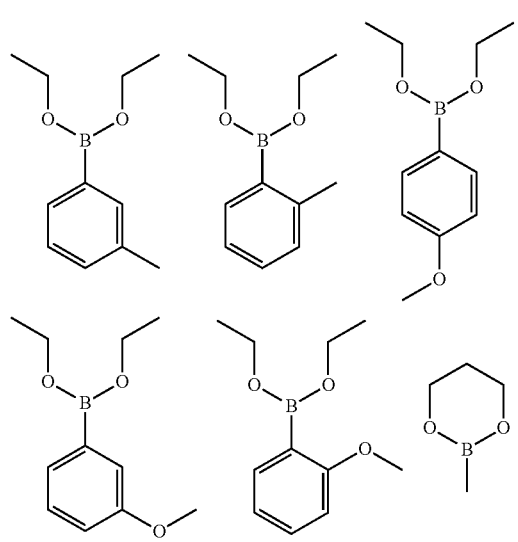
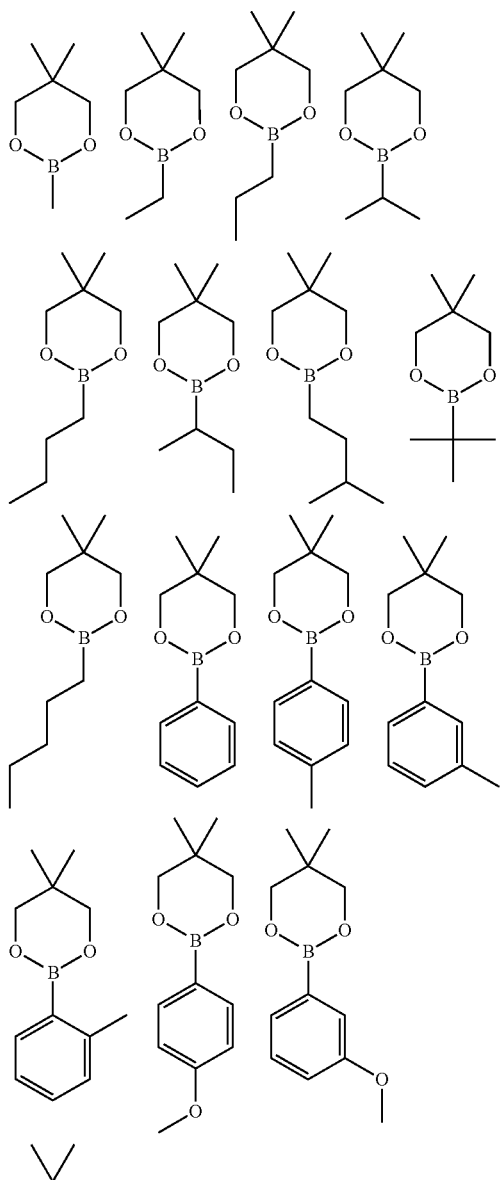
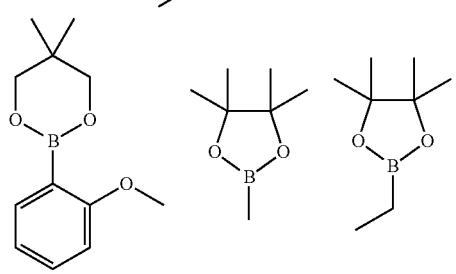

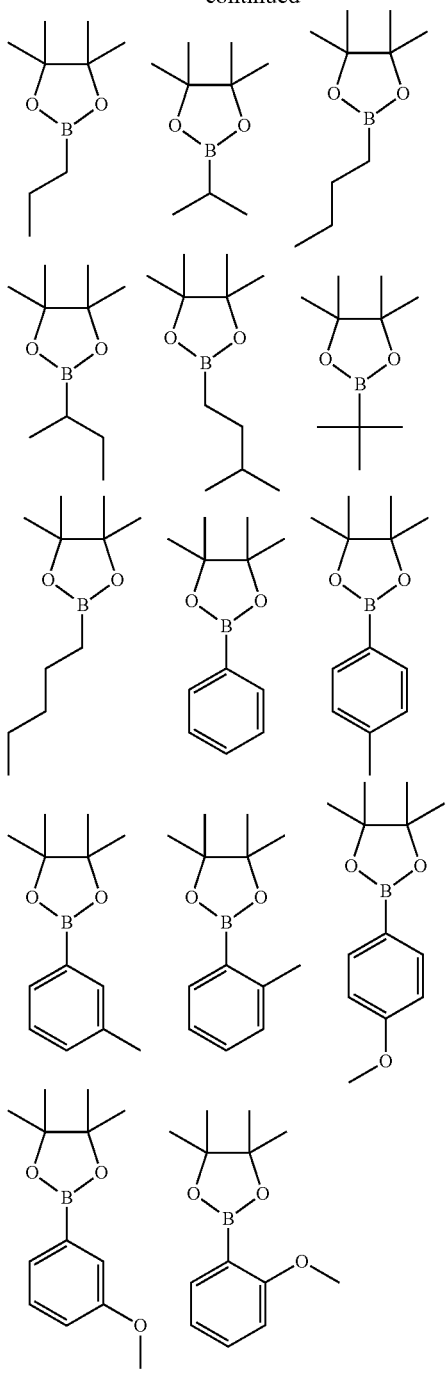

The Lewis acid compound (C) used with respect to the total 100 parts by mass of the resin (B) described above and the alkali soluble resin (D) to be described later is preferably 0.01 parts by mass or more and 5 parts by mass or less, is more preferably 0.01 parts by mass or more and 3 parts by mass or less and is further preferably 0.05 parts by mass or more and 2 parts by mass or less.

<Alkali Soluble Resin (D)>

It is preferable that the photosensitive resin composition further contains an alkali-soluble resin (D) in order to improve crack resistance. The alkali-soluble resin as referred to herein may be determined as follows. A solution of the resin to give a resin concentration of 20% by mass (solvent: propylene glycol monomethyl ether acetate) is used to form a resin film having a film thickness of 1 μm on a substrate, and immersed in a 2.38% by mass aqueous TMAH solution for 1 min. If the resin was dissolved in an amount of no less than 0.01 μm, the resin is defined to be alkali soluble. The alkali-soluble resin (D) is preferably at least one selected from the group consisting of novolak resin (D1), polyhydroxystyrene resin (D2) and acrylic resin (D3).

[Novolak Resin (D1)]

The novolak resin may be prepared by addition condensation between, for example, aromatic compounds having a phenolic hydroxyl group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the aldehydes include formaldehyde, furfural, benzaldehyde, nitrobenzaldehyde, acetaldehyde, and the like. Although the catalyst used in the addition condensation reaction is not particularly limited, for example, for an acid catalyst, hydrochloric acid, nitric acid, sulfuric acid, formic acid, oxalic acid, acetic acid and the like are used.

The flexibility of the novolak resins can be enhanced still more when o-cresol is used, a hydrogen atom of a hydroxide group in the resins is substituted with other substituents, or bulky aldehydes are used.

Although the mass average molecular weight of the novolak resin (D1) is not particularly limited as long as the object of the present invention is not disturbed, the mass average molecular weight is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Furthermore, the polyhydroxystyrene resin (D2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

Although the mass average molecular weight of the polyhydroxystyrene resin (D2) is not particularly limited as long as the object of the present invention is not disturbed, the mass average molecular weight is preferably 1,000 or more and 50,000 or less.

[Acrylic Resin (D3)]

It is preferable that the acrylic resin (D3) includes a structural unit induced from a polymerizable compound having an ether linkage, and a structural unit induced from a polymerizable compound having a carboxy group.

Examples of the polymerizable compound having an ether linkage can include (meth)acrylic acid derivatives having an ether linkage and an ester linkage such as 2-methoxyethyl (meth)acrylate, methoxytriethylene glycol (meth)acrylate, 3-methoxybutyl (meth) acrylate, ethylcarbitol (meth) acrylate, phenoxypolyethylene glycol (meth) acrylate, methoxypolypropylene glycol (meth) acrylate, tetrahydrofurfuryl (meth)acrylate, and the like. The polymerizable compound having an ether linkage is preferably, 2-methoxyethyl acrylate, or methoxytriethylene glycol acrylate. These polymerizable compounds may be used alone, or in combinations of two or more.

Examples of the polymerizable compound having a carboxyl group can include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

Although the mass average molecular weight of the acrylic resin (D3) is not particularly limited as long as the object of the present invention is not disturbed, the mass average molecular weight is preferably 50,000 or more and 800,000 or less.

When the total of the resin (B) described above and the alkali soluble resin (D) is 100 parts by mass, the content of the alkali-soluble resin (D) is preferably 0 parts by mass or more and 80 parts by mass or less, and is more preferably 0 parts by mass or more and 60 parts by mass or less. The content of the alkali soluble resin (D) is set within the range described above, and thus there is a tendency to enhance crack resistance and to prevent a reduction in a film at the time of development.

<Sulfur-Containing Compound (E)>

When the photosensitive resin composition is used for the formation of a pattern on a metal substrate, the photosensitive resin composition preferably includes the sulfur-containing compound (E). The sulfur-containing compound (E) is a compound which includes a sulfur atom capable of coordinating metal. With respect to a compound which can generate two or more tautomers, when at least one tautomer includes a sulfur atom which coordinates a metal forming a metal layer, this compound applies to the sulfur-containing compound. When on a surface made of a metal such as Cu, a resist pattern which is used as a template for plating is formed, a failure such as fitting in a cross-sectional shape easily occurs. However, in a case where the photosensitive resin composition includes the sulfur-containing compound (E), even when a resist pattern is formed on a surface made of a metal in a substrate, the occurrence of a failure such as fitting in a cross-sectional shape is easily reduced. When the photosensitive resin composition is used for the formation of a pattern on a substrate other than a metal substrate, the photosensitive resin composition does not particularly need a sulfur-containing compound. When the photosensitive resin composition is used for the formation of a pattern on a substrate other than a metal substrate, the photosensitive resin composition is preferably prevented from including the sulfur-containing compound (E), for example, because the number of components of the photosensitive resin composition is reduced such that it is easy to manufacture the photosensitive resin composition and that the manufacturing cost of the photosensitive resin composition can be reduced. There is no particular failure which is caused by the inclusion of the sulfur-containing compound (E) in the photosensitive resin composition used for the formation of a pattern on a substrate other than a metal substrate.

A sulfur atom capable of coordinating metal is included in the sulfur-containing compound as, for example, a mercapto group (—SH), a thiocarboxy group (—CO—SH), a dithiocarboxy group (—CS—SH) or a thiocarbonyl group (—CS—). The sulfur-containing compound preferably includes a mercapto group because it easily coordinates metal and is excellent in the effect of reducing fitting.

Preferred examples of the sulfur-containing compound including a mercapto group include a compound represented by formula (e1) below.

[Chem. 41]

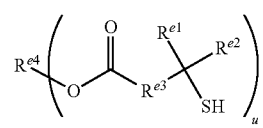

(e1)

(where $R^{e1}$ and $R^{e2}$ each independently represent a hydrogen atom or an alkyl group, $R^{e3}$ represents a single bond or an alkylene group, $R^{e4}$ represents a u-valent aliphatic group which may include an atom other than carbon and u represents an integer of 2 or more and 4 or less.)

When $R^{e1}$ and $R^{e2}$ are an alkyl group, the allyl group may be linear or branched and is preferably linear. When $R^{e1}$ and $R^{e2}$ are an alkyl group, the number of carbon atoms in the allyl group is not particularly limited as long as the object of the present invention is not disturbed. The number of carbon atoms in the allyl group is preferably 1 or more and 4 or less, is particularly preferably 1 or 2 and is most preferably 1. As the combination of $R^{e1}$ and $R^{e2}$, it is preferable that one be a hydrogen atom and that the other be an alkyl group, and it is particularly preferable that one be a hydrogen atom and that the other be a methyl group.

When $R^{e3}$ is an alkylene group, the alkylene group may be linear or branched and is preferably linear. When $R^{e3}$ is an alkylene group, the number of carbon atoms in the allylene group is not particularly limited as long as the object of the present invention is not disturbed. The number of carbon atoms in the allylene group is preferably 1 or more and 10 or less, is more preferably 1 or more and 5 or less, is particularly preferably 1 or 2 and is most preferably 1.

$R^{e4}$ is a bivalent to tetravalent aliphatic group which may include an atom other than carbon. Examples of the atom other than carbon which may be included in $R^{e4}$ include a nitrogen atom, an oxygen atom, a sulfur atom, a fluorine atom, a chlorine atom, a bromine atom, an iodine atom and the like. The structure of the aliphatic group of $R^{e4}$ may be linear, branched, cyclic or a combination of structures thereof.

Among compounds represented by formula (e1), a compound represented by formula (e2) below is more preferable.

[Chem. 42]

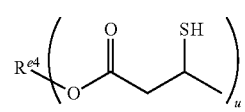

(e2)

(in formula (e2), $R^{e4}$ and u have the same meanings as in formula (e1).)

Among compounds represented by formula (e2) described above, compounds below are preferable.

[Chem. 43]

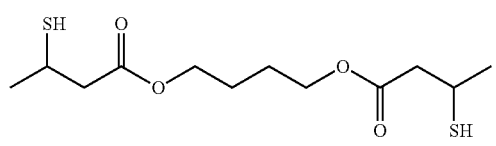

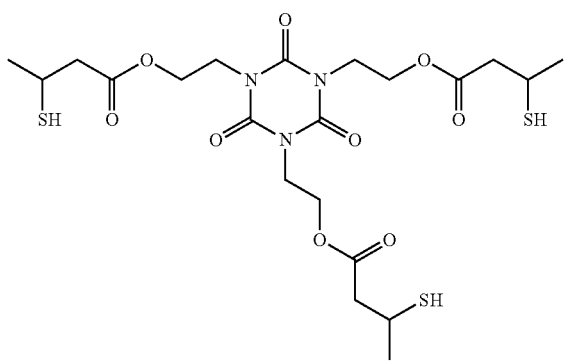

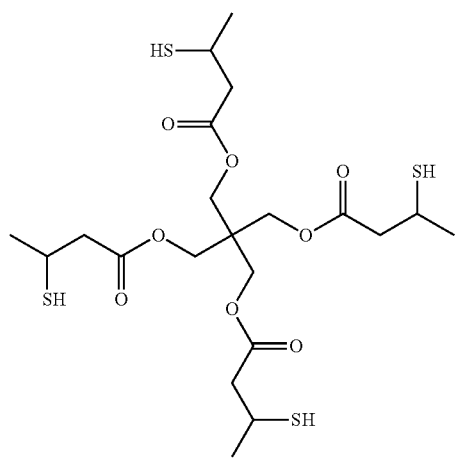

Preferred examples of the sulfur-containing compound including a mercapto group include compounds represented by formulae (e3-L1) to (e3-L7) below.

[Chem. 44]

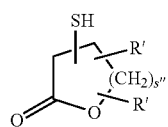 (e3-L1)

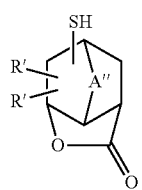 (e3-L2)

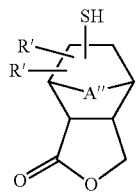 (e3-L3)

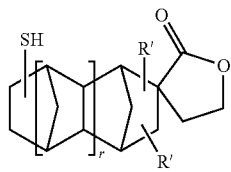 (e3-L4)

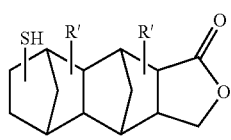 (e3-L5)

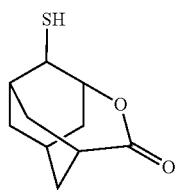 (e3-L6)

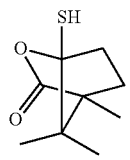 (e3-L7)

(in formulae (e3-L1) to (e3-L7), R', s", A" and r represent the same ones in formulae (b-L1) to (b-L7) which previously describes the acrylic resin (B3).)

Preferred specific examples of mercapto compounds represented by formulae (e3-L1) to (e3-L7) described above include compounds below.

[Chem. 45]

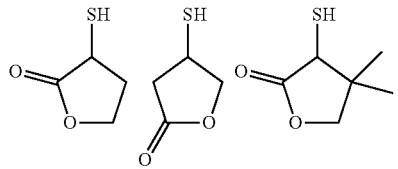

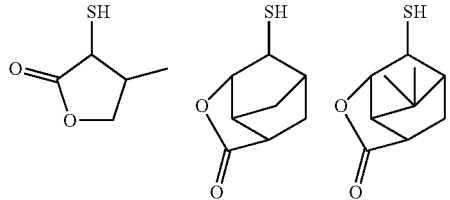

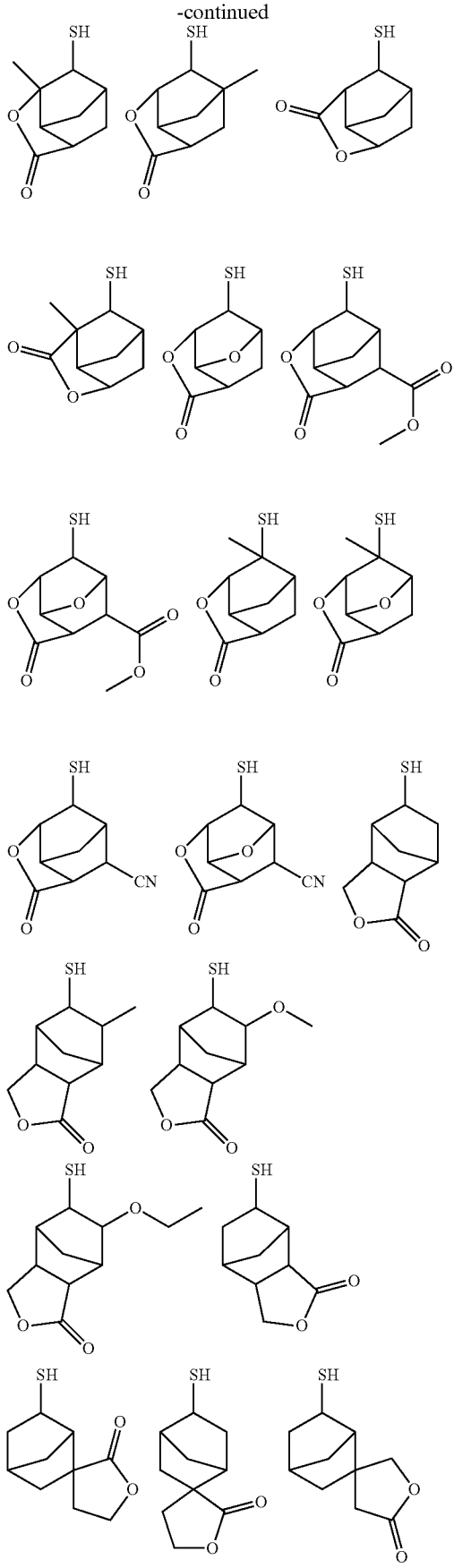
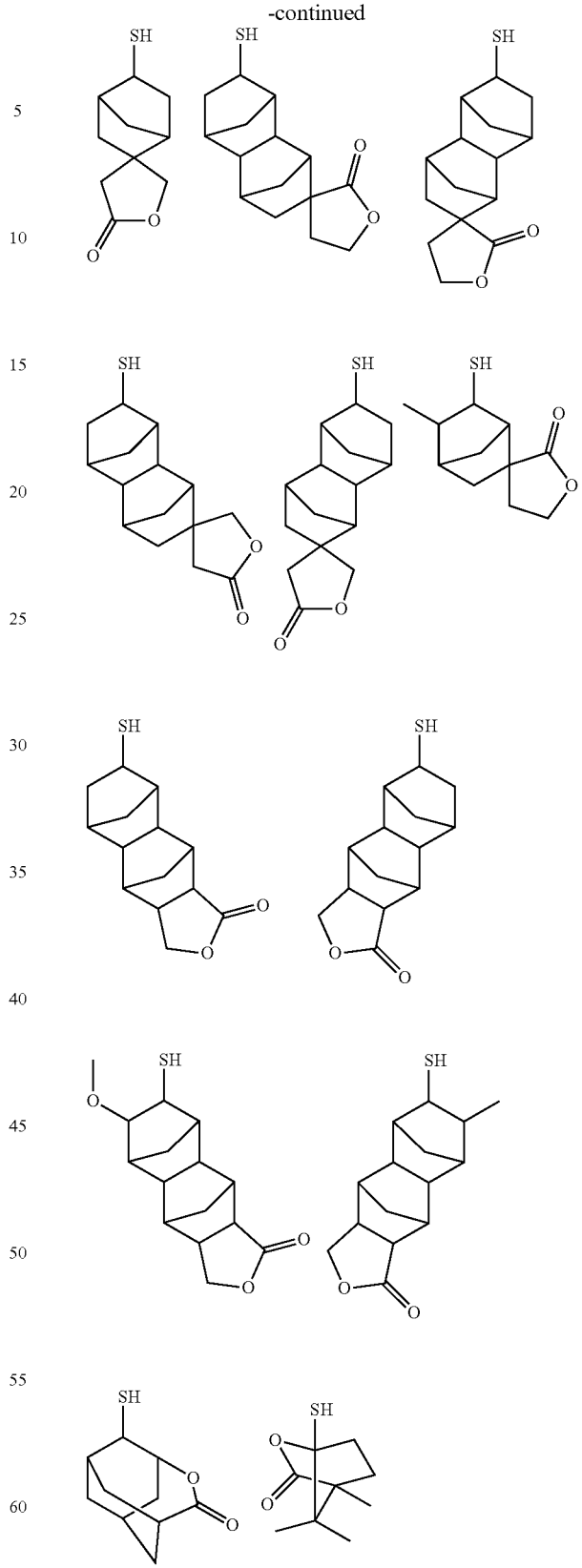
Preferred examples of the sulfur-containing compound including a mercapto group include compounds represented by formulae (e3-1) to (e3-4) below.

[Chem. 46]
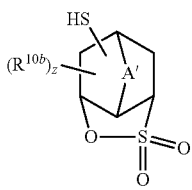 (e3-1)
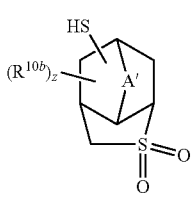 (e3-2)
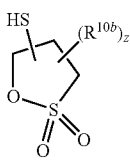 (e3-3)
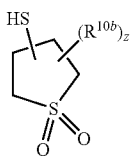 (e3-4)
(where the definitions of symbols in formulae (e3-1) to (e3-4) are the same as described in formulae (3-1) to (3-4) which previously describes the acrylic resin (B3).)
Preferred specific examples of mercapto compounds represented by formulae (e3-1) to (e3-4) described above include compounds below.
[Chem. 47]
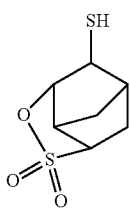 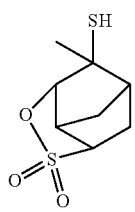 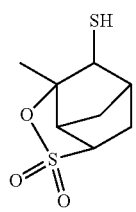
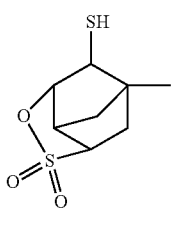 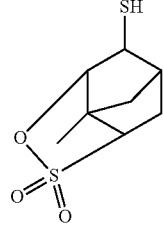
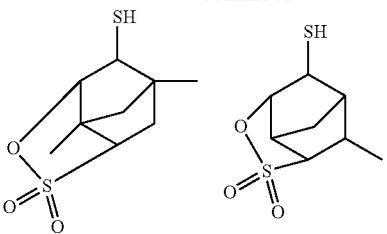
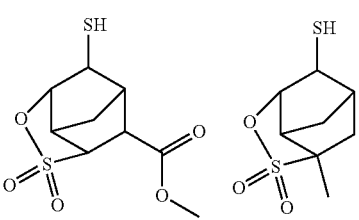
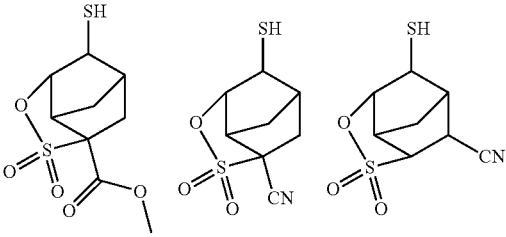
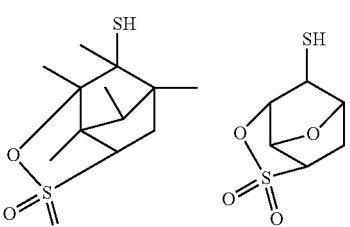
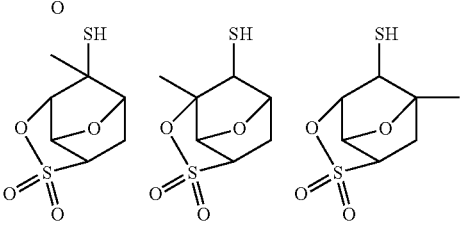
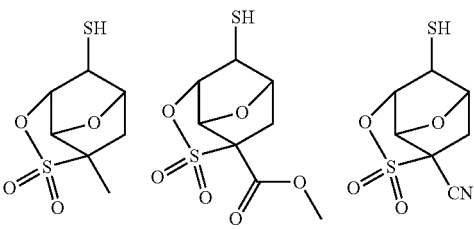
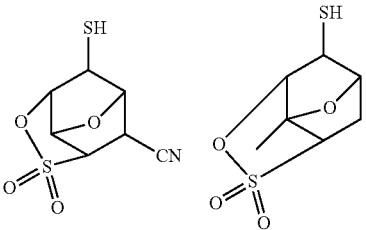
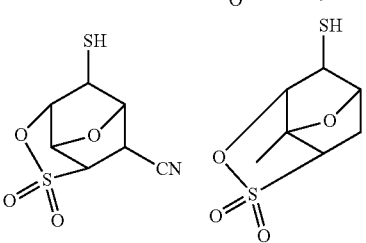

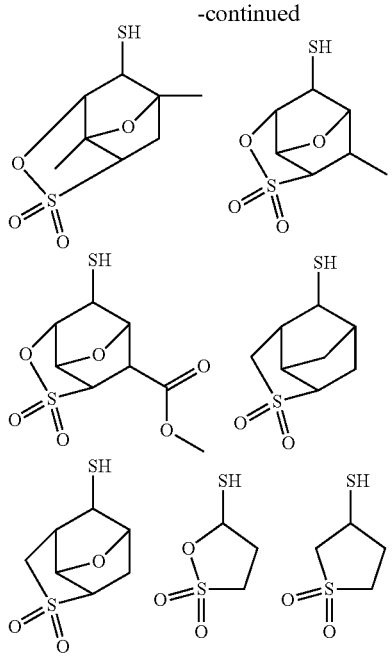

Preferred examples of the compound including a mercapto group include a compound represented by formula (e4) below.

[Chem. 48]

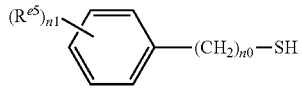

(e4)

(in formula (e4), $R^{e5}$ represents a hydroxyl group, an alkyl group having 1 or more and 4 or less carbon atoms, an alkoxy group having 1 or more and 4 or less carbon atoms, an alkylthio group having 1 or more and 4 or less carbon atoms, a hydroxyalkyl group having 1 or more and 4 or less carbon atoms, a mercaptoalkyl group having 1 or more and 4 or less carbon atoms, a halogenated alkyl group having 1 or more and 4 or less carbon atoms and a group selected from the group consisting of halogen atoms, and when n1 is an integer of 0 or more and 3 or less, n0 is an integer of 0 or more and 3 or less and n1 is 2 or 3, $R^{e5}$s may be identical to or different from each other.)

Specific examples when $R^{e5}$ is an alkyl group which may include a hydroxyl group having 1 or more and 4 or less carbon atoms include a methyl group, an ethyl group, an n-propyl group, an isopropyl group, an n-butyl group, an isobutyl group, a sec-butyl group and a tert-butyl group. Among these alkyl groups, a methyl group, a hydroxymethyl group and an ethyl group are preferable.

Specific examples when $R^{e5}$ is an alkoxy group having 1 or more and 4 or less carbon atoms include a methoxy group, an ethoxy group, an n-propyloxy group, an isopropyloxy group, an n-butyloxy group, an isobutyloxy group, a sec-butyloxy group and a tert-butyloxy group. Among these alkoxy groups, a methoxy group and an ethoxy group are preferable, and a methoxy group is more preferable.

Specific examples when $R^{e5}$ is an alkylthio group having 1 or more and 4 or less carbon atoms include a methylthio group, an ethylthio group, an n-propylthio group, an isopropylthio group, an n-butylthio group, an isobutylthio group, a sec-butylthio group and a tert-butylthio group. Among these alkylthio groups, a methylthio group and an ethylthio group are preferable, and a methylthio group is more preferable.

Specific examples when $R^{e5}$ is a hydroxyalkyl group having 1 or more and 4 or less carbon atoms include a hydroxymethyl group, a 2-hydroxyethyl group, a 1-hydroxyethyl group, a 3-hydroxy-n-propyl group, a 4-hydroxy-n-butyl group and the like. Among these hydroxyalkyl groups, a hydroxymethyl group, a 2-hydroxyethyl group and a 1-hydroxyethyl group are preferable, and a hydroxymethyl group is more preferable.

Specific examples when $R^{e5}$ is a mercaptoalkyl group having 1 or more and 4 or less carbon atoms include a mercaptomethyl group, a 2-mercaptoethyl group, a 1-mercaptoethyl group, a 3-mercapto-n-propyl group, a 4-mercapto-n-butyl group and the like. Among these mercaptoalkyl groups, a mercaptomethyl group, a 2-mercaptoethyl group and a 1-mercaptoethyl group are preferable, and a mercaptomethyl group is more preferable.

When $R^{e5}$ is a halogenated alkyl group having 1 or more and 4 or less carbon atoms, examples of the halogen atom included in the halogenated alkyl group include fluorine, chlorine, bromine, iodine and the like. Specific examples when $R^{e5}$ is a halogenated alkyl group having 1 or more and 4 or less carbon atoms include a chloromethyl group, a bromomethyl group, an iodomethyl group, a fluoromethyl group, a dichloromethyl group, a dibromomethyl group, a difluoromethyl group, a trichloromethyl group, a tribromomethyl group, a trifluoromethyl group, a 2-chloroethyl group, a 2-bromoethyl group, a 2-fluoroethyl group, a 1,2-dichloroethyl group, a 2,2-difluoroethyl group, a 1-chloro-2-fluoroethyl group, a 3-chloro-n-propyl group, a 3-bromo-n-propyl group, a 3-fluoro-n-propyl group, a 4-chloro-n-butyl group and the like. Among these halogenated alkyl groups, a chloromethyl group, a bromomethyl group, an iodomethyl group, a fluoromethyl group, a dichloromethyl group, a dibromomethyl group, a difluoromethyl group, a trichloromethyl group, a tribromomethyl group and a trifluoromethyl group are preferable, and a chloromethyl group, a dichloromethyl group, a trichloromethyl group and a trifluoromethyl group are more preferable.

Specific examples when $R^{e5}$ is a halogen atom include fluorine, chlorine, bromine and iodine.

In formula (e4), n1 is an integer of 0 or more and 3 or less, and is more preferably 1. When n1 is 2 or 3, a plurality of $R^{e5}$s may be identical to or different from each other.

In the compound represented by formula (e4), the substitution position of $R^{e5}$ on a benzene ring is not particularly limited. The substitution position of $R^{e5}$ on the benzene ring is preferably a meta position or a para position with respect to the bonding position of $—(CH_2)_{n0}—SH$.

As the compound represented by formula (e4), a compound is preferable which includes, as $R^{e5}$, at least one group selected from the group consisting of an alkyl group, a hydroxyalkyl group and a mercaptoalkyl group, and a compound is more preferable which includes, as $R^{e5}$, one group selected from the group consisting of an alkyl group, a hydroxyalkyl group and a mercaptoalkyl group. When the compound represented by formula (e4) includes, as $R^{e5}$, one group selected from the group consisting of an alkyl group, a hydroxyalkyl group and a mercaptoalkyl group, the substitution position of an alkyl group, a hydroxyalkyl group and a mercaptoalkyl group on the benzene ring is preferably a meta position or a para position with respect to the bonding position of —(CH$_2$)$_{n0}$—SH and is more preferably a para position.

In formula (e4), n0 represents an integer of 0 or more and 3 or less. Since the compound is easily prepared and acquired, n is preferably 0 or 1 and is more preferably 0.

Specific examples of the compound represented by formula (e4) include p-mercaptophenol, p-thiocresol, m-thiocresol, 4-(methylthio)benzenethiol, 4-methoxybenzenethiol, 3-methoxybenzenethiol, 4-ethoxybenzenethiol, 4-isopropyloxybenzenethiol, 4-tert-butoxybenzenethiol, 3,4-dimethoxybenzenethiol, 3,4,5-trimethoxybenzenethiol, 4-ethylbenzenethiol, 4-isopropylbenzenethiol, 4-n-butylbenzenethiol, 4-tert-butylbenzenethiol, 3-ethylbenzenethiol, 3-isopropylbenzenethiol, 3-n-butylbenzenethiol, 3-tert-butylbenzenethiol, 3,5-dimethylbenzenethiol, 3,4-dimethylbenzenethiol, 3-tert-butyl-4-methylbenzenethiol, 3-tert-4-methylbenzenethiol, 3-tert-butyl-5-methylbenzenethiol, 4-tert-butyl-3-methylbenzenethiol, 4-mercaptobenzyl alcohol, 3-mercaptobenzyl alcohol, 4-(mercaptomethyl)phenol, 3-(mercaptomethyl)phenol, 1,4-di(mercaptomethyl)phenol 1,3-di(mercaptomethyl)phenol, 4-fluorobenzenethiol, 3-fluorobenzenethiol, 4-chlorobenzenethiol, 3-chlorobenzenethiol, 4-bromobenzenethiol, 4-iodobenzenethiol, 3-bromobenzenethiol, 3,4-dichlorobenzenethiol, 3,5-dichlorobenzenethiol, 3,4-difluorobenzenethiol, 3,5-difluorobenzenethiol, 4-mercaptocatechol, 2,6-di-tert-butyl-4-mercaptophenol, 3,5-di-tert-butyl-4-methoxybenzenethiol, 4-bromo-3-methylbenzenethiol, 4-(trifluoromethyl)benzenethiol, 3-(trifluoromethyl)benzenethiol, 3,5-bis(trifluoromethyl) benzenethiol, 4-methylthiobenzenethiol, 4-ethylthiobenzenethiol, 4-n-butylthiobenzenethiol, 4-tert-butylthiobenzenethiol and the like.

Examples of the sulfur-containing compound including a mercapto group include a compound which includes a nitrogen-containing aromatic heterocycle that is substituted with a mercapto group and a tautomer of a compound which includes a nitrogen-containing aromatic heterocycle that is substituted with a mercapto group. Preferred specific examples of the nitrogen-containing aromatic heterocycle include imidazole, pyrazole, 1,2,3-triazole, 1,2,4-triazole, oxazole, thiazole, pyridine, pyrimidine, pyridazine, pyrazine, 1,2,3-triazine, 1,2,4-triazine, 1,3,5-triazine, indole, indazole, benzoimidazole, benzoxazole, benzothiazole, 1H-benzotriazole, quinoline, isoquinoline, cinnoline, phthalazine, quinazoline, quinoxaline, and 1,8-naphthyridine.

Preferred specific examples of a nitrogen-containing heterocyclic compound which is suitable as the sulfur-containing compound and a tautomer of a nitrogen-containing heterocyclic compound include the following compounds.

[Chem. 49]

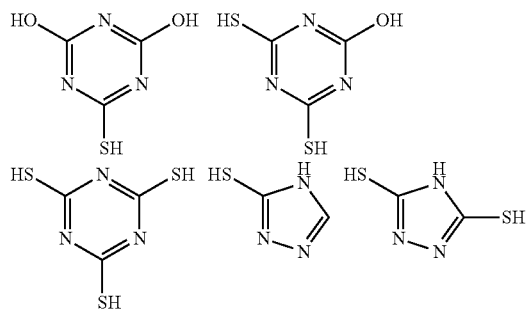

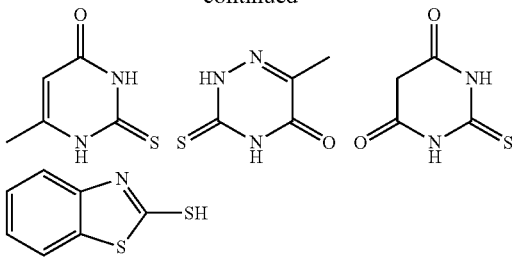

When the photosensitive resin composition includes the sulfur-containing compound (E), the amount of use thereof with respect to the total 100 parts by mass of the resin (B) described above and the alkali soluble resin (D) to be described later is preferably 0.01 parts by mass or more and 5 parts by mass or less, is more preferably 0.02 parts by mass or more and 3 parts by mass or less and is particularly preferably 0.05 parts by mass or more and 2 parts by mass or less.

<Acid Diffusion Control Agent (F)>

In order to improve the shape of a resist pattern used as a template, the post-exposure delay stability and the like of the photosensitive resin film, it is preferable that the photosensitive resin composition further contain an acid diffusion control agent (F). The acid diffusion control agent (F) is preferably a nitrogen-containing compound (F1), and an organic carboxylic acid, an oxo acid of phosphorus or a derivative thereof (F2) may be further included as necessary.

[Nitrogen-Containing Compound (F1)]

Examples of the nitrogen-containing compound (F1) can include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine, and the like. These may be used alone, or in combinations of two or more thereof.

Commercially available hindered amine compounds such as ADK STAB LA-52, ADK STAB LA-57, ADK STAB LA-63P, ADK STAB LA-68, ADK STAB LA-72, ADK STAB LA-77Y, ADK STAB LA-77G, ADK STAB LA-81, ADK STAB LA-82, and ADK STAB LA-87 (all of which are made by ADEKA Corporation) and pyridines in which 2,6-positions of 2,6-diphenylpyridine, 2,6-di-tert-butylpyridine and the like are substituted with substituents such as a hydrocarbon group can be used as the nitrogen-containing compound (F1).

The nitrogen-containing compound (F1) is used with respect to the total 100 parts by mass of the resin (B) described above and the alkali soluble resin (D) described above normally within a range of 0 parts by mass or more and 5 parts by mass or less and particularly preferably within a range of 0 parts by mass or more and 3 parts by mass or less.

[Organic Carboxylic Acid or Oxo Acid of Phosphorus or Derivative Thereof (F2)]

Among the organic carboxylic acid, or the oxo acid of phosphorus and the derivative thereof (F2), preferred examples of the organic carboxylic acid include malonic acid, citric acid, malic acid, succinic acid, benzoic acid, salicylic acid and the like, and salicylic acid is particularly preferable.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The organic carboxylic acid, or the oxo acid of phosphorus or the derivative thereof (F2) is used with respect to the total 100 parts by mass of the resin (B) described above and the alkali soluble resin (D) described above normally within a range of 0 parts by mass or more and 5 parts by mass or less and particularly preferably within a range of 0 parts by mass or more and 3 parts by mass or less.

Moreover, in order to form a salt to allow for stabilization, the organic carboxylic acid, or the oxo acid of phosphorous or the derivative thereof (F2) is preferably used in an amount equivalent to that of the nitrogen-containing compound (F1).

<Organic Solvent (S)>

The photosensitive resin composition contains an organic solvent (S). The type of organic solvent (S) is not particularly limited as long as the object of the present invention is not disturbed, and the organic solvent can be appropriately selected for use from the organic solvents that have been conventionally used in positive-type photosensitive resin compositions.

Specific examples of the organic solvent (S) can include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; aromatic hydrocarbons such as toluene and xylene; and the like. These may be used alone, or as a mixture of two or more thereof.

The content of the organic solvent (S) is not particularly limited as long as the object of the present invention is not disturbed. When the photosensitive resin composition is used such that the film thickness of a photosensitive resin layer obtained such as by a spin coat method is 5 μm or more, the organic solvent (S) is preferably used such that the solid content concentration of the photosensitive resin composition falls within a range of 30% by mass or more and 55% by mass or less.

<Other Components>

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

The photosensitive resin composition may further contain a surfactant for improving coating, defoaming, leveling and the like. As the surfactant, for example, a fluorinated surfactant and a silicone surfactant are preferably used. Specific examples of the fluorinated surfactant include commercially available fluorochemical surfactants such as BM-1000 and BM-1100 (both made by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.) but there is no limitation to those. As the silicone surfactant, a non-modified silicone surfactant, a polyether modified silicone surfactant, a polyester modified silicone surfactant, an alkyl modified silicone surfactant, an aralkyl modified silicone surfactant, a reactive silicone surfactant and the like can be preferably used. As the silicone surfactant, a commercially available silicone surfactant can be used. Specific examples of the commercially available silicone surfactant include Paintad M (made by Dow Corning Toray Co., Ltd.), TOPICA K1000, TOPICA K2000 and TOPICA K5000 (all of which are made by Takachiho Sangyo Co., Ltd.), XL-121 (polyether modified silicone surfactant, made by Clariant), BYK-310 (polyester modified silicone surfactant, made by BYK-Chemie GmbH) and the like.

Additionally, in order to finely adjust the solubility in a developing solution, the photosensitive resin composition may further contain an acid, an acid anhydride, or a solvent having a high boiling point.

Specific examples of the acid and acid anhydride can include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point can include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

<Method of Preparing Chemically Amplified Positive-Type Photosensitive Resin Composition>

The chemically amplified positive-type photosensitive resin composition is prepared by mixing and stirring the above components with a common method. Machines which can be used for mixing and stirring the above components include dissolvers, homogenizers, 3-roll mills and the like. The resulting mixture obtained after uniformly mixing the above components may further be filtered with a mesh, a membrane filter or the like.

<<Photosensitive Dry Film>>

A photosensitive dry film includes a base material film and a photosensitive resin layer which is formed on the surface of the base material film, and the photosensitive resin layer is formed of the photosensitive resin composition described above.

As the base material film, a base material film which has optical transparency is preferable. Specific examples include a polyethylene terephthalate (PET) film, a polypropylene (PP) film, a polyethylene (PE) film and the like, and a polyethylene terephthalate (PET) film is preferable because it is excellent in the balance of optical transparency and rupture strength.

The photosensitive resin composition described above is applied on the base material film so as to form the photosensitive resin layer, and thus the photosensitive dry film is manufactured. When the photosensitive resin layer is formed on the base material film, an applicator, a bar coater, a wire bar coater, a roll coater, a curtain flow coater or the like is used, and thus the photosensitive resin composition is applied and dried such that the thickness of the film after being dried on the base material film is preferably 0.5 µm or more and 300 µm or less, is more preferably 1 µm or more and 300 µm or less and is particularly preferably 3 µm or more and 100 µm or less.

The photosensitive dry film may further include a protective film on the photosensitive resin layer. Examples of the protective film include a polyethylene terephthalate (PET) film, a polypropylene (PP) film, polyethylene (PE) film and the like.

<<Method of Manufacturing Patterned Resist Film and Substrate with Template>>

A method of forming a patterned resist film on a substrate with the photosensitive resin composition described above is not particularly limited. The patterned resist film described above is suitably used as a template for forming an insulating film, an etching mask and a plated article and the like. Preferred methods thereof include a method of manufacturing a patterned resist film which includes:

a stacking step of stacking a photosensitive resin layer formed of a photosensitive resin composition on a substrate;

an exposure step of applying an active ray or radiation to the photosensitive resin layer so as to expose the photosensitive resin layer; and a development step of developing the photosensitive resin layer after being exposed.

A method of manufacturing a substrate with a template for forming a plated article is the same as the method of manufacturing the patterned resist film except that the photosensitive resin layer is stacked on a metal surface of the substrate having the metal surface and that in the development step, the template for forming the plated article is produced by the development.

The substrate on which the photosensitive resin layer is stacked is not particularly limited, a conventionally known substrate can be used and examples thereof can include a substrate for electronic parts, a substrate obtained by forming a predetermined wiring pattern on the substrate for electronic parts and the like. As the substrate, a silicon substrate, a glass substrate or the like can also be used. When the substrate with the template for forming the plated article is manufactured, as the substrate, a substrate having the metal surface is used. As the type of metal forming the metal surface, copper, gold and aluminum are preferable, and copper is more preferable.

The photosensitive resin layer is stacked on the substrate, for example, as follows. Specifically, the liquid photosensitive resin composition is applied on the substrate, a solvent is removed by heating and thus the photosensitive resin layer having a desired film thickness is formed. The thickness of the photosensitive resin layer is not particularly limited as long as the resist pattern serving as the template can be formed so as to have the desired film thickness. Although the film thickness of the photosensitive resin layer is not particularly limited, the film thickness is preferably 0.5 µm or more, is more preferably 0.5 µm or more and 300 µm or less, is particularly preferably 1 µm or more and 150 µm or less and is most preferably 3 µm or more and 100 µm or less.

As a method of applying the photosensitive resin composition on the substrate, methods such as a spin coating method, a slit coating method, a roll coating method, a screen printing method and an applicator method can be used. Pre-baking is preferably performed on the photosensitive resin layer. Although the conditions for the pre-baking differ depending on the types of components in the photosensitive resin composition, the mixing ratio, the thickness of the coating film and the like, the conditions are that the pre-baking is performed normally at 70° C. or more and 200° C. or less and preferably at 80° C. or more and 150° C. or less for about 2 minutes or more and 120 minutes or less.

The photosensitive resin layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 mJ/cm$^2$ or more and 10,000 mJ/cm$^2$ or less. Furthermore, the radiation includes a light ray to activate the acid generator (A) in order to generate an acid.

After the exposure, the diffusion of acid is promoted by heating the photosensitive resin layer using a known method to change the alkali solubility of the photosensitive resin layer at an exposed portion of the photosensitive resin film.

Then, the exposed photosensitive resin layer is developed according to a conventionally known method, and an unnecessary portion is dissolved and removed so as to form the predetermined resist pattern or the plated article. At this time, an alkaline aqueous solution is used as a developing solution.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photosensitive resin composition, the film thickness of the photosensitive resin layer, and the like. Usually, the developing time is 1 minute or more and 30 minutes or less. The method of the development may be any one of a liquid-filling method, a dipping method, a paddle method, a spray developing method, and the like.

After the development, the photosensitive resin layer is washed with running water for 30 seconds or more and 90 seconds or less, and is then dried with an air gun, an oven or the like. In this way, on the metal surface of the substrate having the metal surface, the resist pattern which is patterned so as to have the desired shape is formed. Moreover, in this way, on the metal surface of the substrate having the metal surface, the substrate with the template having the resist pattern serving as the template can be manufactured.

<<Method of Manufacturing Plated Article>>

A conductor such as metal is embedded by plating into a non-resist part (part removed with the developing solution) in the template of the substrate with the template formed by the method described above, and thus it is possible to form a plated article like a connection terminal such as a bump or a metal post or Cu rewiring. A plating processing method is not particularly limited, and various types of conventionally known methods can be adopted. As a plating liquid, in particular, a solder plating liquid, a copper plating liquid, a gold plating liquid and a nickel plating liquid are suitably used. Finally, the remaining template is removed with a separation liquid or the like according to a conventional method.

It is likely that, when the plated article is manufactured, ashing processing is preferably performed on a metal surface exposed in a non-pattern part of the resist pattern serving as the template for the formation of the plated article. Specifically, for example, there is a case where the pattern which is formed of the photosensitive resin composition including the sulfur-containing compound (E) is used as the template so as to form the plated article. In this case, it is likely that the adherence to the metal surface of the plated article is easily degraded. This failure is remarkable when the sulfur-containing compound (E) represented by formula (e1) described previously or the sulfur-containing compound (E) represented by formula (e4) described previously is used. However, when the ashing processing described above is performed, even if the pattern formed of the photosensitive resin composition including the sulfur-containing compound (E) is used as the template, the plated article which is satisfactorily adhered to the metal surface is easily formed. When a compound which includes a nitrogen-containing aromatic heterocycle that is substituted with a mercapto group is used as the sulfur-containing compound (E), the problem on the adherence of the plated article described above hardly occurs or the degree thereof is low. Hence, when a compound which includes a nitrogen-containing aromatic heterocycle that is substituted with a mercapto group is used as the sulfur-containing compound (E), the plated article having satisfactory adherence to the metal surface is easily formed without the ashing processing being performed.

The ashing processing is not particularly limited as long as a method is adopted which does not cause such a damage that the plated article having a desired shape cannot be formed on the resist pattern serving as the template for the formation of the plated article. Examples of the preferable ashing processing method include a method using oxygen plasma. In order to perform ashing on the metal surface on the substrate with oxygen plasma, it is preferable to use a known oxygen plasma generation device to generate oxygen plasma and to then apply the oxygen plasma to the metal surface on the substrate.

As a gas used for the generation of the oxygen plasma, as long as the object of the present invention is not disturbed, oxygen and various gasses used for plasma processing can be conventionally mixed together. Examples of the gas described above include a nitrogen gas, a hydrogen gas, a $CF_4$ gas and the like. Although conditions for the ashing using the oxygen plasma are not particularly limited as long as the object of the present invention is not disturbed, the processing time falls within, for example, a range of 10 seconds or more and 20 minutes or less, preferably falls within a range of 20 seconds or more and 18 minutes or less and more preferably falls within a range of 30 seconds or more and 15 minutes or less. The processing time with the oxygen plasma is set within the range described above, and thus the effect of enhancing the adherence of the plated article is easily achieved without any change in the shape of the resist pattern.

By the method described above, the resist pattern whose cross-sectional shape is satisfactorily rectangular can be used as the template for the formation of the plated article, and thus a large contact area between the plated article and the surface of the substrate is easily acquired, with the result that it is possible to manufacture the plated article having excellent adherence to the substrate.

EXAMPLES

Although the present invention will be described in more detail below with reference to Examples, the present invention is not limited to these Examples.

Preparation Example 1

(Synthesis of Mercapto Compound E2)

In preparation example 1, as the sulfur-containing compound (E), a mercapto compound E2 having the following structure was synthesized.

[Chem. 50]

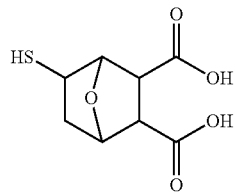

15.00 g of 7-oxanorborna-5-ene-2,3-dicarboxylic anhydride and 150.00 g of tetrahydrofuran were added into a flask and were agitated. Then, 7.64 g of thioacetic acid (AcSH) was added into the flask and was agitated at room temperature for 3.5 hours. Thereafter, the reaction liquid was concentrated, and thus 22.11 g of 5-acetylthio-7-oxanorbornane-2,3-dicarboxylic acid anhydride was obtained. 22.11 g of 5-acetylthio-7-oxanorbornane-2,3-dicarboxylic acid anhydride and 30.11 g of a sodium hydroxide aqueous solution having a concentration of 10% by mass were added into the flask, and then the content of the flask was agitated at room temperature for 2 hours. Then, hydrochloric acid (80.00 g) having a concentration of 20% by mass was added into the flask, and thus the reaction liquid was made acidic. Thereafter, extraction using 200 g of ethyl acetate was performed four times, and thus an extraction liquid including the mercapto compound E2 was obtained. 25.11 g of tetrahydrofuran (THF) was added to a residue which was collected by concentration of the extraction liquid, and thus the residue was dissolved. Heptane was dropped into the obtained THF solution so as to precipitate the mercapto compound E2, and the precipitated mercapto compound E2 was filtered so as to be collected. The results of the measurement of the mercapto compound E2 with $^1$H-NMR are indicated below.

$^1$H-NMR (DMSO-d6): δ12.10 (s, 2H), 4.72 (d, 1H), 4.43 (s, 1H), 3.10 (t, 1H), 3.01 (d, 1H), 2.85 (d, 1H), 2.75 (d, 1H), 2.10 (t, 1H), 1.40 (m, 1H)

[Chem. 51]

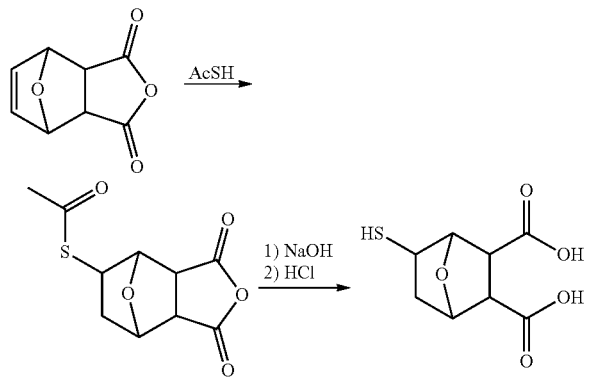

Examples 1 to 62, and Comparative Examples 1 to 15

In Examples 1 to 62 and Comparative Examples 1 to 15, as the acid generator (A), compounds A1 and A2 of the following formulae were used.

[Chem. 52]

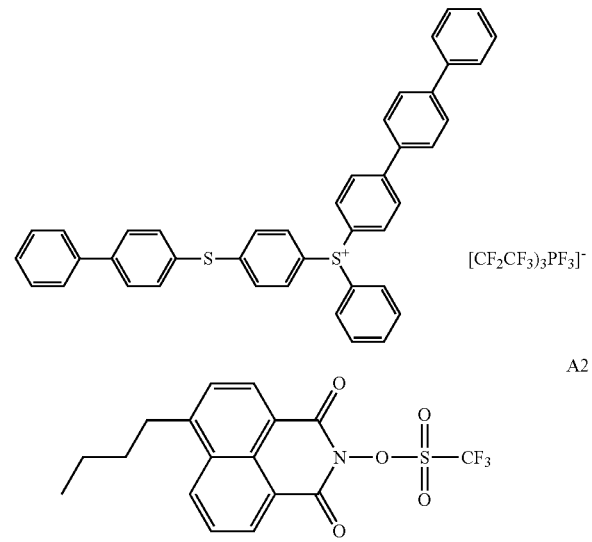

In Examples 1 to 62 and Comparative Examples 1 to 15, as the resin (resin (B)) whose solubility in alkali was increased by action of an acid, the following resins B1, B2 and B3 were used. A number on a lower right portion of parentheses in each of structural units in the following structural formulae indicates the content (mass %) of the structural unit in each of the resins. The mass average molecular weight Mw of the resin B1 is 40,000, and the dispersivity (Mw/Mn) thereof is 2.6. The mass average molecular weight Mw of the resin B2 is 40,000, and the dispersivity (Mw/Mn) thereof is 2.6. The number average molecular weight of the resin B3 is 106,000.

[Chem. 53]

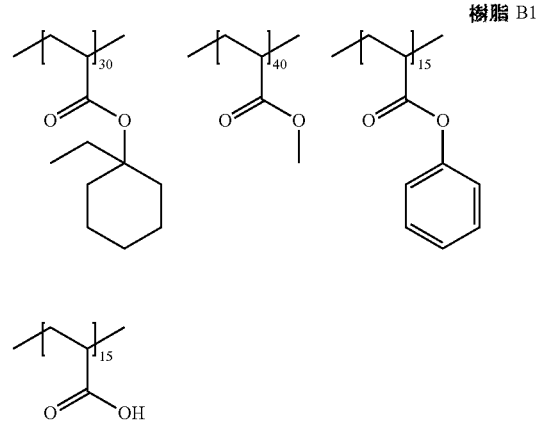

樹脂 B1

樹脂 B2
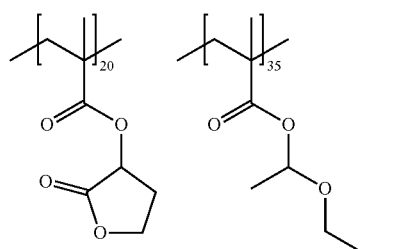
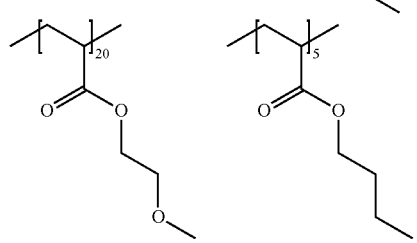
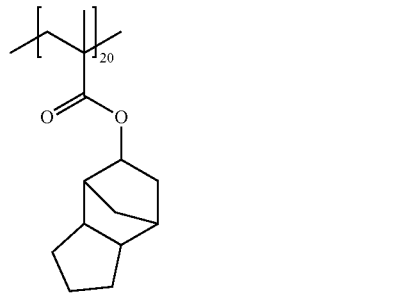
樹脂 B3
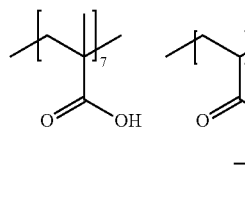
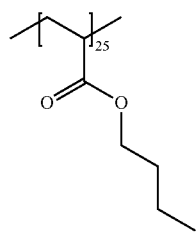
In Examples 1 to 62, as the Lewis acid compound (C), C1 to C5 below were used. In Comparative Examples 1 to 15, as additives (C') which were the alternatives of the Lewis acid compound (C), C'1 to C'3 below were used.
[Chem. 54]
C1
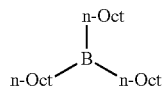
C2
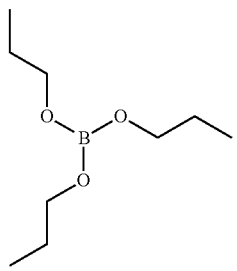
C3
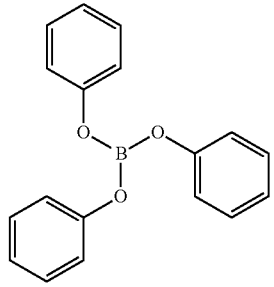
C4
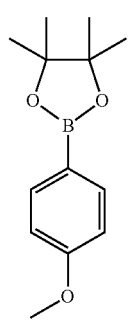
C5
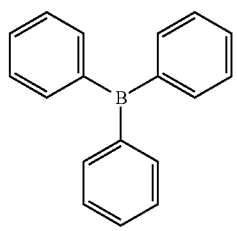
C'1
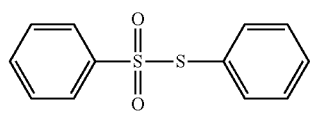
C'2
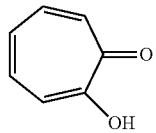
C'3
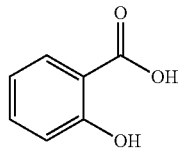
As the alkali soluble resins (D), the following resins D1 and D2 were used.

D1: A copolymer of polyhydroxystyrene resin (p-hydroxystyrene:styrene=85:15 (mass ratio), mass-average molecular weight (Mw) of 2500, the dispersivity (Mw/Mn) of 2.4)
D2: A novolak resin (m-cresol single condensate (mass-average molecular weight (Mw) of 8000))

As the sulfur-containing compound (E), the following compound E1 and the mercapto compound E2 obtained in preparation example 1 were used.

[Chem. 55]

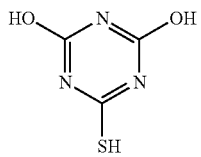 E1

As the acid diffusion inhibitor (F), F1: tripentylamine, F2: LA63-P made by ADEKA Corporation and F3: diphenylpyridine were used such that the amounts of those used in compositions of the individual Examples and Comparative Examples were 0.2 parts by mass.

The amounts of types described in tables 1 to 5 of the acid generator (A), the resin (B), the mercapto compound (C) or the additive (C'), the alkali soluble resin (D), the sulfur-containing compound (E) and the acid diffusion inhibitor (F) and 0.05 parts by mass of a surfactant (BYK310 made by BYK-Chemie GmbH) were dissolved in the mixed solvent (MA/PM=6/4 (volume ratio)) of 3-methoxybutyl acetate (MA) and propylene glycol monomethyl ether acetate (PM), with the result that the photosensitive resin compositions in the individual Examples and Comparative Examples were obtained. The photosensitive resin compositions in Examples 1 to 48 and Comparative Examples 1 to 10 which were used for evaluation in the film thickness of 55 μm which will be described later were prepared such that the solid content concentration was 50% by mass. The photosensitive resin compositions in Examples 49 to 62 and Comparative Examples 11 to 15 which were used for evaluation in the film thickness of 7 μm were prepared such that the solid content concentration was 40% by mass.

The obtained photosensitive resin compositions were used, and thus the sensitivity and the shape were evaluated according to the following method. In Examples 1 to 48 and Comparative Examples 1 to 10, the evaluation in the film thickness of 55 μm was performed. On the other hand, in Examples 49 to 62 and Comparative Examples 11 to 15, the evaluation in the film thickness of 7 μm was performed. The results of these evaluations are shown in tables 1 to 5.

[Evaluation of Shape]
(Evaluation in Film Thickness of 55 μm)

The photosensitive resin compositions in the Examples and Comparative Examples were applied on a copper substrate or a silicon substrate having a diameter of 8 inches so as to form photosensitive resin layers whose film thickness was 55 μm. Then, the photosensitive resin layers were pre-baked at 100° C. for 5 minutes. After the prebaking, a mask of a square pattern capable of forming a 30 μm×30 μm rectangular opening and an exposure device Prisma GHI (made by Ultratech, Inc.) were used so as to perform pattern exposure using g-h-i rays at an exposure amount 1.2 times as much as the lowest exposure amount capable of forming a pattern having a predetermined size. Then, the substrate was placed on a hot plate, was exposed at 100° C. for 3 minutes and was heated (PEB). Thereafter, an operation of dropping a 2.38 wt. percent aqueous solution of tetramethyl ammonium hydroxide (developing solution, NMD-3 made by Tokyo Ohka Kogyo Co., Ltd.) on the exposed photosensitive resin layers and then leaving them at 23° C. for 60 seconds was repeatedly performed four times in total. Thereafter, the surfaces of resist patterns were washed with running water, then nitrogen was blown and thus the resist patterns were obtained. The cross-sectional shapes of the resist patterns were observed with a scanning electron microscope, and thus the cross-sectional shapes of the patterns were evaluated. Specifically, when the width of a surface (top) opposite to a surface in contact with the substrate of the resist pattern was assumed to be Wt, and the pattern width of an intermediate part in the direction of thickness of the cross section of the resist pattern was assumed to be Wm, if Wm fallen within ±15% of Wt, the evaluation of ⊙ was made whereas if Wm fallen outside ±15% of Wt, the evaluation of x was made.

(Evaluation in Film Thickness of 7 μm)

The photosensitive resin compositions in the Examples and Comparative Examples were applied on a copper substrate or a silicon substrate having a diameter of 8 inches so as to form photosensitive resin layers whose film thickness was 7 μm. Then, the photosensitive resin layers were pre-baked at 130° C. for 5 minutes. After the prebaking, a mask of a line and space pattern having a line width of 2 μm and a space width of 2 μm and the exposure device Prisma GHI (made by Ultratech, Inc.) were used so as to perform pattern exposure using g-h-i rays at an exposure amount 1.2 times as much as the lowest exposure amount capable of forming a pattern having a predetermined size. Then, the substrate was placed on a hot plate, was exposed at 90° C. for 1.5 minutes and was heated (PEB). Thereafter, an operation of dropping a 2.38 wt. percent aqueous solution of tetramethyl ammonium hydroxide (developing solution, NMD-3 made by Tokyo Ohka Kogyo Co., Ltd.) on the exposed photosensitive resin layers and then leaving them at 23° C. for 30 seconds was repeatedly performed twice in total. Thereafter, the surfaces of resist patterns were washed with running water, then nitrogen was blown and thus the resist patterns were obtained. The cross-sectional shapes of the resist patterns were observed with a scanning electron microscope, and thus the cross-sectional shapes of the patterns were evaluated. Specifically, when the width of a surface (top) opposite to a surface in contact with the substrate of the resist pattern was assumed to be Wt, and the pattern width of an intermediate part in the direction of thickness of the cross section of the resist pattern was assumed to be Wm, if Wm fallen within ±10% of Wt, the evaluation of 0 was made whereas if Wm fallen outside ±10% of Wt, the evaluation of x was made.

[Evaluation of Sensitivity]
(Evaluation in Film Thickness of 55 μm)

A mask of a square pattern capable of forming a 500 μm×500 μm rectangular opening was used, and thus by the same method as in the evaluation of the shape, the exposure amount was adjusted such that a square pattern having an opening portion of 500 μm×500 μm was formed. Based on the exposure amount which formed the square pattern having the predetermined dimensions, the sensitivity was evaluated. When the exposure amount which formed the square pattern having the predetermined dimensions was 400 mJ/cm² or less, the sensitivity was determined to be ⊙, when the exposure amount exceeded 400 mJ/cm² and was 500 mJ/cm² or less, the sensitivity was determined to be 0 and when the exposure amount exceeded 500 mJ/cm², the sensitivity was determined to be x.

(Evaluation in Film Thickness of 7 μm)

A mask for the formation of a line and space pattern was used, and thus by the same method as in the evaluation of the shape, the exposure amount was adjusted such that a line and space pattern having a line width of 2 μm and a space width of 2 μm was formed. Based on the exposure amount which formed the line and space pattern having the predetermined dimensions, the sensitivity was evaluated. When the exposure amount which formed the line and space pattern having the predetermined dimensions was 80 mJ/cm² or less, the sensitivity was determined to be ◎, when the exposure amount exceeded 80 mJ/cm² and was 100 mJ/cm² or less, the sensitivity was determined to be 0 and when the exposure amount exceeded 100 mJ/cm², the sensitivity was determined to be x.

TABLE 1

| | Resin (B) and alkali soluble resin (D) | Lewis acid compound (C) | Acid generator (A) | Sulfur-containing compound (E) | Acid diffusion inhibitor | 55 µm thick evaluation | | |
|---|---|---|---|---|---|---|---|---|
| | Type/parts by mass | Type/parts by mass | Type/parts by mass | Type/parts by mass | (F) Type | Shape | Sensitivity | Substrate type |
| Example 1 | B1/40 | C1/0.25 | A1/4 | E1/0.05 | F1 | ○ | ○ | Cu |
| Example 2 | D1/20 | C1/0.50 | | | | ○ | ◎ | Cu |
| Example 3 | D2/40 | C2/0.25 | | | | ○ | ○ | Cu |
| Example 4 | | C2/0.50 | | | | ○ | ◎ | Cu |
| Example 5 | | C3/0.25 | | | | ○ | ○ | Cu |
| Example 6 | | C3/0.50 | | | | ○ | ◎ | Cu |
| Example 7 | | C4/0.10 | | | | ○ | ○ | Cu |
| Example 8 | | C4/0.25 | | | | ○ | ◎ | Cu |
| Example 9 | | C4/0.50 | | | | ○ | ◎ | Cu |
| Example 10 | | C5/0.50 | | | | ○ | ○ | Cu |
| Example 11 | | C4/0.50 | | | — | | ○ | ◎ | Si |
| Example 12 | | C4/0.50 | | | | ○ | ◎ | Cu |
| Example 13 | B2/100 | C1/0.25 | A1/4 | E1/0.05 | F1 | ○ | ○ | Cu |
| Example 14 | | C1/0.50 | | | | ○ | ◎ | Cu |
| Example 15 | | C2/0.25 | | | | ○ | ○ | Cu |
| Example 16 | | C2/0.50 | | | | ○ | ○ | Cu |
| Example 17 | | C3/0.25 | | | | ○ | ○ | Cu |
| Example 18 | | C3/0.50 | | | | ○ | ○ | Cu |
| Example 19 | | C4/0.10 | | | | ○ | ○ | Cu |
| Example 20 | | C4/0.25 | | | | ○ | ◎ | Cu |
| Example 21 | | C4/0.50 | | | | ○ | ◎ | Cu |
| Example 22 | | C5/0.50 | | | | ○ | ○ | Cu |
| Example 23 | | C4/0.50 | | | — | | ○ | ◎ | Si |
| Example 24 | | C4/0.50 | | | | ○ | ◎ | Cu |

TABLE 2

| | Resin (B) and alkali soluble resin (D) | Lewis acid compound (C) | Acid generator (A) | Sulfur-containing compound (E) | Acid diffusion inhibitor | 55 µm thick evaluation | | |
|---|---|---|---|---|---|---|---|---|
| | Type/parts by mass | Type/parts by mass | Type/parts by mass | Type/parts by mass | (F) Type | Shape | Sensitivity | Substrate type |
| Example 25 | B1/40 | C1/0.25 | A1/4 | E2/0.05 | F1 | ○ | ○ | Cu |
| Example 26 | D1/20 | C1/0.50 | | | | ○ | ◎ | Cu |
| Example 27 | D2/40 | C2/0.25 | | | | ○ | ○ | Cu |
| Example 28 | | C2/0.50 | | | | ○ | ◎ | Cu |
| Example 29 | | C3/0.25 | | | | ○ | ○ | Cu |
| Example 30 | | C3/0.50 | | | | ○ | ◎ | Cu |
| Example 31 | | C4/0.10 | | | | ○ | ○ | Cu |
| Example 32 | | C4/0.25 | | | | ○ | ◎ | Cu |
| Example 33 | | C4/0.50 | | | | ○ | ◎ | Cu |
| Example 34 | | C5/0.50 | | | | ○ | ○ | Cu |
| Example 35 | | C4/0.50 | | | — | | ○ | ◎ | Si |
| Example 36 | | C4/0.50 | | | | ○ | ◎ | Cu |
| Example 37 | B2/100 | C1/0.25 | A1/4 | E2/0.05 | F1 | ○ | ○ | Cu |
| Example 38 | | C1/0.50 | | | | ○ | ◎ | Cu |
| Example 39 | | C2/0.25 | | | | ○ | ○ | Cu |
| Example 40 | | C2/0.50 | | | | ○ | ○ | Cu |
| Example 41 | | C3/0.25 | | | | ○ | ○ | Cu |
| Example 42 | | C3/0.50 | | | | ○ | ○ | Cu |
| Example 43 | | C4/0.10 | | | | ○ | ○ | Cu |
| Example 44 | | C4/0.25 | | | | ○ | ◎ | Cu |
| Example 45 | | C4/0.50 | | | | ○ | ◎ | Cu |
| Example 46 | | C5/0.50 | | | | ○ | ○ | Cu |
| Example 47 | | C4/0.50 | | | — | | ○ | ◎ | Si |
| Example 48 | | C4/0.50 | | | | ○ | ◎ | Cu |

TABLE 3

| | Resin (B) and alkali soluble resin (D) Type/parts by mass | Additive (C') Type/parts by mass | Acid generator (A) Type/ parts by mass | Sulfur-containing compound (E) Type/parts by mass | Acid diffusion inhibitor (F) Type | 55 μm thick evaluation | | |
|---|---|---|---|---|---|---|---|---|
| | | | | | | Shape | Sensitivity | Substrate type |
| Comparative Example 1 | B1/40 D1/20 | — | A1/4 | E1/ 0.05 | F1 | X | X | Cu |
| Comparative Example 2 | D2/40 | C'1/1.0 | | | | X | X | Cu |
| Comparative Example 3 | | C'2/1.0 | | | | X | X | Cu |
| Comparative Example 4 | | C'3/0.50 | | | | X | X | Cu |
| Comparative Example 5 | | — | | | | X | X | Si |
| Comparative Example 6 | B2/100 | — | | | | X | X | Cu |
| Comparative Example 7 | | C'1/1.0 | | | | X | X | Cu |
| Comparative Example 8 | | C'2/1.0 | | | | X | X | Cu |
| Comparative Example 9 | | C'3/0.50 | | | | X | X | Cu |
| Comparative Example 10 | | — | | | | X | X | Si |

TABLE 4

| | Resin (B) and alkali soluble resin (D) Type/parts by mass | Lewis acid compound (C) Type/parts by mass | Acid generator (A) Type/ parts by mass | Sulfur-containing compound (E) Type/parts by mass | Acid diffusion inhibitor (F) Type | 7 μm thick evaluation | | |
|---|---|---|---|---|---|---|---|---|
| | | | | | | Shape | Sensitivity | Substrate type |
| Example 49 | B3/35 D1/10 D2/55 | C1/0.25 | A2/1 | E1/ 0.05 | F2 | ○ | ○ | Cu |
| Example 50 | | C2/0.25 | | | | ○ | ○ | Cu |
| Example 51 | | C3/0.25 | | | | ○ | ○ | Cu |
| Example 52 | | C4/0.25 | | | | ○ | ◉ | Cu |
| Example 53 | | C5/0.25 | | | | ○ | ○ | Cu |
| Example 54 | | C4/0.25 | | — | | ○ | ◉ | Si |
| Example 55 | | C4/0.25 | | | | ○ | ◉ | Cu |
| Example 56 | | C1/0.25 | A2/1 | E2/ 0.05 | F3 | ○ | ○ | Cu |
| Example 57 | | C2/0.25 | | | | ○ | ○ | Cu |
| Example 58 | | C3/0.25 | | | | ○ | ○ | Cu |
| Example 59 | | C4/0.25 | | | | ○ | ◉ | Cu |
| Example 60 | | C5/0.25 | | | | ○ | ○ | Cu |
| Example 61 | | C4/0.25 | | — | | ○ | ◉ | Si |
| Example 62 | | C4/0.25 | | | | ○ | ◉ | Cu |

TABLE 5

| | Resin (B) and alkali soluble resin (D) Type/parts by mass | Lewis acid compound (C) Type/parts by mass | Acid generator (A) Type/ parts by mass | Sulfur-containing compound (E) Type/parts by mass | Acid diffusion inhibitor (F) Type | 7 μm thick evaluation | | |
|---|---|---|---|---|---|---|---|---|
| | | | | | | Shape | Sensitivity | Substrate type |
| Comparative Example 11 | B3/35 D1/10 D2/55 | — | A2/1 | E1/ 0.05 | F2 | X | X | Cu |
| Comparative Example 12 | | C'1/1.0 | | | | X | X | Cu |
| Comparative Example 13 | | C'2/1.0 | | | | X | X | Cu |

TABLE 5-continued

| | Resin (B) and alkali soluble resin (D) Type/parts by mass | Lewis acid compound (C) Type/parts by mass | Acid generator (A) Type/ parts by mass | Sulfur-containing compound (E) Type/parts by mass | Acid diffusion inhibitor (F) Type | 7 µm thick evaluation | | |
|---|---|---|---|---|---|---|---|---|
| | | | | | | Shape | Sensitivity | Substrate type |
| Example 14 | | C'3/0.50 | | | | X | X | Cu |
| Example 15 | | — | | | | X | X | Cu |

It is found from Examples 1 to 62 that the positive-type photosensitive resin composition including not only the acid generator (A) which generates an acid by application of active rays or radiation and the resin (B) whose solubility in alkali is increased by action of an acid but also the Lewis acid compound (C) has satisfactory sensitivity and provides a resist pattern whose cross-sectional shape is satisfactorily rectangular.

On the other hand, it is found from Comparative Examples 1 to 15 that when the positive-type photosensitive resin composition does not contain the Lewis acid compound (C) or when the positive-type photosensitive resin composition contains, instead of the Lewis acid compound (C), the additive (C') which does not apply to the Lewis acid compound such as the Bronsted acid (C'3 described above), the sensitivity of the photosensitive resin composition is degraded such that it is difficult to form a resist pattern whose cross-sectional shape is satisfactorily rectangular.

Furthermore, the photosensitive resin compositions of Example 1 and Comparative Examples 1 and 2 were used, and thus pattern formation was performed by the same method as in the evaluation of the pattern shape except that after exposure, the photosensitive resin layers were left for more than half a day before post-baking and development, with the result that the width of a process margin was checked by the measurement of the dimensions of the resist pattern after the development. Consequently, in the photosensitive resin composition of Example 1, the resist pattern of dimensions similar to a case where the photosensitive resin layer was not left was formed. On the other hand, when the photosensitive resin compositions of Comparative Examples 1 and 2 were used, and the development was performed after the photosensitive resin layers were left, the dimensions of the resist pattern were significantly changed as compared with the case where the photosensitive resin layer was not left. Consequently, it is found that the photosensitive resin compositions including the Lewis acid compound (C) in the examples had a wide process margin.

What is claimed is:

1. A chemically amplified positive-type photosensitive resin composition comprising:
   an acid generator (A) which generates an acid by application of an active ray or radiation;
   a resin (B) whose solubility in alkali is increased by action of an acid; and
   a Lewis acid compound (C); and
   a sulfur-containing compound (E) which comprises a sulfur atom capable of coordinating metal,
   wherein the Lewis acid compound (C) comprises a Lewis acid compound which comprises boron, and
   wherein the sulfur-containing compound (E) comprises a compound represented by any one of the following formula (e1), the following formulae (e3-L1) to (e3-L7), the following formulae (e3-1) to (e3-4), the following formula (e4) and the following formulae 1 to 5:

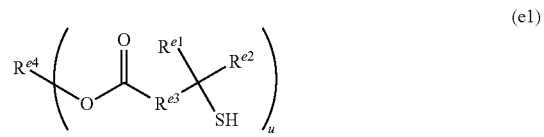

wherein $R^{e1}$ and $R^{e2}$ each independently represents a hydrogen atom or an alkyl group, $R^{e3}$ represents a single bond or an alkylene group, $R^{e4}$ represents a u-valent aliphatic group which may include an atom other than carbon and u represents an integer of 2 or more and 4 or less,

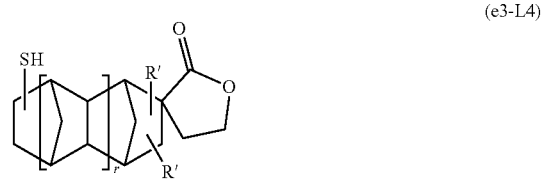

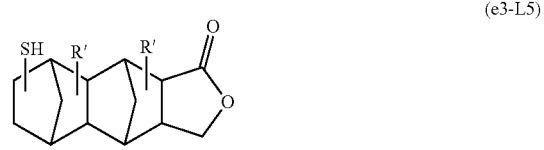

-continued (e3-L6)
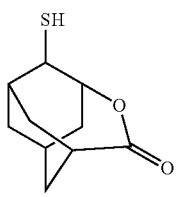

(e3-L7)
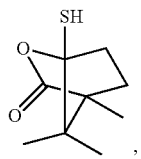

wherein R's each independently represents a hydrogen atom, an alkyl group, an alkoxy group, a halogenated alkyl group, a hydroxyl group, —COOR", —OC(=O)R", a hydroxyalkyl group or a cyano group, and R" represents a hydrogen atom or an alkyl group; s" represents an integer of 0 or more and 2 or less; A" represents an alkylene group which may include an oxygen atom or a sulfur atom and in which number of carbon atoms is 1 or more and 5 or less, an oxygen atom or a sulfur atom; and r represents 0 or 1;

(e3-1)
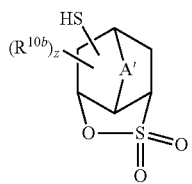

(e3-2)
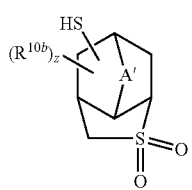

(e3-3)
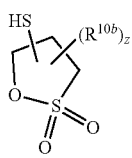

(e3-4)
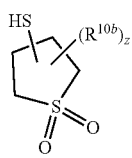

wherein A' represents an alkylene group which may include an oxygen atom or a sulfur atom and in which the number of carbon atoms is 1 or more and 5 or less, an oxygen atom or a sulfur atom; and z represents an integer of 0 or more and 2 or less; $R^{10b}$ represents an alkyl group, an alkoxy group, a halogenated alkyl group, a hydroxyl group, —COOR", —OC(=O)R", a hydroxyalkyl group or a cyano group and R" represents a hydrogen atom or an alkyl group;

(e4)
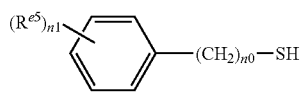

and
wherein $R^{e5}$ represents a group selected from the group consisting of a hydroxyl group, an alkyl group having 1 or more and 4 or less carbon atoms, an alkoxy group having 1 or more and 4 or less carbon atoms, an alkylthio group having 1 or more and 4 or less carbon atoms, a hydroxyalkyl group having 1 or more and 4 or less carbon atoms, a mercaptoalkyl group having 1 or more and 4 or less carbon atoms, a halogenated alkyl group having 1 or more and 4 or less carbon atoms and a halogen atom; n1 represents an integer of 0 or more and 3 or less, n0 represents an integer of 0 or more and 3 or less, and when n1 is 2 or 3, $R^{e5}$s may be identical to or different from each other;

1
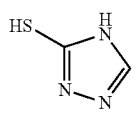

2
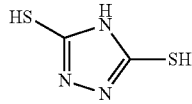

3
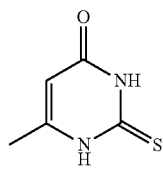

4
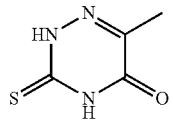

5
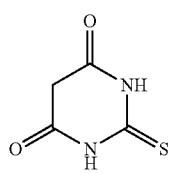

2. The chemically amplified positive-type photosensitive resin composition according to claim 1, wherein the Lewis acid compound (C) comprises one or more types of boron compound represented by formula (c1) below:

$$B(R^{C1})_{n1}(OR^{C2})_{(3-n1)}$$ (c1)

wherein $R^{C1}$ and $R^{C2}$ each independently represents a hydrocarbon group having 1 or more and 20 or less carbon atoms, the hydrocarbon group may comprise 1 or more substituents, n1 represents an integer of 0 or more and 3 or less, when a plurality of $R^{C1}$s are present, two of the $R^{C1}$s may be bonded to each other to form a ring and when a plurality of $OR^{C2}$s are present, two of the $OR^{C2}$s may be bonded to each other to form a ring.

3. The chemically amplified positive-type photosensitive resin composition according to claim 1, further comprising an alkali soluble resin (D).

4. The chemically amplified positive-type photosensitive resin composition according to claim 3, wherein the alkali soluble resin (D) comprises at least one type of resin selected from the group consisting of a novolak resin (D1), a polyhydroxystyrene resin (D2) and an acrylic resin (D3).

5. The chemically amplified positive-type photosensitive resin composition according to claim 3, wherein the alkali soluble resin (D) comprises at least one type of resin selected from the group consisting of a novolak resin (D1) and a polyhydroxystyrene resin (D2).

6. A photosensitive dry film comprising:
a base material film; and
a photosensitive resin layer which is formed on a surface of the base material film, wherein the photosensitive resin layer is formed from the chemically amplified positive-type photosensitive resin composition according to claim 1.

7. A method of manufacturing a photosensitive dry film, the method comprising applying, on a base material film, the chemically amplified positive-type photosensitive resin composition according to claim 1 so as to form a photosensitive resin layer.

8. A method of manufacturing a patterned resist film, the method comprising:
stacking, on a substrate, a photosensitive resin layer formed from the chemically amplified positive-type photosensitive resin composition according to claim 1;
applying an active ray or radiation to the photosensitive resin layer selectively in terms of position; and
developing the photosensitive resin layer.

9. A method of manufacturing a substrate with a template, the method comprising:
stacking, on a substrate having a metal surface, a photosensitive resin layer formed of the chemically amplified positive-type photosensitive resin composition according to claim 1;
applying an active ray or radiation to the photosensitive resin layer; and
developing the photosensitive resin layer so as to produce the template for forming a plated article.

10. A method of manufacturing a plated article, the method comprising plating the substrate with the template manufactured by the method according to claim 9 so as to form the plated article within the template.

* * * * *